(12) United States Patent
Clarke et al.

(10) Patent No.: US 11,372,030 B2
(45) Date of Patent: *Jun. 28, 2022

(54) ELECTRICAL OVERSTRESS DETECTION DEVICE

(71) Applicant: Analog Devices International Unlimited Company, Limerick (IE)

(72) Inventors: David J. Clarke, Patrickswell (IE); Stephen Denis Heffernan, County Tipperary (IE); Alan J. O'Donnell, Castletroy (IE); Patrick M. McGuinness, Pallaskenry (IE)

(73) Assignee: Analog Devices International Unlimited Company, Limerick (IE)

( * ) Notice: Subject to any disclaimer, the term of this patent is extended or adjusted under 35 U.S.C. 154(b) by 89 days.

This patent is subject to a terminal disclaimer.

(21) Appl. No.: 16/893,874

(22) Filed: Jun. 5, 2020

(65) Prior Publication Data

US 2020/0400725 A1 Dec. 24, 2020

Related U.S. Application Data

(63) Continuation of application No. 15/708,958, filed on Sep. 19, 2017, now Pat. No. 10,677,822.

(Continued)

(51) Int. Cl.
*G01R 19/165* (2006.01)
*H01L 23/60* (2006.01)
(Continued)

(52) U.S. Cl.
CPC ....... *G01R 19/16504* (2013.01); *G01N 25/04* (2013.01); *G01R 31/002* (2013.01);
(Continued)

(58) Field of Classification Search
USPC .......................... 324/380, 384, 537
See application file for complete search history.

(56) References Cited

U.S. PATENT DOCUMENTS 3,761,673 A 9/1973 Sennowitz
3,810,063 A 5/1974 Blewitt
(Continued)

FOREIGN PATENT DOCUMENTS

CN 1628382 A 6/2005
CN 101350516 A 1/2009
(Continued)

OTHER PUBLICATIONS

Office Action dated Jan. 25, 2021 in Chinese Application No. 201710890198.9.
(Continued)

*Primary Examiner* — Vincent Q Nguyen
(74) *Attorney, Agent, or Firm* — Knobbe, Martens, Olson & Bear, LLP

(57) ABSTRACT

The disclosed technology generally relates to electrical overstress protection devices, and more particularly to electrical overstress monitoring devices for detecting electrical overstress events in semiconductor devices. In one aspect, a device configured to monitor electrical overstress (EOS) events includes a pair of spaced conductive structures configured to electrically arc in response to an EOS event, wherein the spaced conductive structures are formed of a material and have a shape such that arcing causes a detectable change in shape of the spaced conductive structures, and wherein the device is configured such that the change in shape of the spaced conductive structures is detectable to serve as an EOS monitor.

24 Claims, 43 Drawing Sheets

Related U.S. Application Data

(60) Provisional application No. 62/400,572, filed on Sep. 27, 2016.

(51) Int. Cl.

| | | |
|---|---|---|
| *G01R 31/00* | (2006.01) | |
| *H01L 27/02* | (2006.01) | |
| *G01R 31/28* | (2006.01) | |
| *G01N 25/04* | (2006.01) | |
| *H01L 23/525* | (2006.01) | |
| *H01L 23/62* | (2006.01) | |
| *H01L 25/065* | (2006.01) | |

(52) U.S. Cl.
CPC ..... *G01R 31/2832* (2013.01); *G01R 31/2856* (2013.01); *H01L 23/5256* (2013.01); *H01L 23/60* (2013.01); *H01L 23/62* (2013.01); *H01L 27/0288* (2013.01); *G01R 31/2872* (2013.01); *H01L 25/0657* (2013.01); *H01L 2223/6677* (2013.01); *H01L 2224/0401* (2013.01); *H01L 2224/04042* (2013.01); *H01L 2224/32145* (2013.01); *H01L 2224/32245* (2013.01); *H01L 2224/48145* (2013.01); *H01L 2224/48247* (2013.01); *H01L 2224/73265* (2013.01); *H01L 2924/1433* (2013.01); *H01L 2924/19105* (2013.01)

(56) References Cited

U.S. PATENT DOCUMENTS

| | | | |
|---|---|---|---|
| 4,514,712 A | 4/1985 | McDougal | |
| 4,726,991 A | 2/1988 | Hyatt et al. | |
| 4,939,619 A | 7/1990 | Borkowicz et al. | |
| 5,315,472 A | 5/1994 | Fong et al. | |
| 5,659,283 A | 8/1997 | Arratia | |
| 5,786,613 A | 7/1998 | Kalnitsky | |
| 6,977,468 B1 | 12/2005 | Baginski | |
| 8,633,575 B1 | 1/2014 | Mangrum | |
| 9,184,569 B2 | 11/2015 | Ehrhardt et al. | |
| 9,575,111 B1 | 2/2017 | Karp et al. | |
| 9,871,373 B2 | 1/2018 | O'Donnell et al. | |
| 10,380,869 B1 | 8/2019 | Matyac | |
| 10,418,806 B2 | 9/2019 | Lopez Rodriguez et al. | |
| 10,418,808 B2 | 9/2019 | Bodette et al. | |
| 10,677,822 B2 | 6/2020 | Clarke et al. | |
| 2001/0002103 A1 | 5/2001 | Karins et al. | |
| 2002/0076840 A1 | 6/2002 | Englisch | |
| 2003/0089979 A1 | 5/2003 | Malinowski et al. | |
| 2005/0127444 A1 | 6/2005 | Watanabe | |
| 2006/0044717 A1 | 3/2006 | Hill et al. | |
| 2006/0250744 A1 | 11/2006 | McTigue et al. | |
| 2006/0274799 A1 | 12/2006 | Collins et al. | |
| 2006/0284307 A1 | 12/2006 | Baier et al. | |
| 2007/0139050 A1 | 6/2007 | Ivanov et al. | |
| 2007/0201177 A1 | 8/2007 | Kladar et al. | |
| 2007/0216015 A1 | 9/2007 | Schnitt et al. | |
| 2007/0278617 A1 | 12/2007 | Okada et al. | |
| 2008/0050113 A1 | 2/2008 | Mathes | |
| 2008/0122027 A1 | 5/2008 | Ueda | |
| 2008/0266730 A1 | 10/2008 | Viborg et al. | |
| 2009/0287435 A1 | 11/2009 | Ker et al. | |
| 2010/0271742 A1 | 10/2010 | Shannon et al. | |
| 2011/0069419 A1 | 3/2011 | Su et al. | |
| 2011/0089540 A1 | 4/2011 | Drost et al. | |
| 2011/0169495 A1 | 7/2011 | Lee et al. | |
| 2013/0257624 A1 | 10/2013 | Ayotte et al. | |
| 2014/0268440 A1 | 9/2014 | Chen et al. | |
| 2014/0334050 A1 | 11/2014 | Henke | |
| 2015/0001635 A1 | 1/2015 | Kwon et al. | |
| 2016/0009547 A1 | 1/2016 | Mason et al. | |
| 2016/0094026 A1 | 3/2016 | Coyne et al. | |
| 2016/0285255 A1 | 9/2016 | O'Donnell et al. | |
| 2016/0322813 A1 | 11/2016 | Aipperspach et al. | |
| 2017/0299649 A1 | 10/2017 | Coyne et al. | |
| 2018/0088155 A1 | 3/2018 | Clarke et al. | |
| 2018/0115155 A1 | 4/2018 | Kuo | |

FOREIGN PATENT DOCUMENTS

| | | |
|---|---|---|
| CN | 101689750 A | 3/2010 |
| CN | 102201333 A | 9/2011 |
| CN | 102201666 A | 9/2011 |
| CN | 102570902 A | 7/2012 |
| CN | 102769282 A | 11/2012 |
| CN | 202549831 U | 11/2012 |
| CN | 203562642 U | 4/2014 |
| CN | 103872670 A | 6/2014 |
| JP | S62-081050 | 4/1987 |
| JP | S64-12565 A | 1/1989 |
| JP | H08-017884 | 1/1996 |
| JP | 2003-533013 | 11/2003 |
| JP | 2005-136088 | 5/2005 |
| JP | 2005-517297 | 6/2005 |
| JP | 2007-329197 A | 12/2007 |
| JP | 2009-135283 A | 6/2009 |
| JP | 2010-028109 | 2/2010 |
| TW | 2003-03060 | 8/2003 |
| TW | 2013-10828 | 3/2013 |
| WO | WO 2012/090731 | 7/2012 |
| WO | WO 2012/105497 | 8/2012 |
| WO | WO 2013/009661 A2 | 1/2013 |

OTHER PUBLICATIONS

Office Action dated Feb. 22, 2021 in Japanese Application No. 2019-216763.
Notice of Allowance dated Aug. 2, 2021 in counterpart Japanese Application No. 2019-216763.
Extended European Search Report dated Apr. 28, 2021 in European Application No. 20214001.8.
European Search Report for European Application No. 17193556.2, dated Mar. 6, 2018 in 17 pages.
Extended European Search Report dated Jun. 19, 2018 in corresponding European Patent Application No. 17193556.2; 16 pages.
Office Action dated Jul. 4, 2018 in Taiwan Patent Application No. 106133104; 11 pages.
European Patent Office Communication dated Feb. 18, 2019 in European Patent Application No. 17 193 556; 7 pages.
Office Action dated Jul. 22, 2019 in P.R.C. Patent Application No. 201710890198.9; 10 pages.
Invitation to Pay Additional Fees dated Aug. 16, 2019 in PCT Patent Application No. PCT/EP2019/057472; 13 pages.
International Search Report and Written Opinion dated Oct. 14, 2019 in PCT Patent Application No. PCT/EP2019/057472; 14 pages.
Office Action dated Mar. 14, 2019 in corresponding Japanese Patent Application No. 2017-184749; 4 pages.
Office Action dated Jul. 29, 2019 in corresponding Japanese Patent Application No. 2017-184749; 3 pages.
Office Action dated Nov. 4, 2019 in corresponding European Patent Application No. 17 193 556.2; 7 pages.
Office Action dated Apr. 6, 2020 in European Application No. 17193556.2.
Office Action received in Chinese Application No. 201710890198.9 dated Aug. 17, 2020; 6 pages.
Office Action dated Mar. 5, 2020, in PRC Patent Application No. 2017108901989; 10 pages.

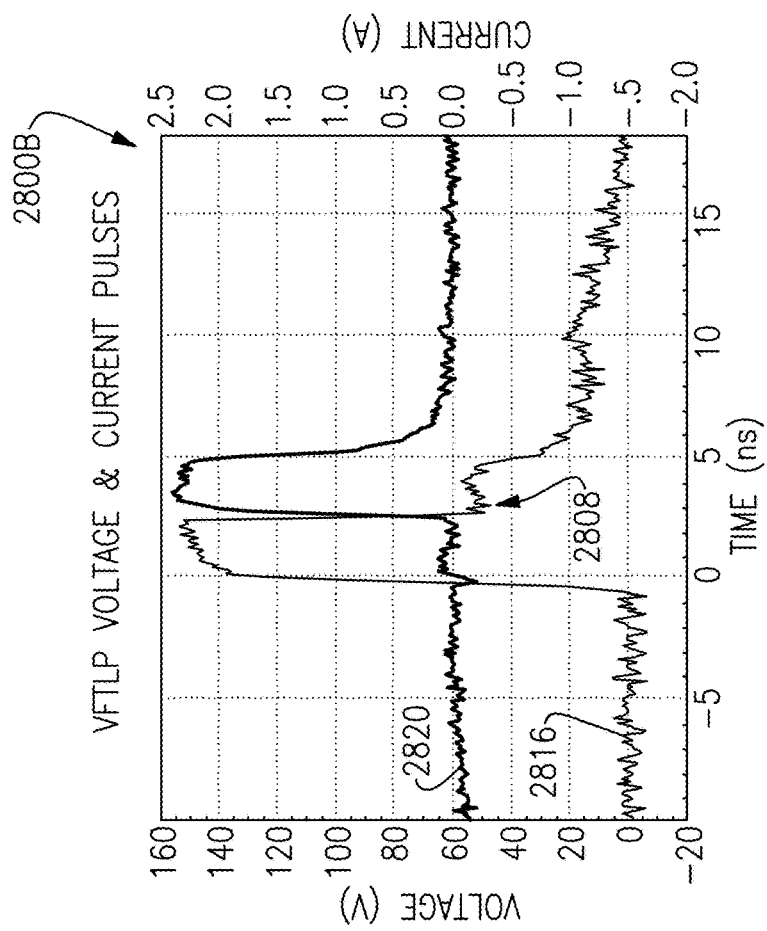
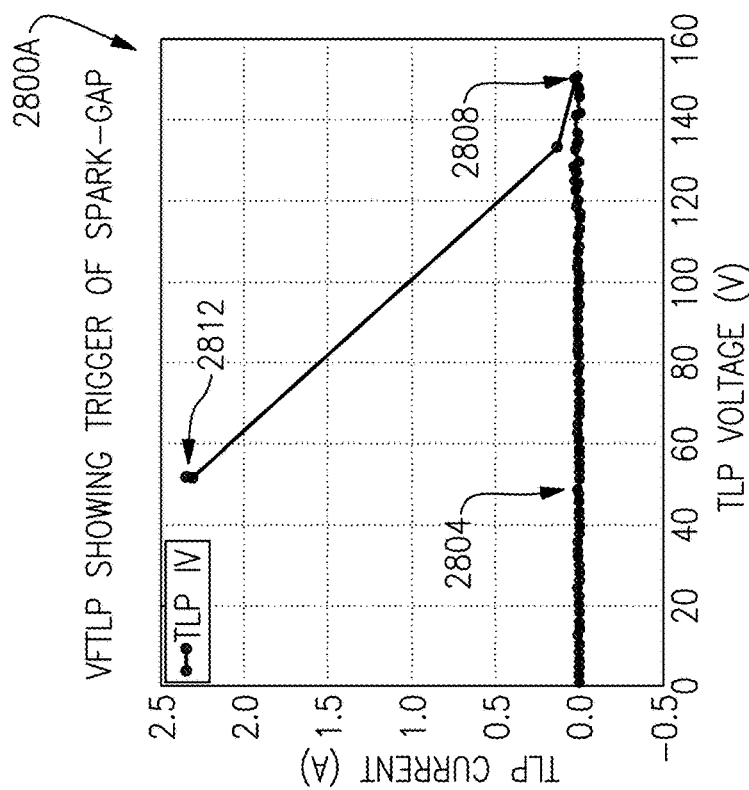
FIG.26B
FIG.26A

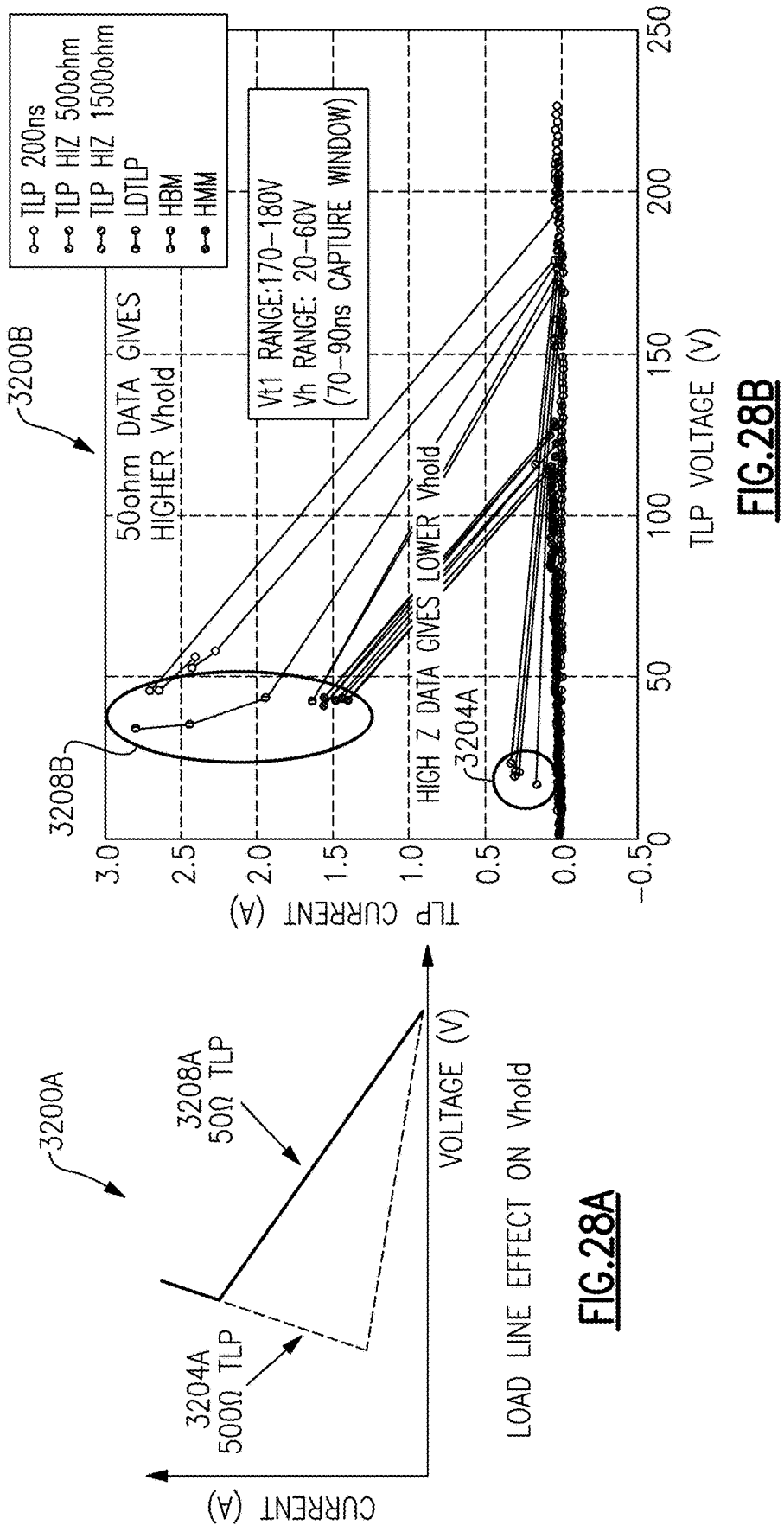

ELECTRICAL OVERSTRESS DETECTION DEVICE

INCORPORATION BY REFERENCE

This application is a continuation of U.S. application Ser. No. 15/708,958, filed Sep. 19, 2017, now U.S. Pat. No. 10,677,822, which claims the benefit of priority of U.S. Provisional Application No. 62/400,572, filed Sep. 27, 2016. The content of each of the above applications is incorporated by reference in its entirety.

FIELD OF THE DISCLOSURE

The disclosed technology generally relates to devices for addressing electrical overstress, and more particularly to device for detecting, monitoring, and/or protecting against electrical overstress events in semiconductor devices.

BACKGROUND

Certain electronic systems can be exposed to electrical overstress (EOS) events. Such events can cause damage to an electronic device as a result of the electronic device experiencing a current and/or a voltage that is beyond the specified limits of the electronic device. For example, an electronic device can experience a transient signal event, or an electrical signal lasting a short duration and having rapidly changing voltage and/or current and having high power. Transient signal events can include, for example, electrostatic discharge (ESD) events arising from an abrupt release of charge from an object or person to an electronic system, or a voltage/current spike from the electronic device's power source. In addition, EOS events can occur whether or not the device is powered.

Electrical overstress events, such as transient signal events, can damage integrated circuits (ICs) due to over-voltage conditions and high levels of power dissipation in relatively small areas of the ICs, for example. High power dissipation can increase IC temperature, and can lead to numerous problems, such as gate oxide punch-through, junction damage, metal damage, surface charge accumulation, the like, or any combination thereof.

To diagnose device failures or predict device lifespan, it can be useful to characterize EOS events, e.g., in terms of voltage, power, energy and duration. However, such characterization is difficult, for example, because the duration of some EOS events can be extremely short. Thus, there is a need to develop an EOS monitor that can detect and relay a warning, and can provide at information about EOS events that are at least semi-quantitative.

SUMMARY OF SOME ASPECTS OF THE DISCLOSURE

In an aspect, a device configured to monitor electrical overstress (EOS) events comprises a pair of spaced conductive structures configured to electrically arc in response to an EOS event, wherein the pair of spaced conductive structures configured to electrically arc in response to an EOS event, wherein the spaced conductive structures are formed of a material and have a shape such that arcing causes a detectable change in shape of the spaced conductive structures, and wherein the device is configured such that the change in shape of the spaced conductive structures is detectable to serve as an EOS monitor.

In some embodiments, the pair of spaced conductive structures is formed of a material selected to locally melt in response to arcing to cause the increase in the gap distance.

In some embodiments, the pair of spaced conductive structures is formed of a metal.

In some embodiments, the pair of spaced conductive structures comprises a pair of spaced protrusions each having a sharpened tip.

In some embodiments, the observable change in shape includes an observable increase in a gap distance between the spaced conductive structures.

In some embodiments, the device is configured such that the increase in the gap distance indicating occurrence of an EOS event can be visually detected.

In some embodiments, the device is configured such the increase in gap distance indicating occurrence of an EOS event can be detected using a visible light microscope.

In some embodiments, the device is configured to electrically measuring an open circuit voltage across the pair of spaced conductive structures to determine whether the gap distance has altered.

In some embodiments, the device is configured to electrically measure a leakage current across the pair of spaced conductive structures.

In some embodiments, the pair of spaced conductive structures is integrated with a semiconductor substrate.

In some embodiments, the spaced conductive structures are formed at a metallization level integrated with the semiconductor substrate.

In some embodiments, the spaced conductive structures are at least partially buried by a dielectric layer formed at the metallization level.

In some embodiments, the spaced conductive structures are electrically separated by the dielectric layer formed at the metallization level, such that the spaced conductive structures are configured to electrically arc through the dielectric layer.

In some embodiments, the device comprises a plurality of pairs of protrusions electrically connected in parallel.

In some embodiments, two or more pairs of protrusions have different separation distances and are configured to arc in response to different overstress voltages that are proportional to the separation distances.

In some embodiments, the two or more pairs of protrusions have different separation distances prior to arcing.

In some embodiments, the pair of spaced conductive structures is serially connected to a fuse.

In some embodiments, the pair of spaced conductive structures serves as an electrical overstress protection (EOS) device configured to protect the device against electrical overstress (EOS) events.

In some embodiments, the device further comprises a semiconductor-based electrical overstress (EOS) protection device electrically connected to the pair of spaced conductive structures, the EOS protection device configured to shunt a higher amount of current compared to the pair of spaced conductive structures.

In some embodiments, the semiconductor-based EOS protection device is electrically connected in parallel to the pair of spaced conductive structures.

In some embodiments, the device further comprises a core circuit, wherein the pair of spaced conductive structures and the core circuit are electrically connected to at least one common electrical terminal such that the pair of spaced conductive structures serves as a monitor device for monitoring EOS events occurring in the core circuit.

In some embodiments, the pair of spaced conductive structures is configured to electrically arc in response to an EOS event regardless of whether the core circuit is electrically activated.

In some embodiments, the core circuit and the pair of spaced conductive structures are integrated in a semiconductor package.

In some embodiments, the core circuit and the pair of spaced conductive structures are integrated in the same semiconductor die.

In some embodiments, the core circuit and the pair of spaced conductive structures are disposed in different semiconductor dies.

In some embodiments, the pair of spaced conductive structures serves as an electrical overstress (EOS) protection device.

In another aspect, a method of monitoring a semiconductor device comprises providing a pair of conductive structures having a gap therebetween, the pair of conductive structures integrated with a semiconductor substrate and configured to electrically arc in response to an electrical overstress (EOS) event; and monitoring the pair of conductive structures to determine whether an electrical pulse has arced across the gap between the pair of spaced conductive structures.

In some embodiments, monitoring comprises determining whether an EOS event had occurred in the semiconductor device by measuring a change in an open circuit voltage across the gap.

In some embodiments, monitoring comprises determining whether an EOS event had occurred in the semiconductor device by measuring a change in a leakage current along an electrical path that includes the gap.

In some embodiments, monitoring comprises determining whether an EOS event had occurred in the semiconductor device by detecting an open circuit across a fuse that is serially connected to the pair of spaced conductive structures.

In some embodiments, monitoring comprises determining whether an EOS event had occurred in the semiconductor device by visually inspecting ends of the conductive structures bordering on the gap for a change in appearance.

In some embodiments, providing the semiconductor device comprises providing a plurality pairs of conductive structures each having a gap therebetween, the pairs of conductive structures being electrically connected in parallel.

In some embodiments, the pairs of conductive structures have different gaps and are configured to arc in response to overstress voltages that are related to the different gaps, and wherein monitoring comprises identifying a pair of spaced conductive structures having the largest separation distance among arced pairs of spaced conductive structures, and estimating a maximum voltage associated with the EOS event.

In some embodiments, monitoring comprises determining whether an EOS event had occurred in the semiconductor device by measuring a change in capacitance across the pair of conductive structures.

In some embodiments, monitoring comprises determining whether an EOS event had occurred in the semiconductor device by visibly detecting signs of a blown fuse that is serially connected to the pair of spaced conductive structures.

In another aspect, an electrical overstress (EOS) monitoring device comprises a plurality of pairs of conductive structures having a plurality of differently sized gaps therebetween, where the pairs of conductive structures are electrically connected in parallel, and where the differently sized gaps are configured to electrically arc in response to correspondingly different electrical overstress voltages.

In some embodiments, the pairs of conductive structures are configured to be monitored for having experienced arcing.

In some embodiments, the device is configured to allow visual inspection of any damage to the conductive structures at the gaps.

In some embodiments, the device is configured to electrically monitor whether the conductive structures have altered in response to arcing.

In some embodiments, the device further comprises a semiconductor-based electrical overstress (EOS) protection device electrically connected with the pairs of differently spaced conductive structures.

In some embodiments, the semiconductor-based EOS protection device is configured to trigger at a voltage higher than the voltages at which the pairs of differently spaced conductive structures are configured to arc.

In some embodiments, the semiconductor-based EOS protection device is configured such that, upon triggering at a trigger voltage, a voltage across the semiconductor-based electrical overstress protection device does not snap back to a lower voltage than the trigger voltage.

In some embodiments, the semiconductor-based EOS protection device comprises an avalanche diode.

In some embodiments, the semiconductor-based EOS protection device is configured such that, upon triggering at a trigger voltage, a voltage across the semiconductor-based electrical overstress protection device snaps back to a lower voltage than the trigger voltage.

In some embodiments, the lower voltage is higher than voltages at which the pairs of differently spaced conductive structures are configured to arc.

In some embodiments, the semiconductor-based EOS protection device comprises a bipolar junction transistor.

In some embodiments, the pairs of differently spaced conductive structures are configured be connected to a core circuit, wherein the pairs of spaced conductive structures and the core circuit are electrically connected to at least one common electrical terminal such that the pair of spaced conductive structures serves as a monitor device for monitoring an EOS event occurring in the core circuit.

In some embodiments, upon electrically arcing, each of the pairs of differently spaced conductive structures is configured such that a voltage across the each of the pairs of differently spaced conductive structures snaps back to a voltage higher than a power supply voltage of the core circuit.

In another aspect, an apparatus comprises a core circuit; an electrical overstress (EOS) protection device electrically connected to the core circuit and configured to shunt current from the core circuit resulting from an EOS event; and an EOS monitor device electrically connected to the core circuit, the EOS monitor device comprising a pair of spaced conductive structures configured to electrically arc in response to an EOS event and to undergo a change in shape of the spaced conductive structures.

In some embodiments, the device is configured such that the pair of spaced conductive structures are configured to be detected and to serve as an EOS monitor.

In another aspect, a device with an integrated sensor for sensing electrical overstress (EOS) events includes a substrate and a pair of spaced conductive structures or spark gap structures integrated with the substrate, where the spaced conductive structures are configured to electrically arc in response to an EOS event.

In some embodiments, the spaced conductive structures are formed of a material and have a shape such that arcing causes a detectable change in shape of the spaced conductive structures, and wherein the device is configured such that the spaced conductive structures are configured to be detected and to serve as an EOS monitor.

In some embodiments, the spaced conductive structures are formed at a metallization level of the device.

In some embodiments, the spaced conductive structures are at least partially buried by a dielectric layer.

In some embodiments, the spaced conductive structures are electrically separated by a dielectric material.

In some embodiments, the pair of spaced conductive structures includes a pair of spaced protrusions having a separation distance therebetween.

In some embodiments, the device includes a plurality of pairs of protrusions electrically connected in parallel.

In some embodiments, the pairs of protrusions have different separation distances and are configured to arc in response to different overstress voltages that are related to the separation distances.

In some embodiments, the different overstress voltages are proportional to the separation distances.

In some embodiments, the pair of spaced conductive structures is serially connected to a fuse.

In some embodiments, the pair of spaced conductive structures is configured to be visible in the device such that whether or not an EOS event had caused arcing across the pair of spaced conductive structures can be visually detected.

In some embodiments, whether or not an EOS event had caused arcing across the pair of spaced conductive structures can be visually detected using a microscope.

In some embodiments, the device further includes a semiconductor-based electrical overstress protection device electrically connected to the pair of spaced conductive structures.

In some embodiments, the semiconductor-based electrical overstress protection device is electrically connected in parallel to the pair of spaced conductive structures.

In some embodiments, the device further includes a core circuit electrically connected to the pair of spaced conductive structures, wherein the pair of spaced conductive structures is configured to electrically arc in response to an EOS event regardless of whether the core circuit is electrically activated.

In some embodiments, the pair of spaced conductive structures serves as an electrostatic discharge (ESD) protection device.

In some embodiments, the pair of spaced conductive structures serves as a monitor device connected to a semiconductor electrostatic discharge (ESD) protection device.

In some embodiments, the device is formed by microfabrication techniques, including, e.g., photolithography and etching.

In some embodiments, the substrate is a semiconductor substrate.

In another aspect, a method of monitoring a device, e.g., a semiconductor device, includes providing a pair of conductive structures having a gap therebetween. The pair of conductive structures is integrated with a semiconductor substrate and configured to electrically arc across the gap in response to an electrical overstress (EOS) event. The method includes monitoring the pair of conductive structures to determine whether an electrical arc has occurred across the gap between the pair of spaced conductive structures.

In some embodiments, monitoring includes determining whether an EOS event had occurred in the semiconductor device by measuring a change in open circuit voltage across the pair of spaced conductive structures.

In some embodiments, monitoring includes determining whether an EOS event had occurred in the semiconductor device by measuring a change in capacitance between the pair of spaced conductive structures.

In some embodiments, monitoring includes determining whether an EOS event had occurred in the semiconductor device by measuring a change in leakage current along an electrical path that includes the gap.

In some embodiments, monitoring includes determining whether an EOS event had occurred in the semiconductor device by detecting an open circuit across a fuse that is serially connected to the pair of spaced conductive structures.

In some embodiments, monitoring includes determining whether an EOS event had occurred in the semiconductor device by visually detecting that a fuse that is serially connected to the pair of spaced conductive structures had blown.

In some embodiments, monitoring includes determining whether an EOS event had occurred in the semiconductor device by visually inspecting tips or ends of the conductive structures bordering on the gap.

In some embodiments, providing the device includes providing a plurality pairs of conductive structures each having a gap therebetween, the pairs of conductive structures being electrically connected in parallel.

In some embodiments, the pairs of conductive structures have different gaps and are configured to arc in response to overstress voltages that are related to the different gaps, and monitoring comprises identifying a pair of spaced conductive structures having the largest separation distance among arced pairs of spaced conductive structures, and estimating a maximum voltage associated with the EOS event.

In another aspect, an electrical overstress (EOS) monitoring device includes a plurality of pairs of spaced conductive structures having differently sized gaps therebetween, where the pairs of conductive structures are electrically connected in parallel, and the differently sized gaps are configured to electrically arc in response to correspondingly different electrical overstress voltages.

In some embodiments, the pairs of conductive structures are configured to be monitored for having experienced arcing.

In some embodiments, the device is configured to allow visual inspection of any damage to the conductive structures at the gaps.

In some embodiments, the device is configured to electrically monitor whether the conductive structures have altered in response to arcing.

In some embodiments, the EOS monitoring device further includes a semiconductor-based electrical overstress protection device electrically connected with the pairs of differently spaced conductive structures.

In some embodiments, the semiconductor-based electrical overstress protection device is configured trigger at a voltage higher than the voltages at which the pairs of differently spaced conductive structures are configured to arc.

In some embodiments, upon triggering, the semiconductor-based electrical overstress protection device is configured such that a voltage across the semiconductor-based electrical overstress protection device does not to snap back to a lower voltage.

In some embodiments, upon triggering, the semiconductor-based electrical overstress protection device is configured such that a voltage across the semiconductor-based electrical overstress protection device snaps back to a voltage higher than the voltages at which the pairs of differently spaced conductive structures are configured to arc.

In some embodiments, upon triggering, the semiconductor-based electrical overstress protection device is configured not to snap back in voltage or snap back to a voltage higher than the voltages at which the pairs of differently spaced conductive structures are configured to arc.

In some embodiments, the pairs of differently spaced conductive structures are configured be connected to a core circuit and draw a minority current resulting from an EOS overstress event, thereby serving as a monitoring device for the EOS overstress event.

In some embodiments, upon electrically arcing, each of the pairs of spaced conductive structures having differently sized gaps is configured such that a voltage across each gap snaps back to a voltage higher than a power supply voltage to the core circuit.

BRIEF DESCRIPTION OF THE DRAWINGS

Embodiments of this disclosure will now be described, by way of non-limiting example, with reference to the accompanying drawings.

FIG. 26A illustrates a very fast transmission line pulse (VFTLP) current-voltage (IV) curve measured on a pair of spaced conductive structures fabricated using metal 2 structures, according to embodiments.

FIG. 26B illustrates an overlaid voltage-time (V-t) curve and a current-time (I-t) curve corresponding to the VFTLP IV curve of FIG. 26A.

FIG. 28A schematically illustrates experimentally controlling effective holding voltage under transmission line pulse testing using transmission lines that have different load values.

FIG. 28B illustrates experimental verification of the effect of load values on holding voltage illustrated with respect to FIG. 28A.

DETAILED DESCRIPTION

Figure 1A:
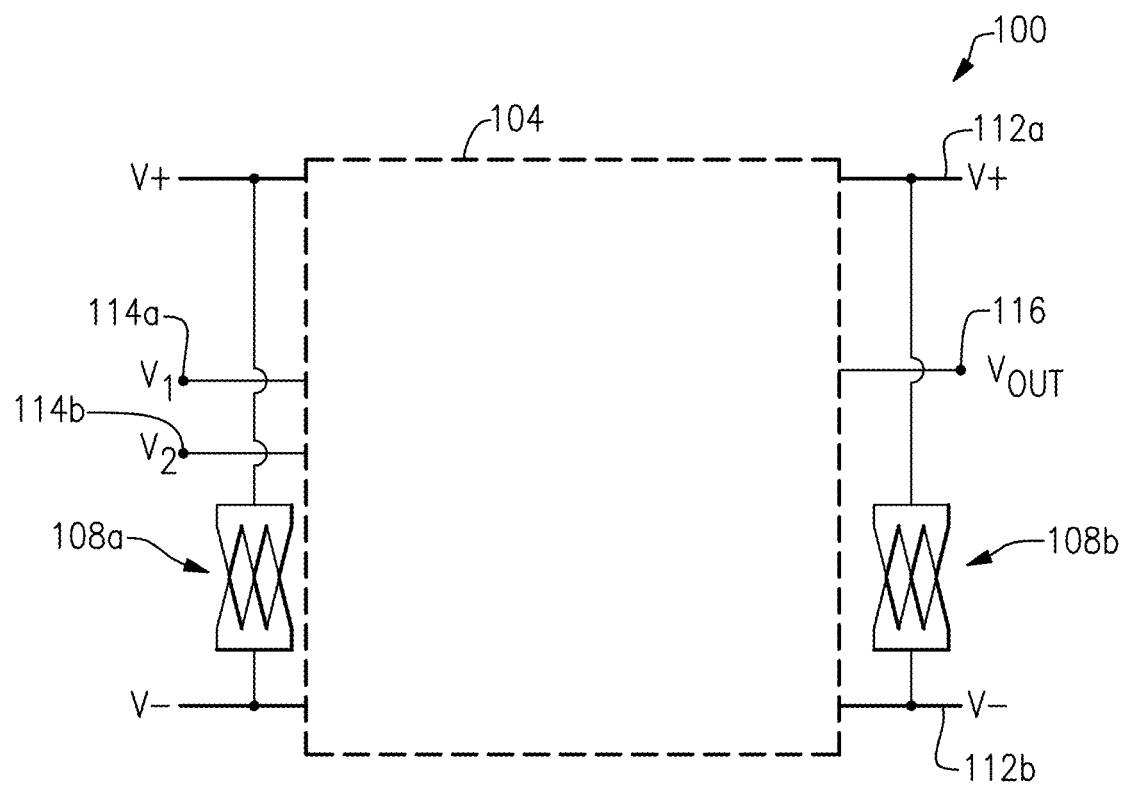
FIG. 1A is a schematic diagram of semiconductor device having a core circuit and electrical overstress (EOS) monitor devices including spaced conductive structures, according to embodiments.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawings and/or a subset of the illustrated elements. Further, some embodiments can incorporate any suitable combination of features from two or more drawings. The headings provided herein are for convenience only and do not necessarily affect the scope or meaning of the claims.

Various electronic devices for various applications including automotive and consumer electronics that are fabricated using low voltage CMOS processes are increasingly using input/output (I/O) interface pins that operate at relatively high bidirectional voltages. These devices often operate in relatively harsh environments and should comply with applicable electrostatic discharge (ESD) and electromagnetic interference immunity (EMI) specifications. Integrated circuits (ICs) can be particularly susceptible to damage from electrical overstress (EOS) events, such as ESD events. Robust ESD and EMI immunity is desirable because the electronic devices can be subject to a wide range of high voltage transient electrical events that exceed ordinary operating conditions. High voltage events are particularly common in the automotive electronics field.

The transient electrical events can be, e.g., a rapidly changing high energy signal such as an electrostatic discharge (ESD) event. The transient electrical event can be associated with an overvoltage event caused by a user contact or contact with other objects, or simply from malfunctions in electrical systems. In other circumstances, the transient electrical event can be generated by a manufacturer to test the robustness of the transceiver integrated circuit under a defined stress condition, which can be described by standards set by various organizations, such as the Joint Electronic Device Engineering Council (JEDEC), the International Electrotechnical Commission (IEC), and the Automotive Engineering Council (AEC).

Various techniques can be employed to protect a core or a main circuitry of the electronic devices, such as ICs against these damaging transient electrical events. Some systems employ external off-chip protection devices to ensure that core electronic systems are not damaged in response to the transient electrostatic and electromagnetic events. However, due to performance, cost, and spatial considerations, there is an increasing need for protection devices that are monolithically integrated with the main circuitry, that is, the circuitry to be protected Electronic circuit reliability can be enhanced by providing protection devices, e.g., ESD protection devices. Such protection devices can maintain relatively high voltage levels at certain locations, e.g., IC power high supply voltage ($V_{dd}$), within a predefined safe range by transitioning from a high-impedance state to a low-impedance state when the voltage of the transient electrical event reaches a trigger voltage. Thereafter, the protection device can shunt at least a portion of the current associated with the transient electrical event to, e.g., ground, before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for a protection device to be configurable for different current and voltage (I-V) blocking characteristics and able to render protection against positive and negative transient electrical events with fast operational performance and low static power dissipation at normal operating voltage conditions.

Electrical Overstress Monitor Devices and Protection Devices Having Spaced Conductive Structures Typical electrical overstress protection devices are designed to protect core circuitry from potentially damaging electrical overstress events. The EOS protection devices are often designed to protect the core circuitry based on a range of EOS conditions the core circuitry is expected to be subjected to during use. However, because EOS protection devices are designed to trigger when the damaging EOS event exceeds a trigger condition, e.g., trigger voltage or a threshold voltage, a triggering event only indicates that the trigger condition has been exceeded, without an indication of by how much, for example. Furthermore, when a potentially damaging EOS event close to but not exceeding the trigger condition of the EOS protection device occurs, no warning is provided, even though repeated occurrences of such EOS events can eventually lead to actual damage and failure of the core circuitry and/or the EOS protection device. Thus, there is a need for a monitor device which can provide semi quantitative or quantitative information about damaging EOS events, e.g., the voltage and dissipated energy associated with the damaging EOS events, regardless of whether the EOS protection device has been triggered. Such a monitor device can detect an EOS event and relay a warning to a user, e.g., as a preventive maintenance, before more damaging EOS exceeding a threshold voltage limit of a core circuit affects the device. In addition, when the device is damaged by an EOS event, the monitor device can provide a history of the EOS event(s) that may have caused the damage to the device, thereby providing valuable diagnostic information to determine a root cause of the EOS event(s).

To provide these and other advantages, an electrical overstress (EOS) monitoring device is disclosed according to various embodiments. The EOS monitoring device comprises a pair of spaced conductive structures that are configured to electrically arc in response to an EOS event. Advantageously, when the core circuitry fails from a damaging EOS event despite having an EOS protection device, or when the ESC protection device itself fails as a result of a damaging EOS event, information regarding the nature of the damaging EOS event can be obtained using the EOS monitoring device. Such information may include, e.g., voltage and/or energy associated with the EOS event. In addition, when potentially damaging EOS event close to but not exceeding the trigger condition of the EOS protection device occurs, the EOS monitoring device can be used to provide a warning, such that repeated occurrences of such EOS events can be prevented from leading to actual damage or failure of the core circuitry and/or the EOS protection device. In addition, the EOS monitoring device can advantageously be configured to serve as an EOS protection device itself. Furthermore, the EOS monitoring device can serve as a monitor and/or the EOS protection device regardless of whether the core circuitry is activated. In the description below and in the figures, the term "ESD protection device" is employed to readily distinguish the label for the EOS monitoring device; however, the skilled artisan will appreciate that the so-called "ESD" protection device may protect against a wider array of EOS events and is not limited to protection against ESD events.

As such, information associated with the occurrence of an EOS event e.g., voltage and/or energy associated with the EOS event, can be made unavailable to an electronic system using the EOS monitoring device disclosed herein. Various embodiments can provide more reliable circuit operation in various applications. For instance, various embodiments can reduce failures of electronics in a car or other vehicle and improve safety of a driver and/or a passenger. As another example, for electronics in healthcare applications, such as heart rate monitoring applications, embodiments can be used to more reliably detect a change in a physiological parameter so that proper action can be taken responsive to detecting such a change. When circuits in such healthcare applications fail, health can be adversely impacted. In applications where there is a need for reliable circuit operation, embodiments disclosed herein can reduce or minimize unknown potential damage to critical circuits. Furthermore, the "monitoring" function need not be responsive in real time. Rather, it is useful to have a monitoring devices that can be inspected after device failure, to determine how many or what level of EOS event occurred in the failed part for diagnostic purposes. Such information can be obtained, for example, by electrical monitoring during use or after failure, or by visual inspection of the failed part, as will be understood by the description below. The diagnostic information on the extent of the EOS event may be useful in pinpointing the cause of the EOS event for either avoiding such events in the future or designing parts to be more resistant to such events.

As noted above, while this disclosure may discuss "ESD" protection devices or circuits and ESD events for illustrative purposes, it will be understood that any of the principles and advantages discussed herein can be applied to any other electrical overstress (EOS) condition. EOS events can encompass a variety of events including transient signal events lasting about 1 nanosecond or less, transient signal events lasting hundreds of nanoseconds, transient signal events lasting on the order of 1 microsecond, and much longer duration events, including direct current (DC) overstresses.

FIG. 1A is a schematic diagram of an electronic device 100 having a core circuit 104 and electrical overstress (EOS) monitor devices 108a, 108b including spaced conductive structures, according embodiments. The spaced conductive structures may be referred to as spark-gap devices, and they are configured to allow arcing across a dielectric gap between conductive structures. The core circuit 104 may be any suitable semiconductor-based circuit to be protected, which can include transistors, diodes and resistors, among other circuit elements. The core circuit 104 may be connected to a voltage high supply 112a, e.g., $V_{dd}$ or $V_{cc}$, and a voltage low supply 112b, e.g., $V_{ss}$ or $V_{ee}$. The core device 104 includes input voltage terminals 114a, 114b and an output terminal 116. Electrically connected between the voltage high supply 112a and the voltage low supply 112b and electrically in parallel with the core circuit 104 are EOS monitor devices 108a, 108b each having spaced conductive structures. In the illustrated embodiment, each of the monitor devices 108a, 108b includes a first conductive structure connected to the voltage high supply 112a serving as an anode and a second conductive structure connected to the voltage low supply 112b serving as a cathode. At least one gap of designed distance is provided between the first and second conductive structures. In FIG. 1A, each EOS monitor device 108a, 108b has three such gaps formed in parallel, and as will be described below, the three gaps can have three different sizes. In response to an ESD event, the EOS monitor devices 108a, 108b are configured to electrically arc. The spaced conductive structures of each of the EOS monitor devices 108a, 108b are formed of a material, have shapes and have a spacing between the first and second conductive structures such that each of EOS monitor devices 108a, 108b is configured to arc at a trigger voltage $V_{TR}$. Where the EOS monitor devices 108a, 108b have multiple gaps, each gap has its own trigger voltage $V_{TR}$. The arc may occur across all gaps smaller than the distance across which the EOS voltage will arc.

Figure 1B:
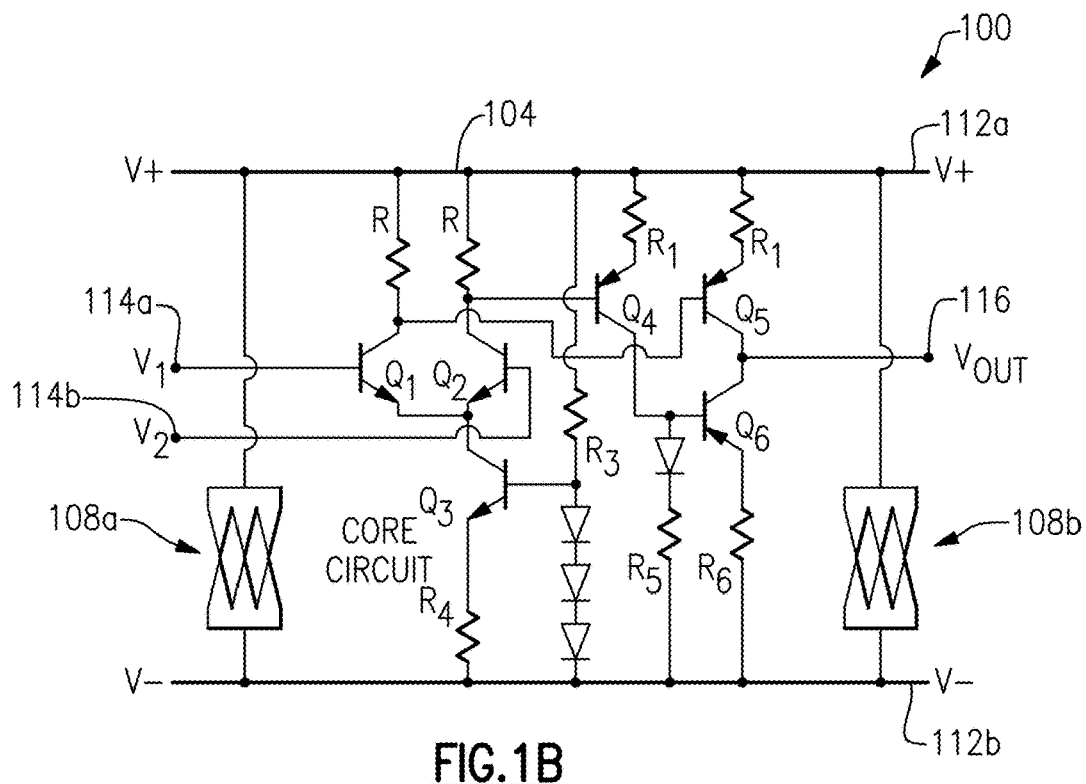
FIG. 1B illustrates one implementation of the semiconductor device illustrated in FIG. 1A with an example core circuit.

FIG. 1B is a schematic diagram of an electronic device 100 illustrating one example of a core circuit 104 electrically connected to electrical overstress (EOS) monitor devices 108a, 108b including spaced conductive structures, according embodiments. The core circuit 104 comprises one or more of resistors, e.g., R, R1, R3, R5, R6, and/or one or more diodes, and/or one or more transistors Q1, Q2, Q4, Q5, among other circuit elements.

In the illustrated embodiments of FIGS. 1A and 1B, for illustrative purposes, EOS monitor devices 108a, 108b are disposed between the voltage high supply ($V^+$) 112a and the voltage low supply ($V^-$) 112b. However, embodiments are not so limited and in other embodiments, EOS monitor devices can be disposed in lieu of or in addition to the EOS monitor devices 108a, 108b between any two voltage nodes of the $V^+$ 112a, the $V^-$ 112b, $V_1$, $V_2$ and $V_{out}$, where an electrical overstress condition may develop therebetween.

Figure 1C:
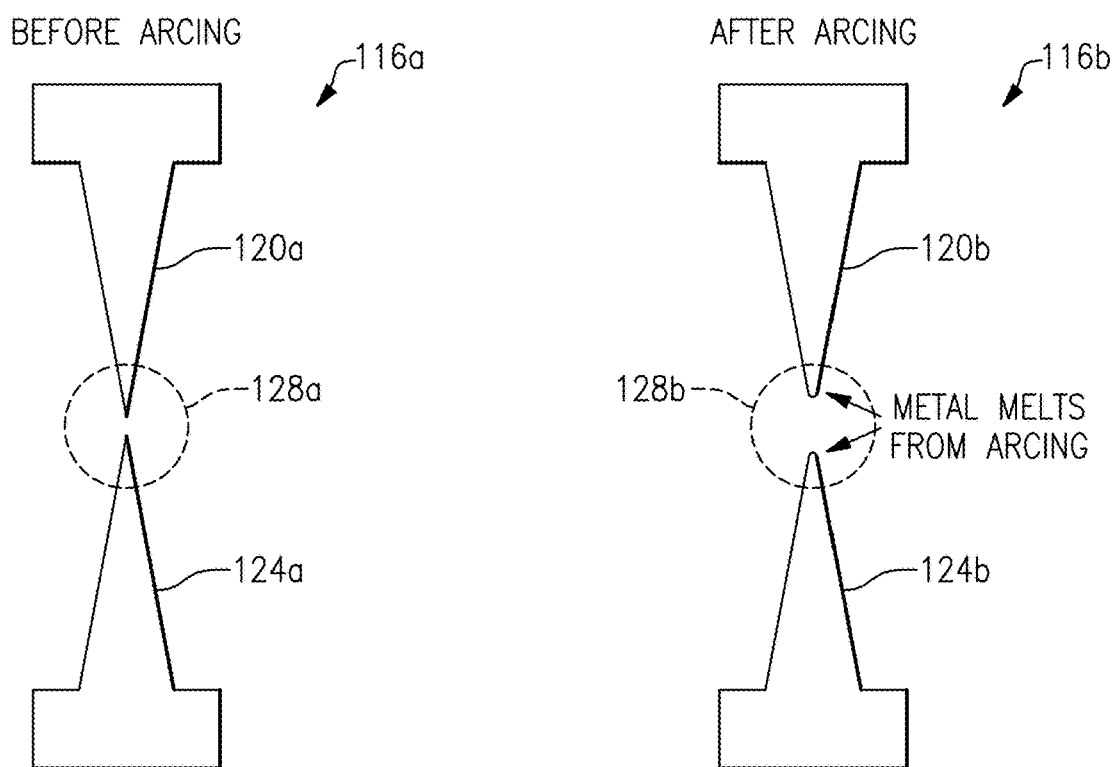
FIG. 1C is a schematic diagram of an electrical overstress (EOS) monitor device including a pair of spaced conductive structures, before and after electrically arcing in response to an EOS event, according to embodiments.

FIG. 1C is a schematic diagram of an electrical overstress (EOS) monitor device including a pair 116A/116B of spaced conductive structures, before (116A) and after (116B) electrically arcing in response to an EOS event, according to embodiments. The pair 116A of spaced conductive structures includes a cathode 120A and an anode 124A prior to arcing, and the pair 116B of spaced conductive structures includes an anode 120B and the anode 124B subsequent to arcing.

Prior to experiencing arcing due to an ESD event, the pair 116A of spaced conductive structures has a pre-arc inter-electrode spacing 128A. As described infra, the pre-arc inter-electrode spacing 128A can be tuned, among other factors, such that the resulting EOS monitor devices are configured to arc at a desired trigger voltage $V_{TR}$. Upon experiencing arcing, the pair 116B of spaced conductive structures has a post-arc inter-electrode spacing 128B that is greater than the pre-arc inter-electrode spacing 128A. As described infra, the amount by which the post-arc inter-electrode spacing 128B increases relative to the pre-arc inter-electrode spacing 128A depends, among other factors, the magnitude of energy that is dissipated during arcing, as well as material properties of the pair conductive structures. Because of the increased inter-electrode spacing 128B, after experiencing arcing, the trigger voltage $V_{TR}$ of the pair 116B of spaced conductive structures increases. The structure and materials of the pair 116A spaced conductive structures can be tuned, among other factors, such that the resulting increased $V_{TR}$ is higher than the initial $V_{TR}$ by a desired amount. Thus, according some embodiments, whether an EOS event had occurred can be determined by measuring an increase in an open circuit voltage across the pair 116B of spaced conductive structures post-arcing relative to the pair 116A of spaced conductive structures prior to arcing. The change in the gap may also be detected in as a change in leakage current through a path that includes the gap. The change can also be detected visually, as the damaged tips will be apparent from visual inspection. Accordingly, the devices may be integrated (e.g., with metal levels of an integrated circuit) in a manner that allows visual inspection, such as with a microscope.

Without being limited to any theory, arcing of the spaced conductive structures can initiate as a result of an electric discharge that develops due to a flow of current from the cathode 120A to the anode 124A. The flow of current can be generated by various mechanisms, such as field emission, secondary emission and thermal emission, among other mechanisms. For example, under some circumstances, arcing of the spaced conductive structures can be initiated, facilitated or sustained by free electrons emitted by the cathode 120A during arcing through field emission, which refers emission of electrons that is induced by an electrostatic field. Field emission can occur under a relatively strong electric field (e.g., $10^7$ V/cm), in which free electrons are pulled out of the metal surface. Once initiated, under some circumstances, arcing of the spaced conductive structures can be further facilitated or sustained by free electrons emitted by the cathode 120A through thermionic emission. For example, the flow of current between the cathode 120A and the anode 120B can increase the temperature of the conductive material of the cathode 120A, which increases the kinetic energy of free electrons therein, thereby causing electrons to be ejected from the surface of the conductive material of the cathode 120A.

Thus generated free electrons (e.g., by field or thermo-ionic emission) can accelerate towards the anode 120B because of the potential difference between the cathode 120A and the anode 120B resulting from an EOS event. Such electrons can further decompose atoms of the inter-electrode material into charged particles, which can develop high velocities under the high electric field of an EOS event. These high velocity electrons moving from cathode 120A toward the anode 120B collide with atoms of the inter-electrode material, e.g., air or a dielectric material, between the cathode 120A and the anode 120B and decompose them into charged particles i.e. electrons and ions.

As described supra, free electrons and charged particles are involved in initiating the arc and their maintenance. Without subscribing to any scientific theory, emitting electrons by the cathode 120A depends on several factors, including material properties such as work function and ionization potential of the cathode and/or the anode, as well as their physical shapes and dimensions. In addition, as described supra, the amount by which the $V_{TR}$ increases upon arcing depends on several factors, including material properties such as melting point of the cathode and the anode, as well as their physical shapes and dimensions.

In consideration of the above emission properties and melting properties, among other factors, one of both of the cathode 120A and the anode 120B can be formed of suitable conductive and/or semiconductive material, e.g., n-doped poly silicon and p-doped poly silicon, metals including C, Al, Cu, Ni, Cr, Co, Ru, Rh, Pd, Ag, Pt, Au, Jr, Ta, and W, conductive metal nitrides, conductive metal silicides including tantalum silicides, tungsten silicides, nickel silicides, cobalt silicides, and titanium silicides, conductive metal oxides including $RuO_2$, mixtures or alloys of the above, etc., according to various embodiments. In some embodiments, one of both of the cathode 120A and the anode 120B can comprise a transition metal and may be, for example, a transition metal nitride, such as TiN, TaN, WN, or TaCN.

In some embodiments, the cathode 120A and the anode 120B can be formed of or comprise the same conductive material, while in other embodiments, the cathode 120A and the anode 120B can be formed of or comprise different conductive materials.

Figure 1D:
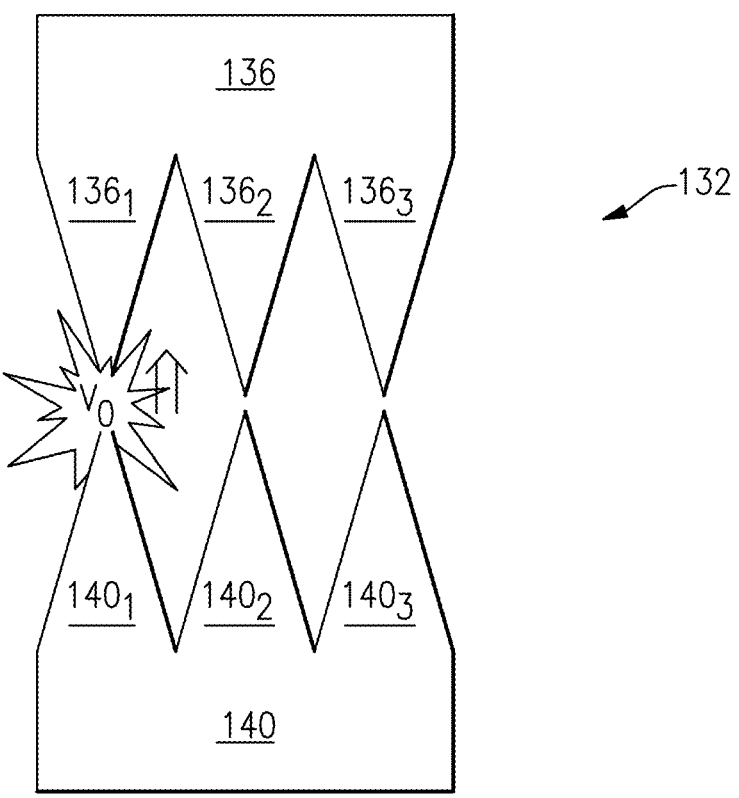
FIG. 1D is a schematic diagram of an EOS monitor device including a plurality of pairs of spaced conductive electrically connected in parallel, according to embodiments.

FIG. 1D is a schematic diagram of an EOS monitor device 132 including a plurality of pairs of spaced conductive structures electrically connected in parallel, according to embodiments. The EOS monitor device 132 includes a plurality of pairs of spaced conductive structures. The plurality of pairs of spaced conductive structures are formed by a cathode 136 which includes a plurality of cathode conductive structures $136_1$, $136_2$, $136_3$, and an anode 140 which includes a plurality of corresponding anode conductive structures $140_1$, $140_2$, $140_3$.

Figure 9A:
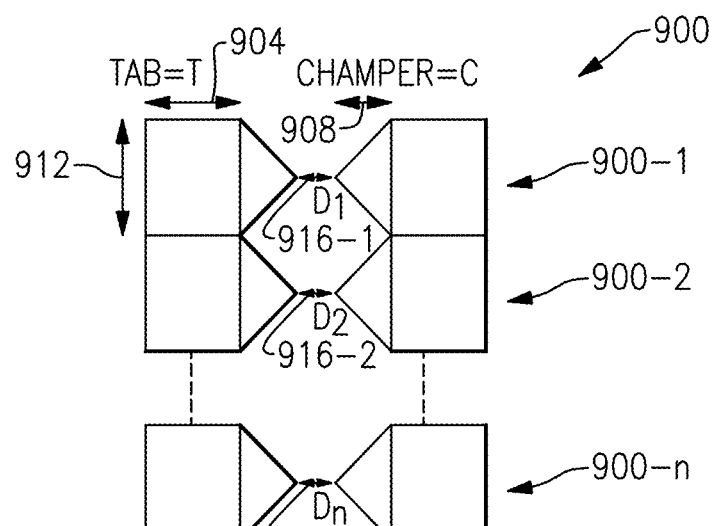
FIG. 9A is a schematic top-down view of a plurality of pairs of spaced conductive structures electrically connected in parallel with different gaps corresponding to different trigger voltages, according to embodiments.
Figure 10A:
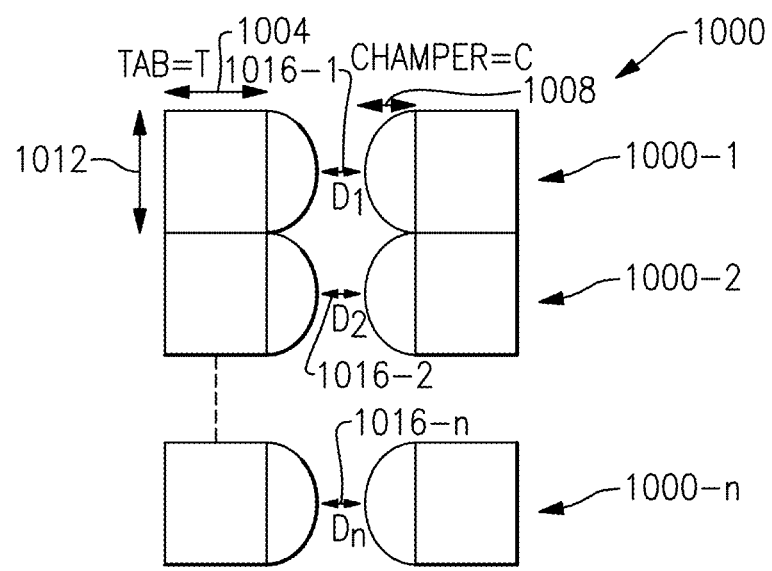
FIG. 10A is a schematic top-down view of a plurality of pairs of spaced conductive structures electrically connected in parallel with different gaps corresponding to different trigger voltages, according to embodiments.

Referring to FIGS. 9A and 10A, in various embodiments, the plurality of pairs of spaced conductive structures can be differently spaced pairs of spaced conductive structures having, wherein at least a subset of the pairs have different spacing between corresponding cathodes and anodes. The differently spaced pairs of spaced conductive structures can be described as having multiple sized gaps D1, D2, . . . and Dn therebetween, where n is the number of pairs.

In various other embodiments, the plurality of pairs of spaced conductive structures can have nominally the same spacing between corresponding cathodes and anodes.

Without subscribing to any scientific theory, as described supra, under some circumstances, the generation of electrons for causing the arcing between the cathode and the anode can depend on the electric field there between. As a result, the spacing between the cathode and the anode can be selected or configured to arc at different threshold or trigger voltages.

Accordingly, in some embodiments, the pairs of spaced conductive structures can advantageously include differently spaced pairs of spaced conductive structures. These embodiments can be advantageous in estimating the actual voltage of an ESD event. For example, after an ESD event, by identifying a pair of spaced conductive structures having the largest separation distance among arced pairs of spaced conductive structures, an overstress voltage associated with the EOS event can be estimated. The trigger voltage associated with each gap can be known in advance, and damage to the tips bordering one gap, without damage to another gap, can indicate an event between the threshold voltages of the two gaps.

However, embodiments are not so limited. In some other embodiments, the pairs of spaced conductive structures can advantageously have nominally the same spacing.

Referring again to FIG. 1D, the plurality of pairs of spaced conductive structures are formed by a cathode 136, which includes a plurality of cathode conductive structures $136_1$, $136_2$, $136_3$, and an anode 140, which includes a plurality of corresponding anode conductive structures $140_1$, $140_2$, $140_3$. In the illustrated embodiment, three pairs of spaced conductive structures formed by cathode conductive structures $136_1$, $136_2$, $136_3$ and anode conductive structures $140_1$, $140_2$, $140_3$ are illustrated. However, in various embodiments, the EOS monitor device 132 can include any suitable number of pairs of cathode conductive structures and anode conductive structures. The spark-gap device represented by conductive fingers $136_1$ and $140_1$ is shown as being damaged, indicating an EOS event exceeding the trigger voltage for the left-most spark-gap device, and also indicating that the EOS event was below the trigger voltages for the other two spark-gap devices represented by conductive finger pairs $136_2/140_2$ and $136_3/140_3$.

Figure 1E:
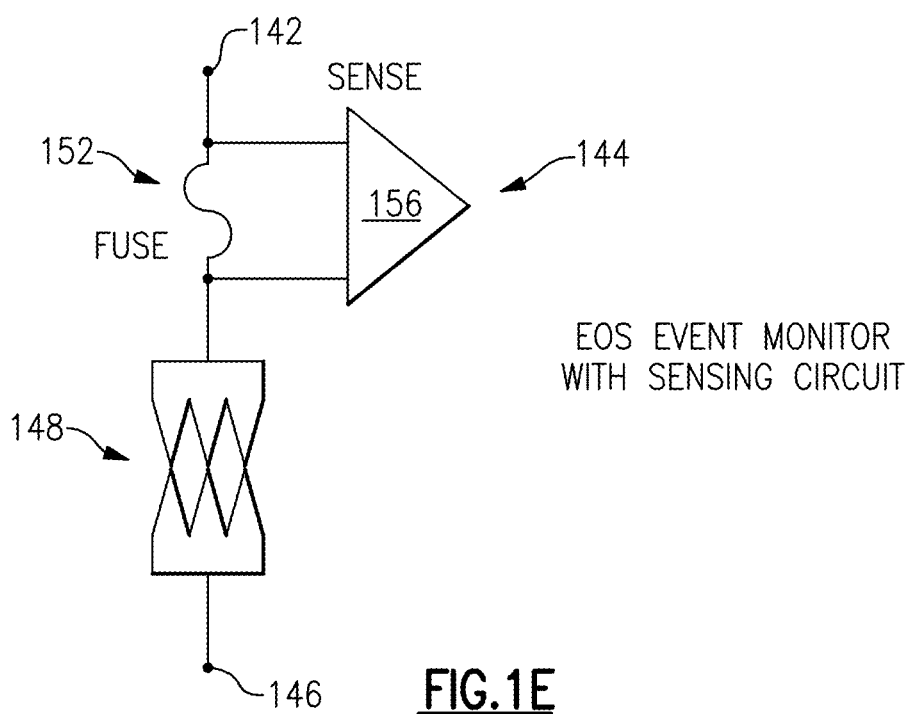
FIG. 1E is a schematic illustration of an EOS monitor device including a pair of spaced conductive structures electrically connected in series with a fuse, according to embodiments.

FIG. 1E is a schematic diagram of an EOS monitor device 144 including a first terminal 146, e.g., a high voltage terminal, and a second terminal 142, e.g., a low voltage terminal, according to some embodiments. Disposed between the first and second terminals 146, 148 is a spark-gap monitor device 148 including a plurality of pairs of spaced conductive structures electrically connected in series with a fuse 152, according to embodiments. The plurality of pairs 148 of spaced conductive structures are similar to those described above with respect to FIG. 1D. In some other embodiments, the first terminal 146 may be a low voltage terminal and the second terminal 148 may be a high voltage terminal.

Having the fuse 152 can be advantageous for several reasons. For example, the fuse 152 can be configured to estimate the current, speed and/or energy associated with the EOS event, according to various embodiments. In some embodiments, the fuse 152 can be rated based on a maximum current that the fuse can flow continuously without interrupting the circuit. Such embodiments can be advantageous when, in addition to the voltage of the EOS event which the spaced conductive structures 148 can be used to estimate, it is desirable to obtain the current generated by the EOS event. In some other embodiments, the fuse 152 can be rated based on the speed at which it blows, depending on how much current flows through it and the material of which the fuse is made. The operating time is not a fixed interval, but decreases as the current increases. Such an embodiment can be advantageous when, in addition to the voltage of the damaging EOS event, which the spaced conductive structures of the spark-gap monitor device 148 can be used to estimate, the current rating of the fuse 152 can be used to estimate the current of the EOS event, when it is desirable to obtain the duration of the EOS event. In some embodiments, the fuse 152 can be rated based on a maximum energy that the fuse can continuously conduct without interrupting the circuit. Such embodiments can be advantageous when, in addition to the voltage of the EOS event which the spaced conductive structures 148 can be used to estimate, it is desirable to obtain the energy generated by the EOS event. For example, the energy rating can be based on the value of $I^2t$, where I represents the current and t represents the duration of the EOS event. In various embodiments, Ft may be proportional to the energy associated melting the material of the fuse 152. Since the Ft rating of the fuse is proportional to the energy the fuse 152 consumes before melting, it can be a measure of the thermal damage that can be produced by the EOS event.

Still referring to FIG. 1E, the fuse 152 can additionally be advantageous for determining whether an EOS event had occurred by detecting an open circuit across the fuse 152 that is serially connected to the spark-gap monitor device 148 using, e.g., a sensing circuitry 144, which can include an operational amplifier 156.

Still referring to FIG. 1E, the fuse 152 can further be advantageous for shutting off the current flowing through the fuse 152 after an EOS event to prevent damage to other circuitry including the core circuit. This is because, once triggered, the spark-gap monitor device 148 may continue to pass high levels of current until the voltage across it falls below a holding voltage, as discussed infra, particularly where a power source is connected during the EOS event. By having a fuse 152 in series, the current flow thorough the conductive structures of the spark-gap monitor device 148 may be shut off upon exceeding a prescribed current, time and/or energy associated with the EOS event that is experienced by the spark-gap monitor device 148, thus limiting damage to the core circuits and other connected devices.

Figure 2A:
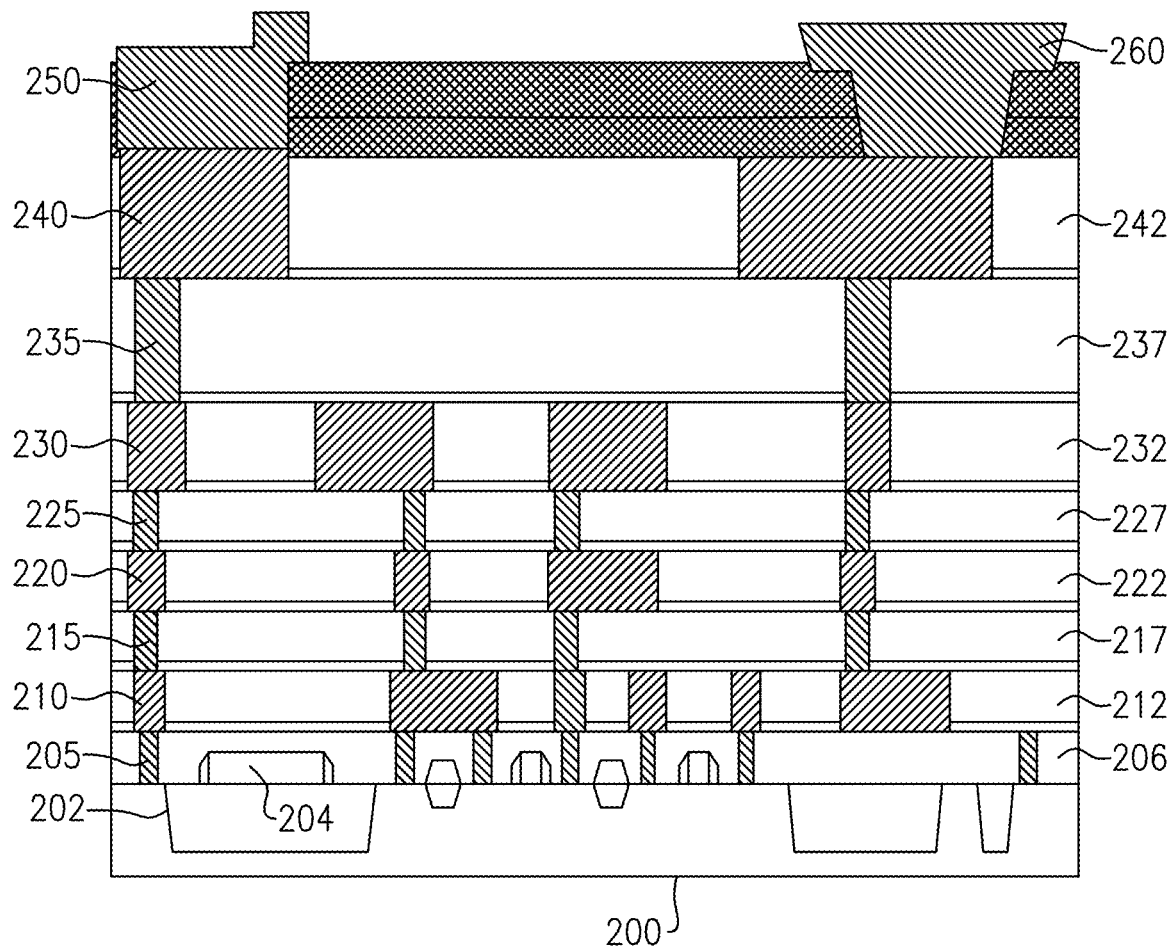
FIG. 2A is a schematic cross-sectional view of a semiconductor device having multiple levels of interconnect metallization, where one or more of the multiple levels can include an EOS monitor device, according to embodiments.

FIG. 2A is a schematic cross-sectional view of a semiconductor device including a substrate and multiple levels of interconnect metallization, where one or more of the multiple levels of interconnect metallization include an EOS monitor device, according to embodiments. The semiconductor device includes a spark-gap monitor device including pair of spaced conductive structures integrated with the substrate, where the spaced conductive structures are configured to electrically arc in response to an EOS event as described above with respect to FIGS. 1A-1D. The illustrated levels of interconnect metallization can be, e.g., Cu-based (either dual or single damascene process-based), Al-based (subtractive patterning-based) or based on other suitable metallization technology. The illustrated semiconductor device of FIG. 2A includes a semiconductor substrate 200 e.g., a silicon substrate. The semiconductor device includes one or more of various front-end structures including, e.g., and isolation regions 202, e.g., shallow trench isolation (STI) regions, wells, metal-oxide-semiconductor (MOS) transistors, bipolar junction transistors and PN junctions, to name a few. The semiconductor device additionally includes multilayer interconnect metallization structures including contacts 205 (Via 0), vias 215 (Via 1), 225 (Via 2) and 235 (Via 3). The semiconductor device additionally includes interconnect metallization levels 210 (Metal 1), 220 (Metal 2), 230 (Metal 3) and 240 (Metal 4), where Metal n and Metal n+1 are interconnected by Via n. One or more EOS monitor devices including a pair of spaced conductive structures can be formed in one or more of metallization levels 210, 220, 230 and 240. In addition, in some embodiments, fuses serially connected to the spaced conductive structures an also be formed in one or more of the same or different metallization levels 210, 220, 230 and 240. It will be understood, of course, that semiconductor devices can include additional metal levels, and that the spark-gap monitor devices can be formed at any suitable metal level in the back-end-of-line metallization layers of a semiconductor substrate. Furthermore, in other embodiments, the substrate may be a different material (e.g., glass) for a standalone EOS monitor die. Regardless of whether or not integrated with other devices, and whether or not formed on a semiconductor substrate, semiconductor fabrication techniques, such as photolithography and etching, can be used to define the spaced conductive structures, such as fingers, of spark-gap devices. The fabrication can be performed at the wafer level with subsequent dicing, regardless of whether the spark-gap device(s) are formed in a standalone monitor die or integrated with semiconductor device circuits.

Still referring to FIG. 2A, each of metallizations (Metal 1 to Metal 4) or vias (Vias 0 to Via 3) are formed, or buried, in one or more dielectric layers. In the present disclosure, dielectrics between two adjacent metal levels are referred to as inter-layer dielectrics (ILD), while dielectrics embedding a metal interconnect layer are referred to as intra-metal dielectrics (IMD). As shown in FIG. 2A, dielectric layers 217, 227, and 237 are ILD layers, while dielectric layers 212, 222, 232 and 242 are IMD layers. The semiconductor device additionally includes dielectric layers 206 (ILD 0), 212 (IMD 1), 217 (ILD 1), 222 (IMD 2), 227 (ILD 2), 232 (IMD 3), 237 (ILD 3) and 242 (IMD 4). The semiconductor device can additionally include atop the interconnect metallization levels a passivation layer including wire bond 250 and metal bump 260, which can be used, e.g., in flip chip packaging. For illustrative purposes, the interconnect metallization process architecture of FIG. 2A has four levels of metal, namely Metal 1 (210), Metal 2 (220), Metal 3 (230) and Metal 4 (240). However, embodiments are not so limited, and the interconnect metallization process architecture according to various embodiments can include more (five or more) or less (3 or less) metal levels. In the illustrated multi-level metal interconnect process architecture, alternating levels of metallization can run orthogonal to the levels above and below to minimize inter-level interference. In addition, the pitch of each interconnect metallization level can be higher compared to a lower interconnect metallization level. The semiconductor device can further include, at the top, I/O outputs passivated through, e.g., Al wire bonds (e.g., wire bond 250) or solder balls (e.g., metal bump 260), according to embodiments.

Still referring to FIG. 2A, each of the metallization levels and vias can be formed of any suitable metal described supra. According to various embodiments, the pair of spaced conductive metal structures can be formed in any of the metal levels 1 to n and can have a thickness from 0.1 µm to 10 µm, 0.1 µm to 5 µmm, 0.1 µm to 1 µmm, 0.1 µm to 0.5 µm, 0.5 µm to 1 µmm, or any range defined by these values.

Each of IMD and ILD layers can be formed of a suitable dielectric material, e.g., silicon dioxide or silicon nitride, according to some embodiments. According to some other embodiments, the IMD and ILD layers can be formed of a suitable low-k material, e.g., fluorine-doped silicon dioxide, carbon-doped silicon dioxide, porous silicon dioxide, porous carbon-doped silicon dioxide, spin-on organic polymeric dielectric material and spin-on silicon-based polymeric dielectric material, to name a few.

Figure 2B:
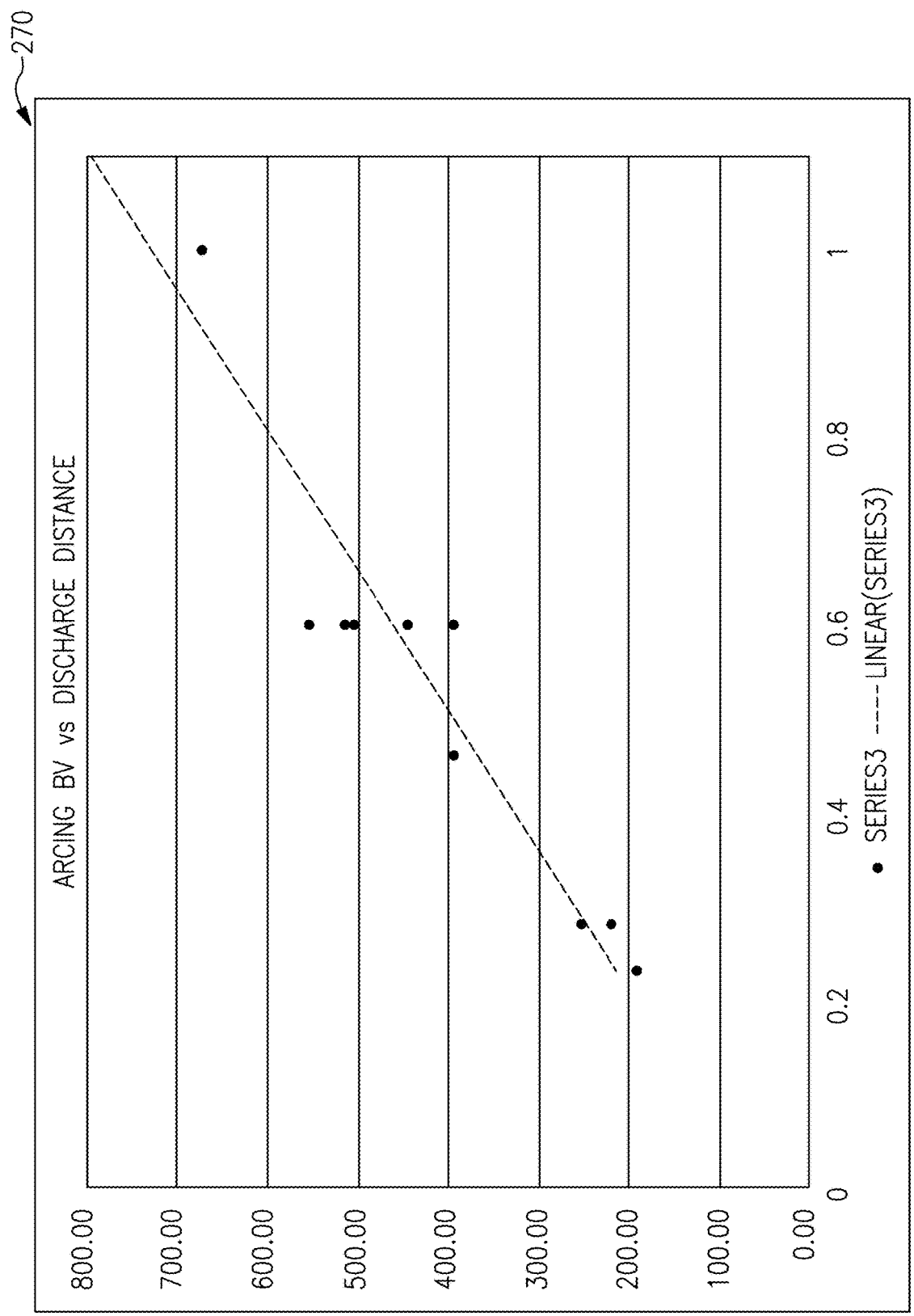
FIG. 2B is a graph illustrating an experimentally observed correlation between arcing voltages and spacing of conductive structures formed at various metallization levels, according to embodiments.

FIG. 2B is a graph 270 illustrating experimentally observed correlation between arcing voltages and spacings of EOS monitor devices each including a pair of spaced conductive structures formed at various metallization levels including metallization levels 1 through 5, according to embodiments. The graph plots arcing voltages in volts (y-axis) of various spaced conductive structures similar to those described above with respect to FIGS. 1A-1E, as a function of the spacing in microns (x-axis) between the cathode and the anode. As discussed supra, a generally linear relationship can be observed between the arcing voltages and the spacing between the cathode and the anode. Additional experimentally observed correlation is further illustrated with respect to FIG. 13.

Figure 3:
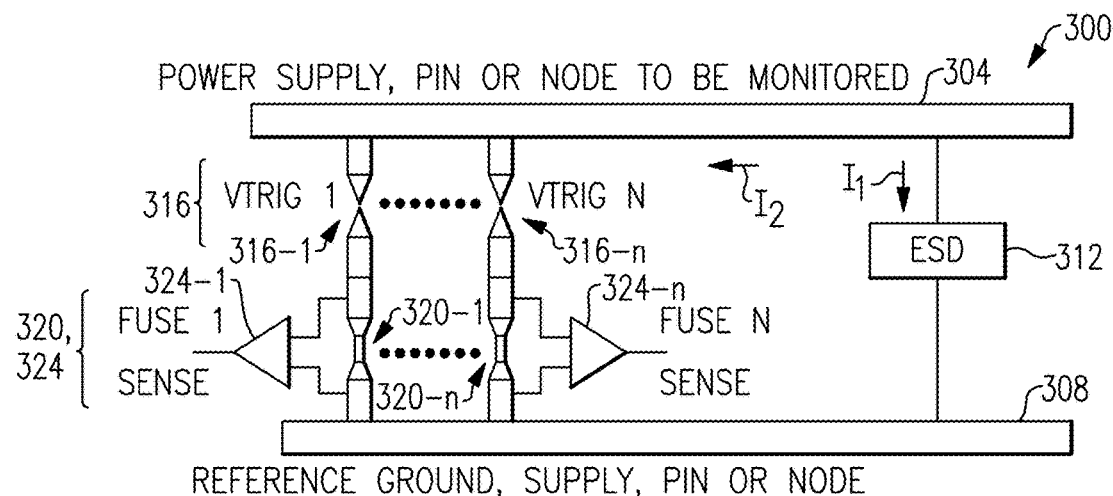
FIGS. 3 and 4 are schematic diagrams of EOS monitor devices including a plurality of pairs of spaced conductive structures configured to monitor voltage and/or energy associated with EOS events, according to embodiments.

FIG. 3 is a schematic diagram of an EOS monitor device 300 including a plurality of differently spaced pairs of conductive structures 316 configured to monitor voltage and/or energy associated with an EOS event, according to embodiments. The plurality of differently spaced pairs of conductive structures 316 includes pairs 316-1, 316-2, . . . 316-n of conductive structures each having a different gap therebetween, where the differently spaced pairs 316-1, 316-2, . . . 316-n of conductive structures are electrically connected in parallel and configured to electrically arc in response to different electrical overstress voltages $V_{TR1}$, $V_{TR2}$, . . . $V_{TRn}$, respectively. The plurality of differently spaced pairs of conductive structures 316 are connected between a voltage high supply, a voltage high pin or a voltage high node 304 at one end and a plurality of fuses 320 and a plurality of sense circuits 324 at the other end. The plurality of fuses 320 are connected to the plurality of differently spaced pairs of conductive structure 316 at one end and a voltage low supply, a voltage low pin or a voltage low node 308 at the other end. The plurality of fuses 320 includes fuses 320-1, 320-2, . . . 320-n serially connected to the differently spaced pairs 316-1, 316-2, . . . 316-n of conductive structures. The fuses 320-1, 320-2, . . . 320-n are configured to blow in response to different levels current, different durations and/or different energies, as described above with respect to FIG. 1E. The fuses 320-1, 320-2, . . . 320-n are connected to and configured to be sensed by sense circuits 324-1, 324-2, . . . 324-n.

Still referring to FIG. 3, the EOS monitor device 300 additionally includes an EOS protection device, labeled as ESD device 312, which can be a semiconductor-based EOS protection device, electrically connected in parallel to the plurality of differently spaced pairs of conductive structures 316 and the plurality of fuses 320. The EOS monitor device 300 is electrically connected to a core circuit (not shown).

In operation, in response to an EOS event, the ESD device 312 is triggered at a ESD trigger voltage $V_{TR\_ESD}$, followed by the plurality of spaced conductive structures 316 at $V_{TR1}$, $V_{TR2}$, . . . $V_{TRn}$ each lower than the $V_{TR\_ESD}$. Upon triggering, the ESD device 312 connected to the core circuit is configured to draw a majority current I1 resulting from an EOS overstress event, while the pairs of differently spaced conductive structures 316 connected to the core circuit is configured to draw a minority current I2 resulting from the EOS overstress event. In various embodiments, the EOS monitor device 300 can be configured such that I2 is 50% of I1 or less, 10% or less of I1, or 2% or less of I1, according to embodiments, such that the plurality of differently spaced conductive structures 316 is configured to serve primarily as a monitoring device to monitor voltage and/or energy associated with the EOS overstress event without drawing a relatively high level of current relative to the ESD device 312. Nevertheless, the fuses 324 protect against excessive current flow, particularly for applications where the EOS event may occur while connected to a power supply.

Figure 4:
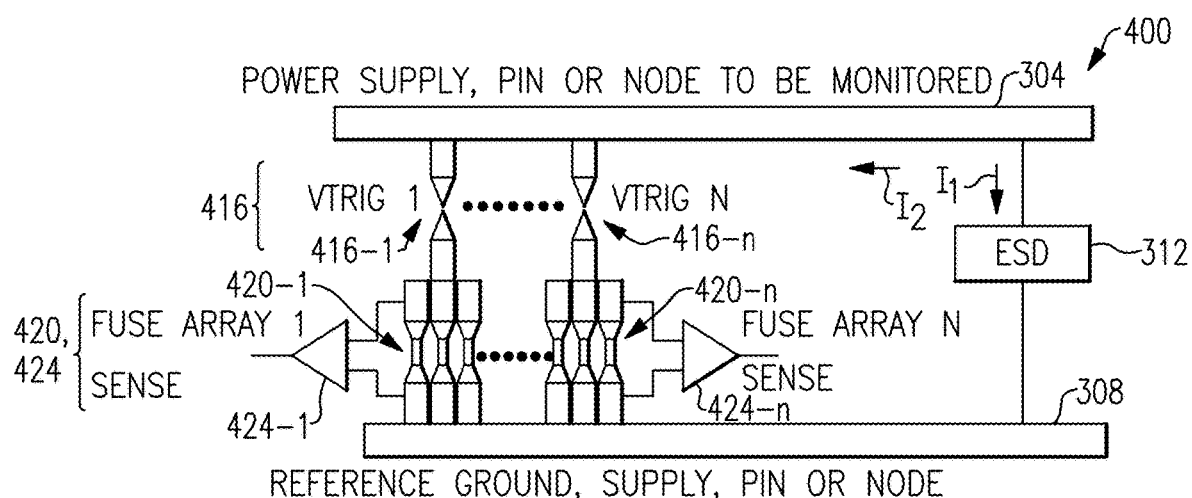

FIG. 4 is a schematic diagram of an EOS monitor device 400 including a plurality of differently spaced pairs of conductive structures 416 configured to monitor voltage and/or energy associated with an EOS event, according to embodiments. The EOS monitor device 400 is configured similarly in some respects to the EOS monitor device 300 described above with respect to FIG. 3, whose similarities will not be described in detail. In the EOS monitor device 400, a plurality of differently spaced pairs of conductive structures 416 are connected between a voltage high supply, a voltage high pin or a voltage high node 304 at one end and a plurality of fuses 420 and a plurality of sense circuits 424 at the other end. The plurality of fuses 320 are connected to the plurality of differently spaced conductive structure 416 at one end and a voltage low supply, a voltage low pin or a voltage low node 308 at the other end. Unlike the EOS monitor device 300 described above with respect to FIG. 3, however, each of the fuses 420-1, 420-2, . . . 420-n serially connected to the differently spaced pairs 416-1, 416-2, . . . 416-n of conductive structures in turn includes a plurality of fuse elements. The fuses 420-1, 420-2, . . . 420-n are configured to blow in response to different levels of current, different durations and/or different energies, as described above with respect to FIG. 1E. In addition, each of the parallel fuse elements of each of fuses 420-1, 420-2, . . . 420-n are in turn configured to blow in response to different levels current, different durations and/or different energies, as described above with respect to FIG. 1E.

Thus, the EOS monitor devices 300 (FIG. 3) and 400 (FIG. 4) comprise pairs of conductive structures that have different gaps and configured to arc in response to overstress voltages that are related, e.g., linearly related to the different gaps, such that, in response to an EOS event, a voltage associated with the EOS event can be estimated. For example, the voltage can be estimated by identifying a pair of spaced conductive structures having the largest separation distance among arced pairs of spaced conductive structures, and estimating therefrom a maximum voltage associated with the EOS event.

In addition, the EOS monitor devices 300 (FIG. 3) and 400 (FIG. 4) comprise one or more different fuses serially connected to different pairs of conductive structures having different gaps such that, in response to an EOS event, an energy associated with the EOS event can be estimated. For example, the energy can be estimated by, for a given pair of arced conductive structure, identifying the energy rating of the blown fuse (FIG. 3) or identifying the energy rating of a fuse having the largest energy rating among blown fuses (FIG. 4) (assuming that still higher energy rated fuses remain unblown), and estimating therefrom the energy associated with the EOS event.

Figure 5A:
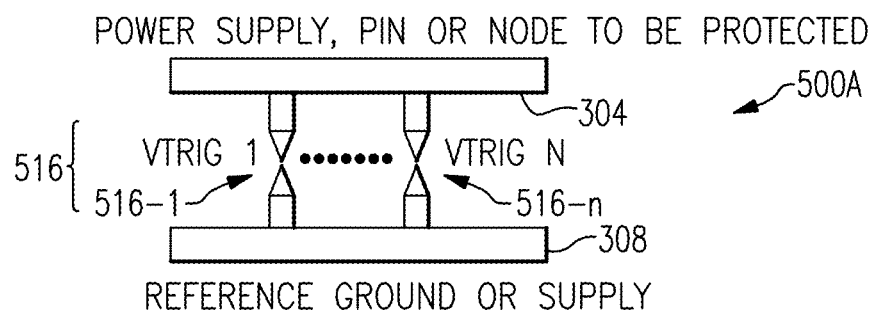
FIGS. 5A and 5B are schematic diagrams EOS protection devices including a plurality of pairs of spaced conductive structures configured to serve as electrostatic discharge (ESD) devices to protect a core device against an EOS event, according to embodiments.

FIG. 5A is a schematic diagram of an EOS protection device 500A including a plurality of pairs of differently spaced conductive structures 516 configured as EOS protection devices to protect a core device against an EOS event, according to embodiments. Unlike the EOS monitor devices illustrated with respect to FIGS. 3 and 4, the EOS protection device 500A may not include one or more fuses. The EOS protection device 500A includes a plurality of differently spaced pairs of conductive structures 516 which includes pairs 516-1, 516-2, . . . 516-n of differently spaced conductive structures each having a different gap therebetween, where the differently spaced pairs 516-1, 516-2, . . . 516-n of conductive structures are electrically connected in parallel and configured to electrically arc in response to different electrical overstress voltages $V_{TR1}$, $V_{TR2}$, . . . $V_{TRn}$, respectively. The plurality of differently spaced pairs of conductive structures 516 are connected between a voltage high supply, a voltage high pin or a voltage high node 304 at one end and a voltage low supply, a voltage low pin or a voltage low node 308 at the other end.

In operation, the EOS protection device 500A is configured as both a protection and a monitor device, and the pairs of differently spaced conductive structures 516 connected to the core circuit are configured to draw a majority or substantially all of the current resulting from the EOS overstress event and steer it to the ground, voltage low supply, a voltage low pin or a voltage low node 308.

Figure 5B:
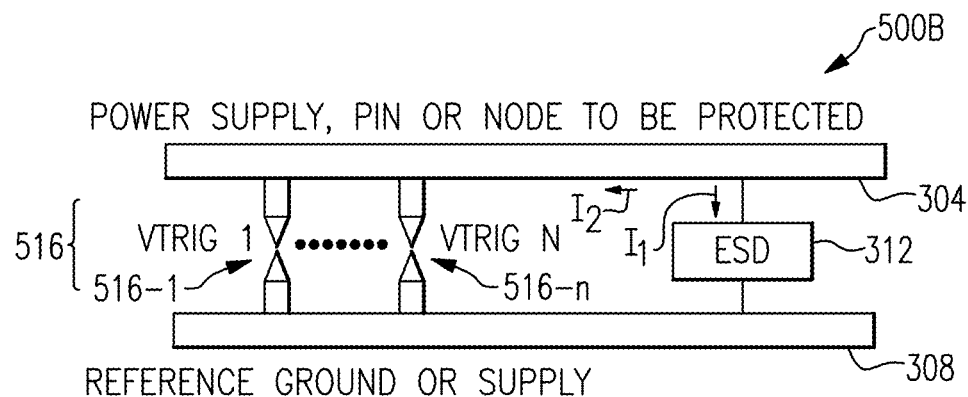

FIG. 5B is a schematic diagram of an EOS protection device 500B including a plurality of differently spaced pairs of conductive structures 516 configured as EOS monitor devices to allow determination of a maximum level of voltage for one or more EOS events, according to embodiments.

Unlike the EOS protection device 500A described above with respect to FIG. 5A, the EOS monitor device 500B additionally includes an EOS protection device, labeled as an ESD device 312, which can be a semiconductor-based ESD device, electrically connected in parallel to the plurality of differently spaced conductive structures 516. The EOS monitor device 500B is electrically connected to a core circuit (not shown). Having the EOS protection device 500A in addition to the ESD device 312 can be advantageous where the ESD device 312 itself can be damaged under high current.

In operation, in response to an EOS event, the ESD device 312 is triggered at a ESD trigger voltage $V_{TR\_ESD}$, followed by the plurality of spaced conductive structures 516 at $V_{TR1}$, $V_{TR2}$, . . . $V_{TRn}$ each lower than the $V_{TR\_ESD}$, in a similar manner described above with respect to FIG. 3. Upon triggering, the EOS protection device 500B is configured as a protection device and the pairs of differently spaced conductive structures 516 connected to the core circuit are configured to draw a majority or substantially all of the current resulting from the EOS overstress event and steer it to the voltage low supply, a voltage low pin or a voltage low node 308. The ESD device 312 connected to the core circuit can be configured to draw a minority current I1 resulting from an EOS overstress event, while the pairs of differently spaced conductive structures 316 connected to the core circuit are configured to draw a majority current I2 resulting from the EOS overstress event. In various embodiments, the EOS monitor device 300 can be configured such that I2 is 50% of I1 or more, 90% or more of I1, or 98% or more of I1, according to embodiments, such that the plurality of differently spaced conductive structures 516 are configured to serve primarily as an EOS protection device to protect the core circuit.

It will be appreciated that, while in FIGS. 5A and 5B, for clarity, the illustrated EOS protection devices 500A and 500B include the pairs of spaced conductive structures 516-1, . . . , 516-n each of which are connected directly between a voltage high node 304 and a voltage low node 308, in various implementations, each of the spaced conductive structures 516 may be connected, e.g., serially connected, to a sensing element, e.g., a serially connected fuse or a serially connected resistor, for detecting whether the spaced conductive structures have been triggered in response to an electrical overstress event. These configurations are further illustrated elsewhere in the specification, e.g., with respect to FIGS. 7A and 7B.

Figure 6:
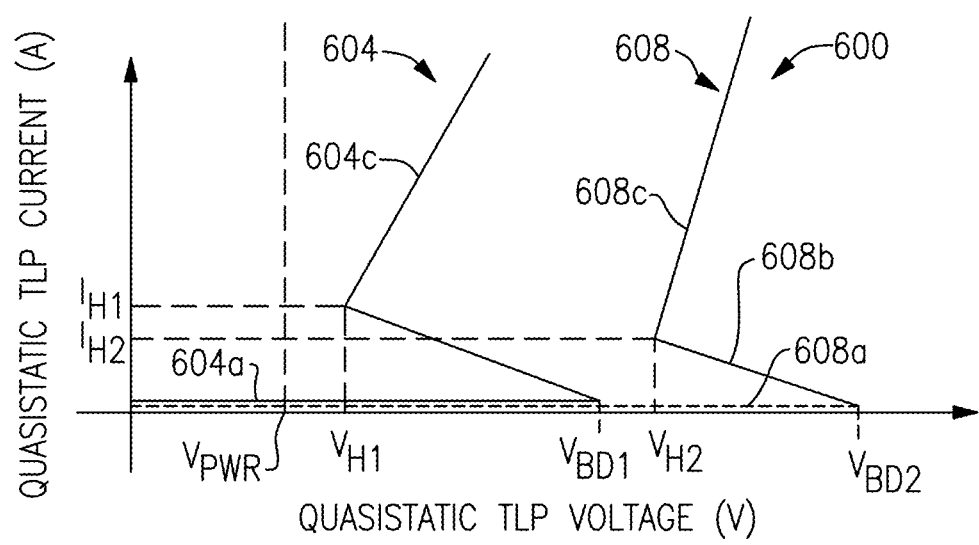
FIG. 6 illustrates schematic quasistatic current-voltage curves of a pair of spaced conductive structures and an ESD device, according to embodiments.

FIG. 6 is a graph 600 illustrating schematic quasistatic current-voltage (IV) curves 604, 608 of a pair of spaced conductive structures and an EOS protection device, respectively, according to embodiments. The IV curve 604 schematically illustrates a quasistatic response of the pair of spaced conductive structures (e.g., 516 in FIG. 5B) to an EOS event, and the curve 608 schematically illustrates a quasistatic response of an EOS protection device (e.g., 312 in FIG. 5B) to the EOS event. The x-axis and the y-axis represent the quasistatic voltage and the corresponding current, respectively. The IV curves 604 and 608 have respective blocking regions ("OFF" regions) 604a and 608a, respectively characterized by very high impedances, between the origin and respective breakdown voltages $V_{BD1}$ and $V_{BD2}$. $V_{BD1}$ may correspond to a triggering voltage ($V_{TR}$) of the pair of spaced conductive structures and $V_{BD2}$ may correspond to a triggering voltage ($V_{TR}$) or a threshold voltage ($V_{TH}$) of a BJT or an avalanche diode of the ESD device. When the voltage of the EOS event exceeds $V_{BD2}$, dV/dI becomes zero and switching of the EOS protection device occurs. The switching of the EOS protection device is followed by switching of the pair of spaced conductive structures when the voltage across the spaced conductive structures exceeds $V_{BD2}$, upon which dV/dI becomes zero and switching of the pair of spaced conductive structures occurs. The blocking regions 604a and 608a are followed by respective negative resistance regions 604b and 608b (also referred to as "snap-back region") between $V_{BD1}$ and a first hold voltage $V_{H1}$ and between $V_{BD2}$ and a second hold voltage $V_{H2}$, respectively, followed by respective positive resistance regions ("ON" regions) 604c and 608c. At the hold voltages $V_{H1}$ and $V_{H2}$, the corresponding holding current values are $I_{H1}$ and $I_{H2}$, respectively, which can represent minimum level of currents that can maintain the "ON" states of the respective devices. According to embodiments, the pair of spaced conductive structures and the EOS protection device are configured such that, under quasistatic conditions or in response to a voltage signal having a relatively long duration (e.g., longer than about 100 ns or longer than about 1 μms), the $V_{BD1}$ of the spaced conductive structures is lower than the $V_{BD2}$ and $V_{H2}$ of the EOS protection device, such that the pair of spaced conductive structures is triggered while the EOS protection device remains conducting after being switched to a low impedance state in response to an EOS event. It will be appreciated that when the $V_{BD1}$ of the spaced conductive structures is higher than the $V_{BD2}$ and $V_{H2}$ of the EOS protection device, the pair of spaced conductive structures may not trigger.

It will be appreciated that, under operational conditions in which the core circuit is powered up, once activated, the pair of spaced conductive structures may continue to conduct high levels of current even after the EOS event has ceased, if the voltage high supply voltage 304 (FIGS. 3-5B) is at a higher voltage relative to the hold voltage $V_{H1}$ of the pair of spaced conductive structures. Thus, still referring to FIG. 6, in various embodiments, it can be desirable to have the EOS monitor devices configured such that its hold voltage is greater than the voltage high supply voltage $V_{PWR}$. In the following, with respect to FIGS. 7A-8B, embodiments of EOS monitor devices and EOS protection devices having hold voltages higher than the $V_{PWR}$ are described.

Figure 7A:
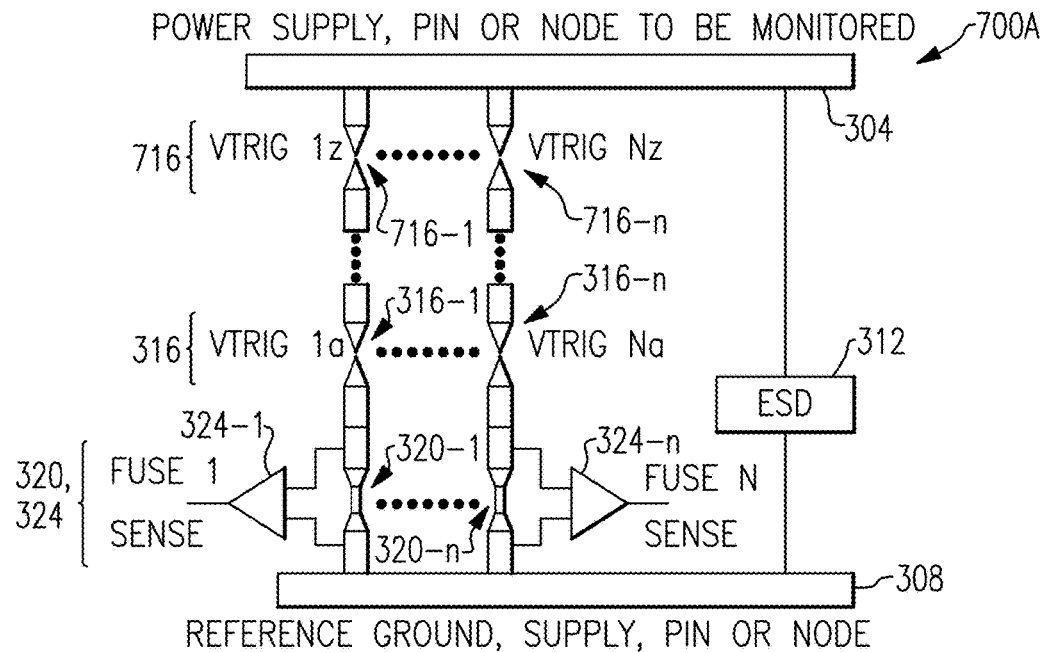
FIGS. 7A and 7B are schematic diagrams of EOS monitor devices including a plurality of serially connected pairs of spaced conductive structures configured to monitor voltage and/or energy associated with an EOS event, according to embodiments.

FIG. 7A is a schematic diagram of an EOS monitor device 700A including a plurality of serially connected pairs of spaced conductive structures configured to monitor voltage and/or energy associated with an EOS event, according to embodiments. The EOS monitor device 700A is configured similarly to the EOS monitor device 300 described supra with respect to FIG. 3, except the EOS monitor device 700A additionally includes a second through zth plurality of differently spaced pairs of conductive structures 716, wherein each includes differently spaced pairs 716-1, 716-2, . . . 716-n of conductive structures each having a different gap therebetween. Each of differently spaced pairs 716-1, 716-2, . . . 716-n of conductive structures is connected to the voltage high supply 304 on one end and serially connected to a corresponding one of differently spaced pairs 316-1, 316-2, . . . 316-n of conductive structures each having a different gap therebetween. Each serially connected the pairs, e.g., 716-1/316-1, 716-2/316-2, . . . and 716-n/316-n, are in turn electrically connected in parallel to result in a net hold voltage that is greater than each pair of conductive structures alone. Thus, each serially connected pair, e.g., 716-1/316-1, 716-2/316-2, . . . or 716-n/316-n is configured to electrically arc in response to different electrical overstress voltages $V_{TR1}$, $V_{TR2}$, . . . $V_{TRn}$, respectively.

Figure 7B:
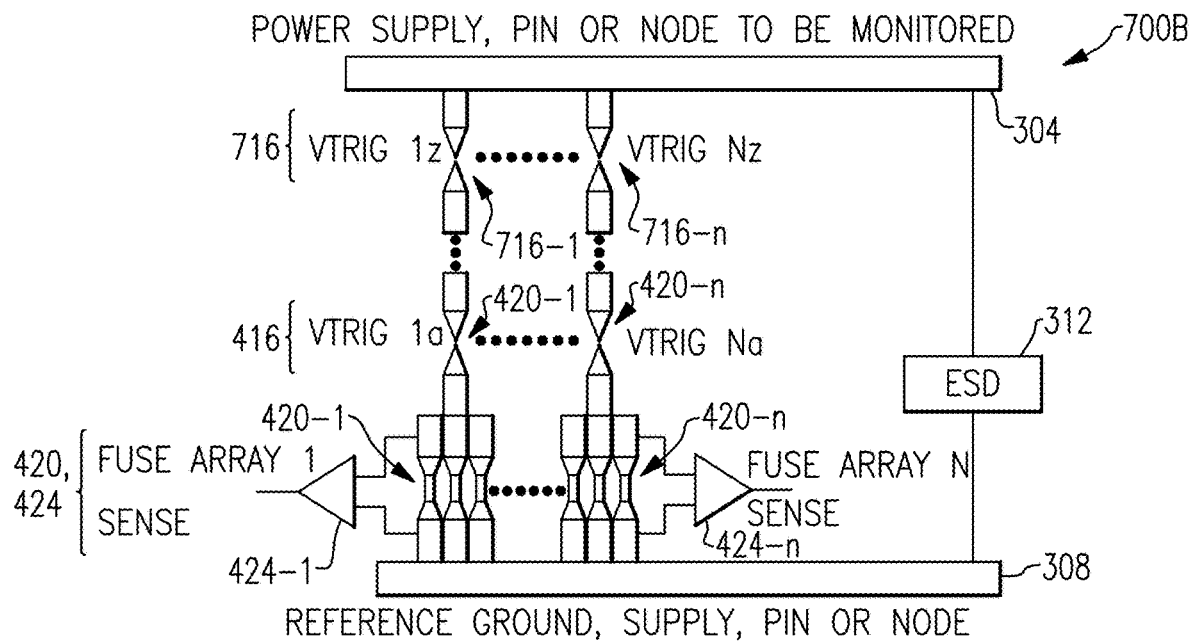

FIG. 7B is a schematic diagrams of an EOS monitor device including a plurality of serially connected pairs of spaced conductive structures configured to monitor voltage and/or energy associated with an EOS event, according to embodiments. The EOS monitor device 700B is configured similarly to the EOS monitor device 400 described supra with respect to FIG. 4, except the EOS monitor device 700A additionally includes a second through zth plurality of differently spaced pairs of conductive structures 716, wherein each including differently spaced pairs 716-1, 716-2, . . . 716-n of conductive structures each having a different gap therebetween. In an analogous manner as described above with respect to the EOS monitor device 700A of FIG. 7A, the serially connected pairs, e.g., 716-1/416-1, 716-2/416-2, . . . and 716-n/416-n, are in turn electrically connected in parallel to result in a net hold voltage that is greater than each pair of conductive structures alone. Thus, each serially connected pair, e.g., 716-1/416-1, 716-2/416-2, . . . or 716-n/416-n is configured to electrically arc in response to a different electrical overstress voltage $V_{TR1}$, $V_{TR2}$, . . . $V_{TRn}$, respectively.

Figure 8A:
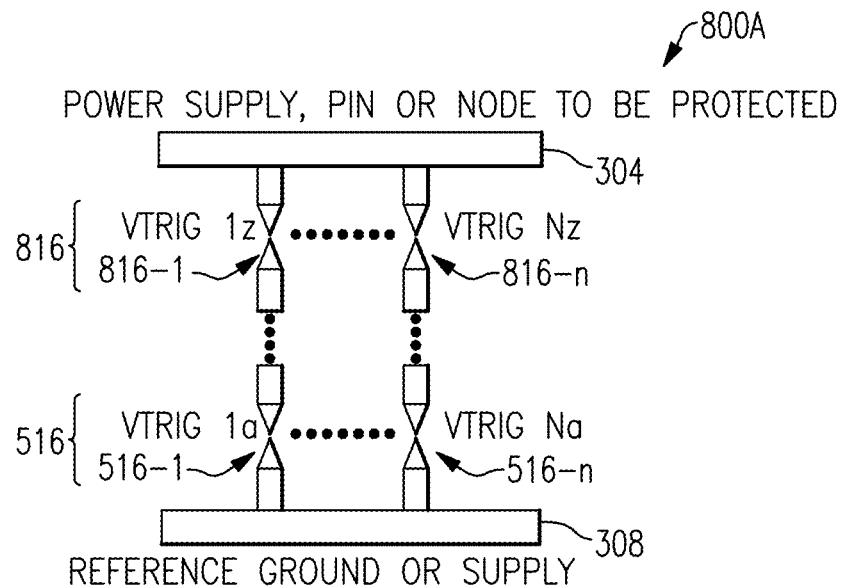
FIG. 8A is a schematic diagram of an EOS protection and monitoring arrangement including a plurality of serially connected pairs of spaced conductive structures configured as electrostatic discharge (ESD) devices to protect a core device against an EOS event, according to embodiments.
Figure 8B:
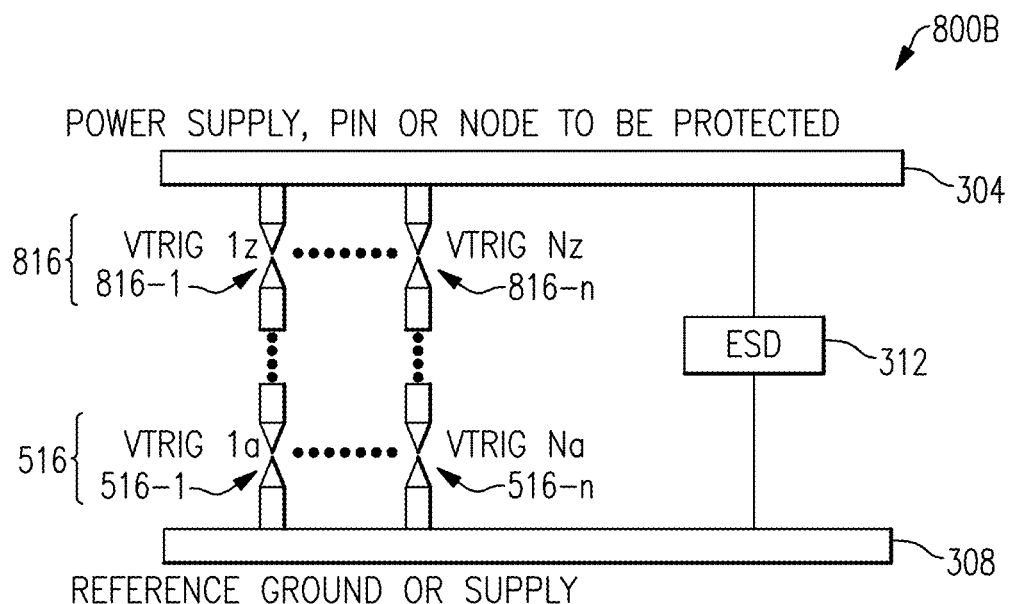
FIG. 8B is a schematic diagram of an EOS protection and monitoring arrangement including a plurality of serially connected pairs of spaced conductive structures configured to monitor EOS events and a separate electrostatic discharge (ESD) device configured to protect a core device against an EOS event, according to embodiments.

FIGS. 8A and 8B are schematic diagrams EOS protection devices 800A and 800B, respectively, each including a plurality of serially connected pairs of spaced conductive structures configured as EOS protection devices to protect a core device against an EOS event, according to embodiments. Each of EOS protection devices 800A and 800B is configured similarly to the EOS monitor devices 500A (FIG. 5A) and 500B (FIG. 5B) described supra, respectively, except each of the EOS protection devices 800A and 800B additionally include a second through zth plurality of differently spaced pairs of conductive structures 816, each of which includes differently spaced pairs 816-1, 816-2, . . . 816-n of conductive structures each having a different gap therebetween. In an analogous manner as described above with respect to the EOS monitor devices 700A and 700B of FIGS. 7A and 7B, respectively, each serially connected the pairs, e.g., 816-1/516-1, 616-2/616-2, . . . and 816-n/516-n, are in turn electrically connected in parallel to result in a net hold voltage that is greater than each pair of conductive structures alone. Thus, each serially connected pair, e.g., 816-1/516-1, 816-2/516-2, . . . or 816-n/616-n is configured to electrically arc in response to a different electrical overstress voltages $V_{TR1}$, $V_{TR2}$, . . . $V_{TRn}$, respectively.

Thus, referring back to FIG. 6, by including a plurality of serially connected pairs of spaced conductive structures, embodiments of EOS monitor devices and ESD devices have hold voltages higher than the $V_{PWR}$ supplied to the core circuit, such that conduction through the serially connected pairs of spaced conductive structures cease when the ESD event ceases, thereby preventing excessive post ESD event leakage and/or damage to the core circuit.

FIG. 9A is a schematic top-down view of a plurality of pairs 900 of differently spaced conductive structures electrically connected in parallel, according to embodiments. In the illustrated embodiment, the plurality of pairs 900 has n number of pairs 900-1, 900-2, . . . and 900-n of spaced conductive structures comprising fingers in the shape of protrusions having sharpened tips. The number n can be any suitable number ranging from 1 to 100, 2 to 10, for instance 5. Each protrusion can be described as having a width 912, a tab (T) 904 and a chamfer (C) 908, and the pairs 900-1, 900-2, . . . and 900-n of protrusions can be described as having gaps D1, D2, . . . and Dn therebetween, respectively. One quantitative implementation has the following parameters:

Nominal arcing voltage=800V/μm
Tab T=20 μm for 10A
Variable Chamfer C=2.5 um, 5 um, 20 um, 40 um, 100 um for D=0.15 um
C=10 μm for 5-finger structures
Metallization levels: Met5, Met4, with 1 default structure in Met3/2/1
D=0.075 μm for arcing voltage of 60V
D=0.1 μm for arcing voltage of 80V
D=0.125 μm for arcing voltage of 100V
D=0.15 μm arcing voltage of 120V (Default)
D=0.175 μm for arcing voltage of 140V
D=0.2 μm for arcing voltage of 160V
D=0.28 μm for arcing voltage of 224V (220V measured)
Metallization thickness=0.53 μm for Met 1-Met 4; 0.95 to 0.99 μm for Met 5.

Figure 9B:
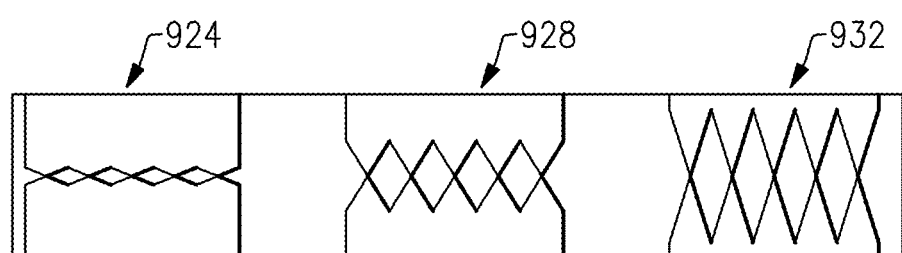
FIG. 9B are schematic top-down views of lithographically patterned, deposited metal layers, showing different configurations of pairs of spaced conductive structures electrically connected in parallel, according to embodiments.

FIG. 9B are schematic top-down views of patterned metal layers 924, 928 and 932 showing different configurations of pairs of spaced conductive structures having sharpened tips electrically connected in parallel, according to embodiments. The patterns can be defined photolithographically using semiconductor fabrication technology. According to embodiments, the sharpened tips can have a tip or an apex formed by two sides forming an angle of 10 to 170 degrees, 10 to 50 degrees, 50 to 90 degrees, 90 to 130 degrees, 130 to 170 degrees, or any angle between these values.

FIG. 10A is a schematic top-down view of a plurality of pairs 1000 of spaced conductive structures electrically connected in parallel, according to embodiments. In the illustrated embodiment, the plurality of pairs 1000 has n number of pairs 1000-1, 1000-2, . . . and 1000-n of spaced conductive structures comprising fingers in the shape of protrusions having blunt or rounded tips. The number n can be any suitable number ranging from 1 to 100, 2 to 10, for instance 5. Each protrusion can be described as having a width 1012, a tab (T)1004 and a chamfer (C) 1008, and the pairs 1000-1, 1000-2, . . . and 1000-n of protrusions can be described as having gaps D1, D2, . . . and Dn therebetween, respectively. One quantitative implementation has the following parameters:

Nominal arcing voltage=800V/μm
Tab T=20 μm for 10A, C=T/2
Default is 5× finger structure
Metallization levels: Met5, Met4, with 1 default structure in Met3/2/1
D=0.075 μm for arcing voltage of 60V
D=0.1 μm for arcing voltage of 80V
D=0.125 μm for arcing voltage of 100V
D=0.15 μm for arcing voltage of 120V (Default)
D=0.175 μm for arcing voltage of 140V
D=0.2 μm for arcing voltage of 160V
D=0.28 μm for arcing voltage of 224V calculated (220V measured)
Variable Chamfer C for D=0.15 μm
T=5 μm, 10 μm, 40 m Metallization thickness=0.53 μm for Met 1-Met 4; 0.95 to 0.99 μm for Met 5.

Figure 10B:
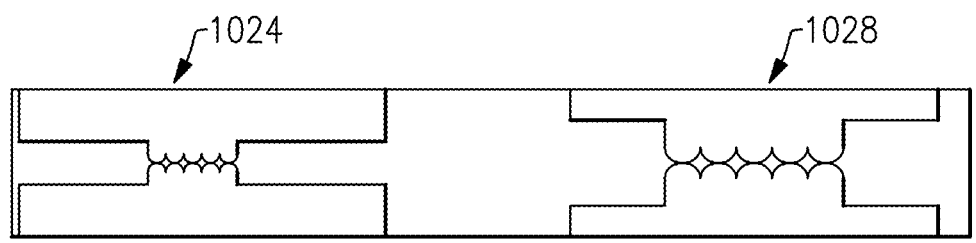
FIG. 10B are schematic top-down views of lithographically patterned, deposited metal layers, showing different configurations of pairs of spaced conductive structures electrically connected in parallel, according to embodiments.

FIG. 10B are schematic top-down views of patterned metal layers 924, 928 and 932 showing different configurations of pairs of spaced conductive structures having rounded tips electrically connected in parallel, according to embodiments. The patterns can be defined photolithographically using semiconductor fabrication technology.

Figure 11:
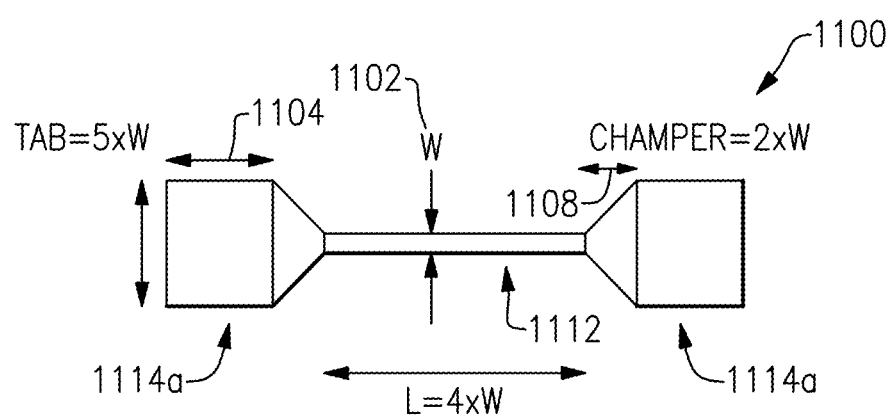
FIG. 11 is a schematic top-down view of a fuse that can be connected in series with spark-gap devices, according to embodiments.

FIG. 11 is a schematic top-down view of a fuse 1100, according to embodiments. In the illustrated embodiment, the fuse has two end portions 1114a, 1114b connected by a connecting portion 1102. The end portions of the fuse 1114a/1114b can be described as having a width 1112, a tab (T) 1104 and a chamfer (C) 1108, and the connecting portion can as a width 1102. One quantitative implementation has the following parameters:

Met1 to Met4 transient current density=0.45 A/μm
Met5 transient current density=0.9 A/μm
Met5 W=2 μm for current of 2 A
Met5 W=5 μm for current 5 A
Met5 W=10 μm for current 10 A
Met3 W=4 μm for current 2 A
Met3 W=10 μm for current 5 A
Met3 W=20 μm for current 10 A
Met1 W=4 μm for current 2 A
Met1 W=10 μm for current 5 A
Met1 W=20 μm for current 10 A
Chamfered connection
L=50 μm
Metallization thickness=0.53 μm for Met 1-Met 4; 0.95 to 0.99 μm for Met 5

Figure 12:
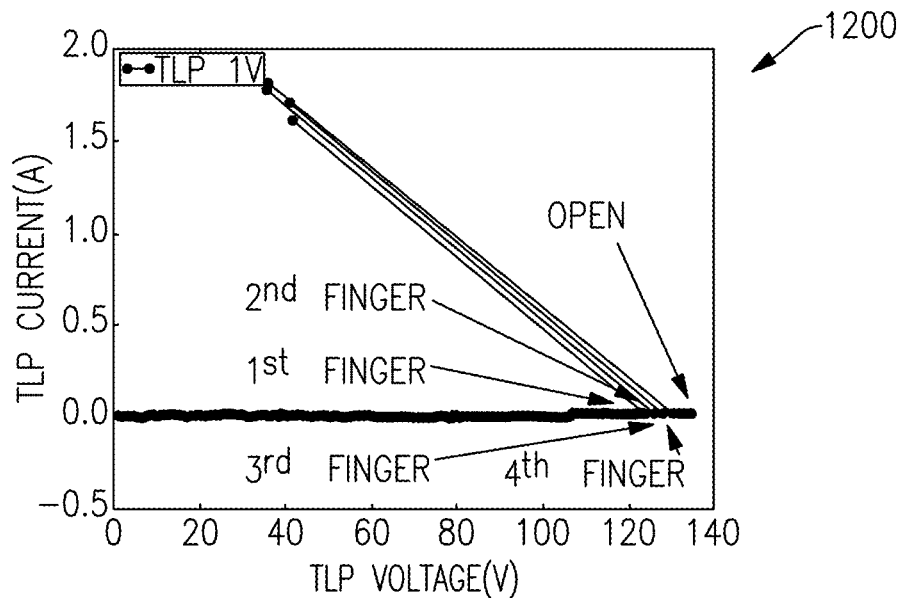
FIG. 12 illustrates experimental current-voltage curves measured on an electrical overstress (EOS) monitor device including a plurality of pairs of spaced conductive electrically connected in parallel, according to embodiments.

FIG. 12 is a graph 1200 illustrating experimental current-voltage (IV) curves measured on an electrical overstress (EOS) monitor device including a plurality of pairs of spaced conductive electrically connected in parallel, according to embodiments. In particular, the IV curves are those of an EOS monitor device having five pairs of differently spaced conductive structures electrically connected in parallel, similar to those described above with respect to FIG. 9B.

Figure 13:
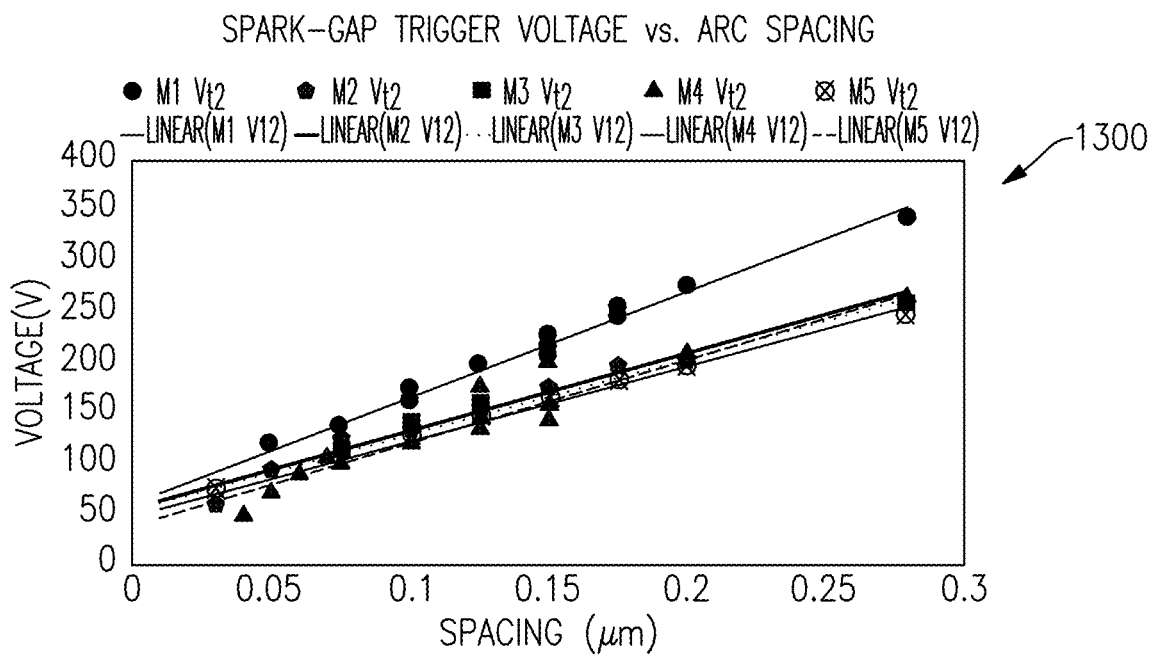
FIG. 13 is a graph illustrating experimentally observed relationships between arcing voltages and spacing of EOS monitor devices each including a pair of spaced conductive structures formed at various metallization levels for back end of line (BEOL) metallization in a semiconductor device, according to embodiments.

FIG. 13 is a graph 1300 illustrating experimentally observed correlations between arcing voltages and the spacing of conductive structures of EOS monitor devices, where each includes a pair of spaced conductive structures formed at various metallization levels (Metal 1 to Metal 5), according to embodiments. The voltage-spacing relationships are those of EOS monitors device having a plurality of pairs of differently spaced conductive structures electrically connected in parallel, similar to those described above with respect to FIGS. 9A and 9B. The structures formed at each metallization level generally show a linear relationship between the arcing voltage and the spacing, or gap size. Based on such correlations, precise tuning of trigger voltage can be obtained for a voltage range of about 20 V to about 1000 V. Additional experimentally observed correlation is further illustrated with respect to FIG. 2B.

Figure 14A:
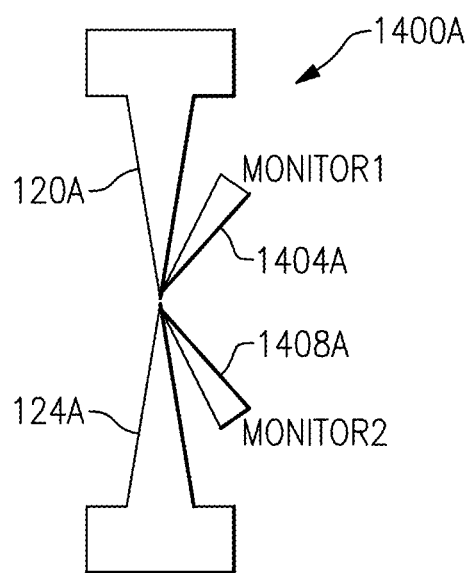
FIGS. 14A and 14B are schematic illustrations of an electrical overstress (EOS) monitor device including a pair of spaced conductive structures, before and after electrically arcing in response to an EOS event, according to embodiments.
Figure 14B:
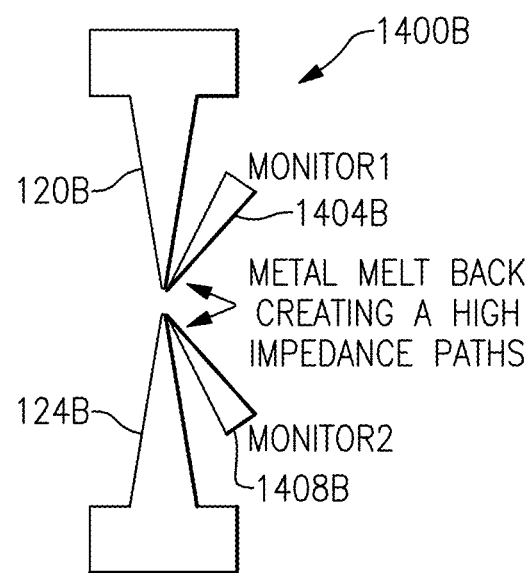

FIGS. 14A and 14B are schematic illustrations of a spark-gap device for serving as an integrated an electrical overstress (EOS) monitor device, including a pair 1400A/1400B of spaced conductive structures, before (FIG. 14A) and after (FIG. 14B) electrically arcing in response to an EOS event, according to embodiments. Similar the schematic diagram of the electrical overstress (EOS) monitor described above with respect to FIG. 1B, the pair 1400A of spaced conductive structures includes a cathode 120A and an anode 124A prior to arcing, and the pair 1400B of spaced conductive structures includes an anode 120B and the anode 124B subsequent to arcing. In addition, the EOS monitor device includes cathode and anode monitor probes 1404A/1404B and 1408A.1408B, respectively. Referring to FIG. 14A, prior to arcing, the cathode and anode monitor probes 1404A and 1408A contact the cathode 120A and the anode 124A, respectively. Referring to FIG. 14B, as a result of arcing, one or both of the cathode and anode monitor probes 1404B and 1408B become disconnected from the cathode 120B and an anode 124B, respectively. Thus, whether an arcing has occurred across the cathode and the anode can be determined visually, or based on whether an open circuit is detected between the cathode 120B and the cathode probe 1404B and/or between the anode 124B and the anode probe 1408B.

Figure 15:
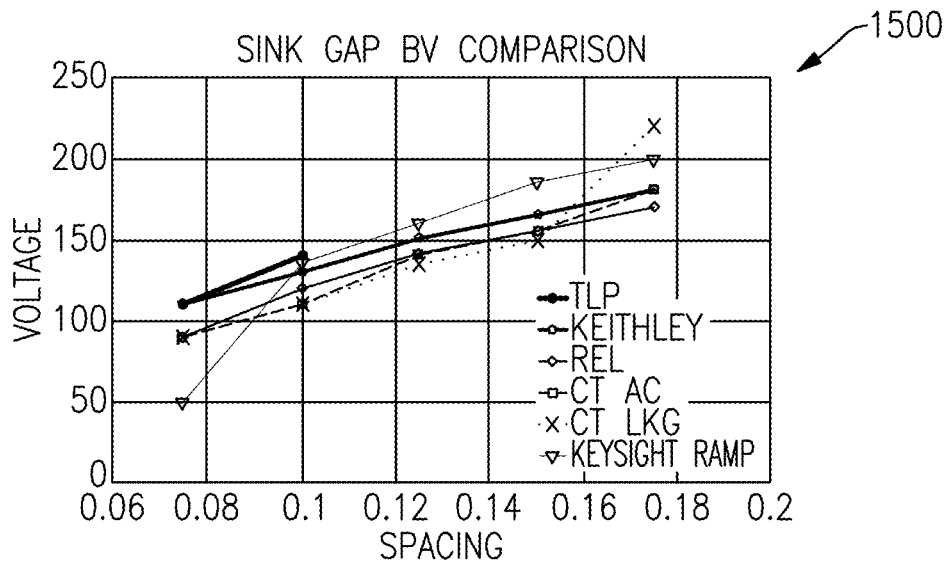
FIG. 15 is a graph illustrating experimentally observed wafer-level relationships between arcing voltages and spacing between a pair of spaced conductive structures, according to embodiments.

FIG. 15 is a graph 1500 illustrating experimentally observed wafer-level relationships between arcing voltages and spacing of a pair of spaced conductive structures, according to embodiments. The measurements were performed using different types of testers. The TLP measurement was performed under a transmission line pulse mode, while other measurements were performed under DC-type mode.

Figure 16:
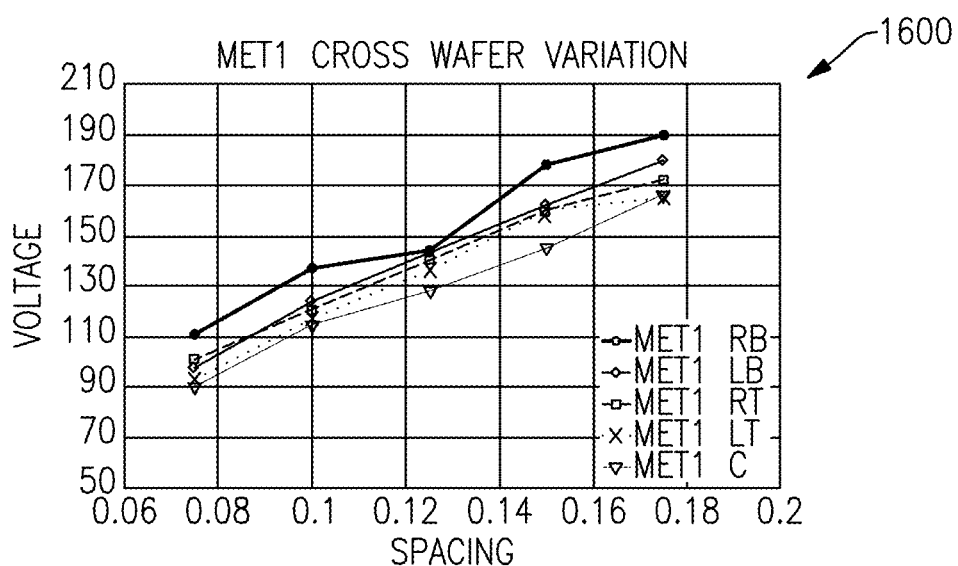
FIG. 16 is a graph illustrating experimentally observed wafer-level relationships between arcing voltages (also referred to as breakdown voltages or BV) and spacing between a pair of spaced conductive structures formed at metal 1 level, according to embodiments.

FIG. 16 is a graph 1600 illustrating experimentally observed wafer-level relationships between arcing voltages and spacing of a pair of spaced conductive structures formed at metal 1 level, according to embodiments. The measurements were performed under DC-type mode using a Keithley tester. RB, LB, RT, LT and C indicate right bottom, left bottom, right top, left top and center locations, respectively, of the tested wafer.

Figure 17:
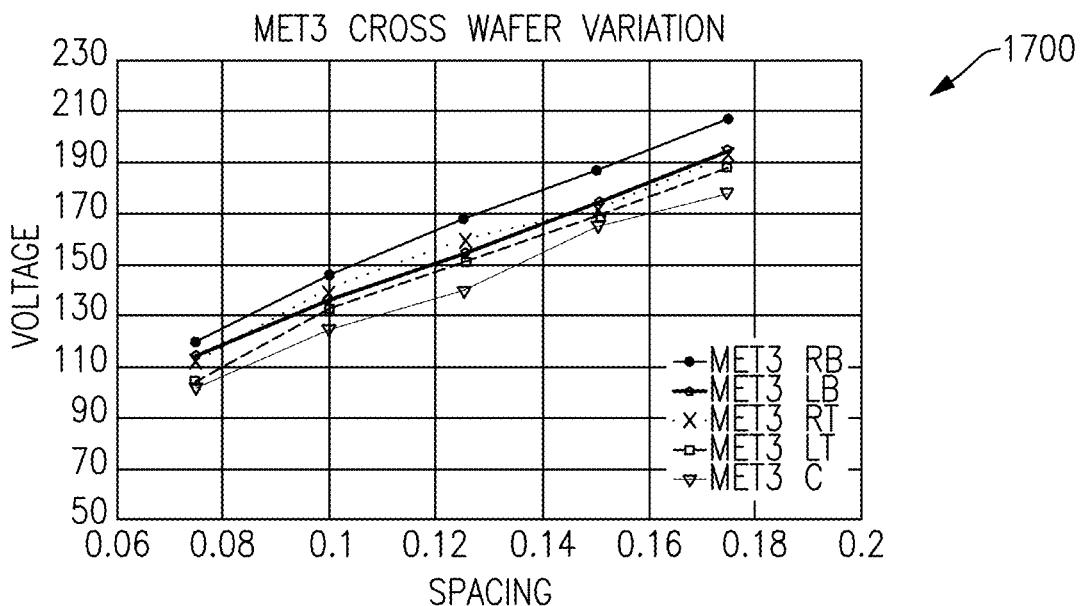
FIG. 17 is a graph illustrating experimentally observed wafer-level relationships between arcing voltages and spacing between a pair of spaced conductive structures formed at metal 3 level, according to embodiments.

FIG. 17 is a graph 1700 illustrating experimentally observed wafer-level relationships between arcing voltages and spacing of a pair of spaced conductive structures formed at metal 3 level, according to embodiments. The measurements were performed under DC-type mode using a Keithley tester. RB, LB, RT, LT and C indicate right bottom, left bottom, right top, left top and center locations, respectively, of the tested wafer.

Figure 18:
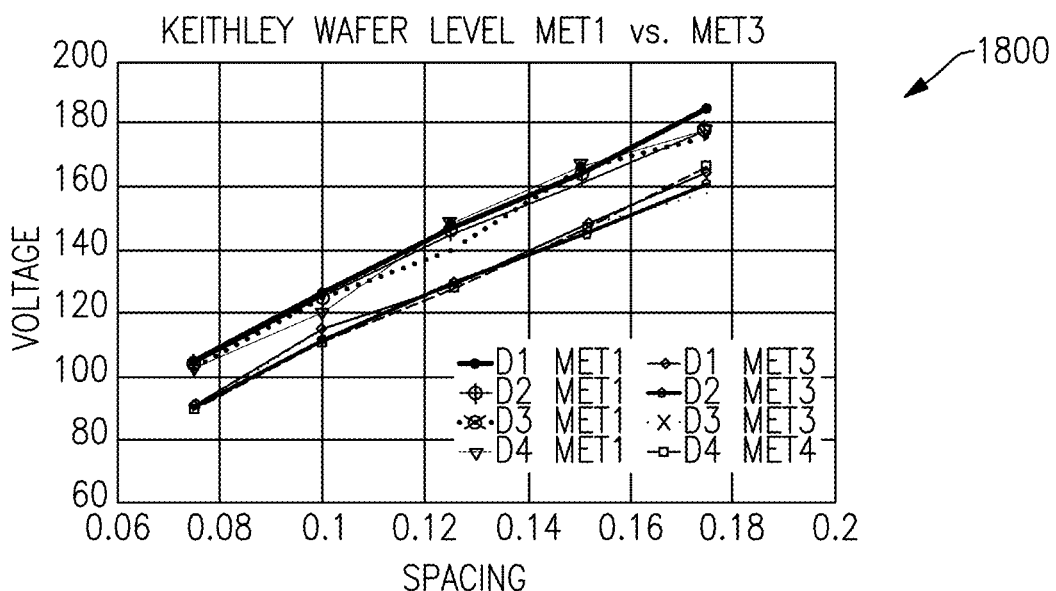
FIG. 18 is a graph illustrating experimentally observed wafer-level relationships between arcing voltages and spacing between a pair of spaced conductive structures formed at metal 1 and 3 levels, according to embodiments.

FIG. 18 is a graph 1800 illustrating experimentally observed wafer-level relationships between arcing voltages and spacing of a pair of spaced conductive structures formed at metal 1 and metal 3 levels, according to embodiments. The measurements were performed under DC-type mode using a Keithley tester. D1, D2, D3, and D4 indicate different locations of the tested wafer.

Figure 19:
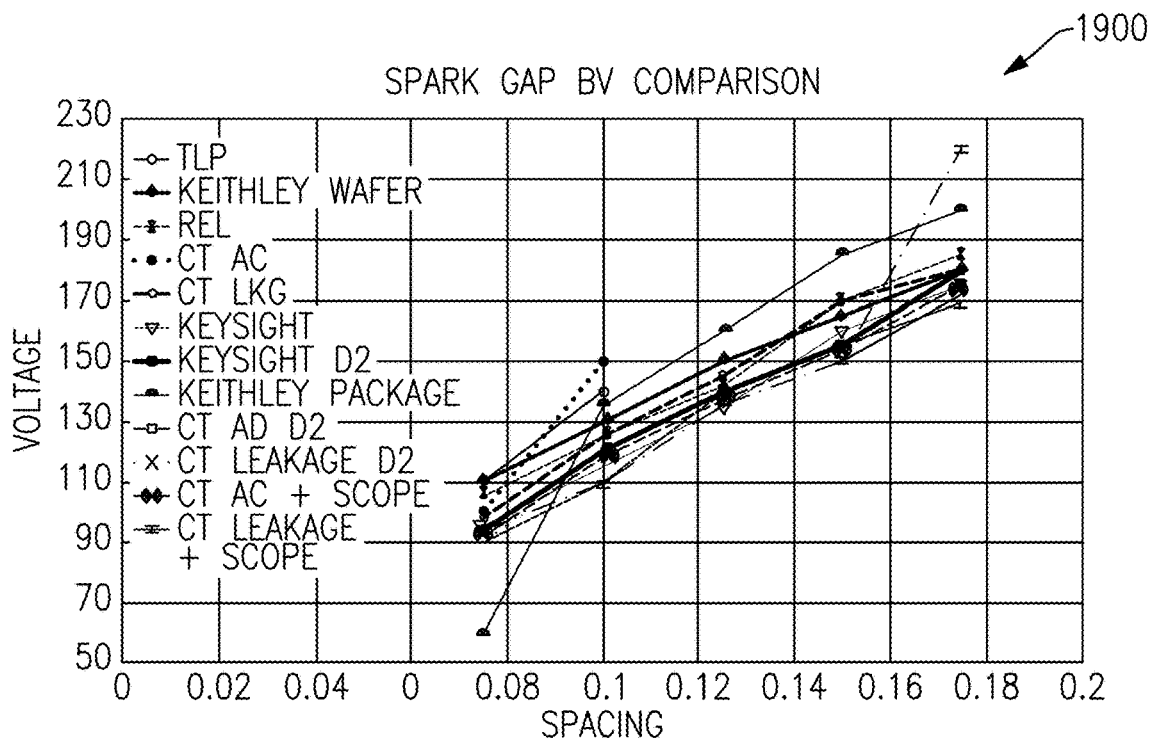
FIG. 19 is a graph illustrating experimentally observed wafer-level relationships between arcing voltages and spacing of a pair of spaced conductive structures formed at metal 3 level, according to embodiments.

FIG. 19 is a graph is a graph 1900 illustrating experimentally observed wafer-level relationships between arcing voltages and spacing of a pair of spaced conductive structures, according to embodiments. The measurements were performed using different types of testers. The TLP measurement was performed under a transmission line pulse mode, while other measurements were performed under DC-type mode.

Figure 20:
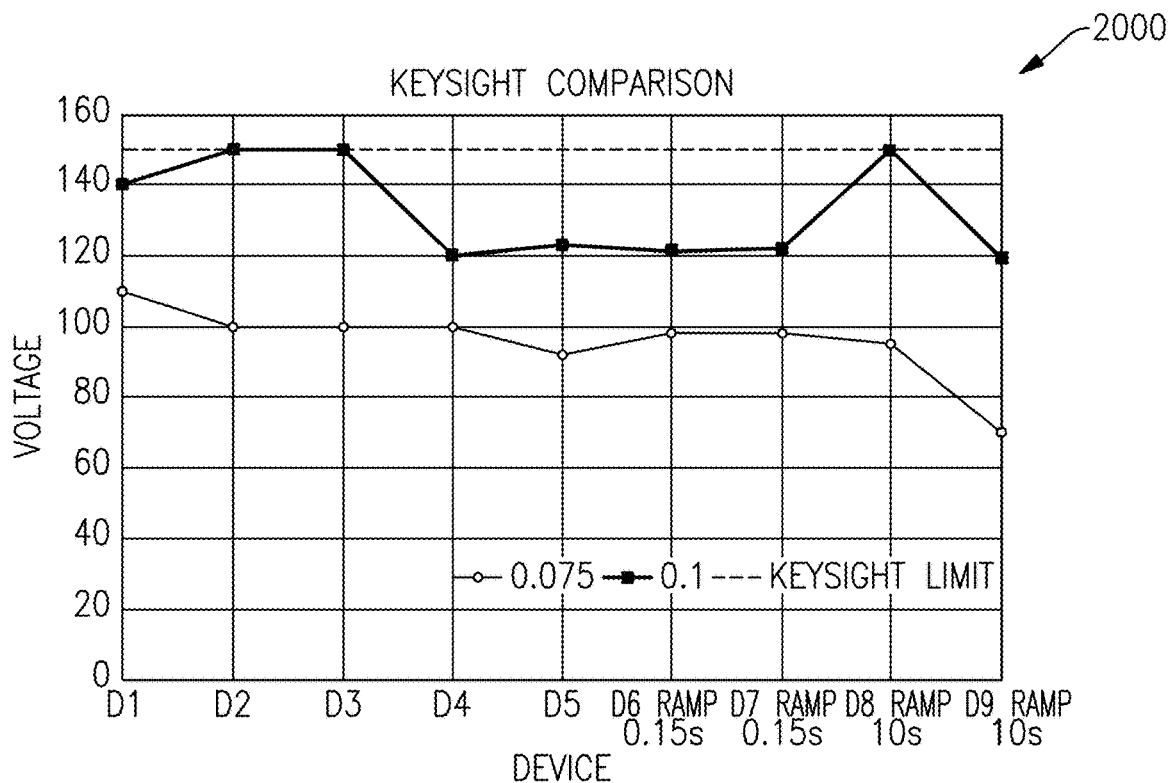
FIG. 20 is a graph illustrating experimentally observed repeatability of arcing voltages across the wafer for nominal spacing of a pair of spaced conductive structures formed at metal 1 level, according to embodiments.

FIG. 20 is a graph illustrating experimentally observed repeatability of arcing voltages across the wafer for nominal spacing of a pair of spaced conductive structures formed at metal 1 level, according to embodiments. The tested gaps were 0.075 micron gaps measured under 5 s ramp from 0 to 120V and 0.1 microns gaps measured under 5 s ramp from 0 to 150V.

Figure 21:
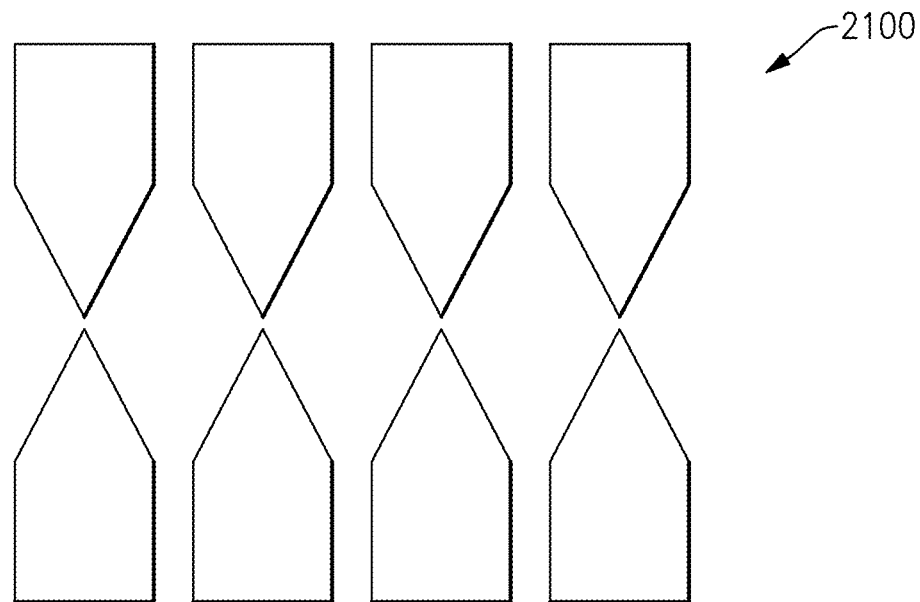
FIG. 21 is a schematic a top-down view of a plurality of pairs of spaced conductive structures electrically connected in parallel, covered with passivation, according to embodiments.

FIG. 21 is a schematic illustration of a top-down view of a plurality of pairs 2100 of spaced conductive structures electrically connected in parallel, covered with passivation (not shown), according to embodiments. When covered with passivation, whether an EOS event had occurred in the semiconductor device can be determined by measuring a change in a leakage current across the pair of spaced conductive structures, by detecting an open circuit across a fuse that is serially connected to the pair of spaced conductive structures.

Example Visual and Electrical Detection of EOS Events

As described above, according to various embodiments disclosed herein, electrical overstress (EOS) events can be monitored using EOS monitor devices that include a pair of spaced conductive structures or a spark gap structure, and the information gathered from the EOS monitor devices can be used to prevent damage to core circuits. In some embodiments, monitoring may not be responsive in real time. Rather, it may be useful to have a monitoring device that can be inspected after an EOS event has occurred to determine, e.g., the number and magnitude of the EOS events for diagnostic purposes. For example, in some embodiments, electrical monitoring can be performed by visual inspection of the EOS monitor device. The diagnostic information regarding, e.g., the extent of the EOS event may be useful in determining the cause of the EOS events for either avoiding such events in the future or designing parts to be more resistant to such events. In the following, example devices provide these and other advantages.

Figure 22:
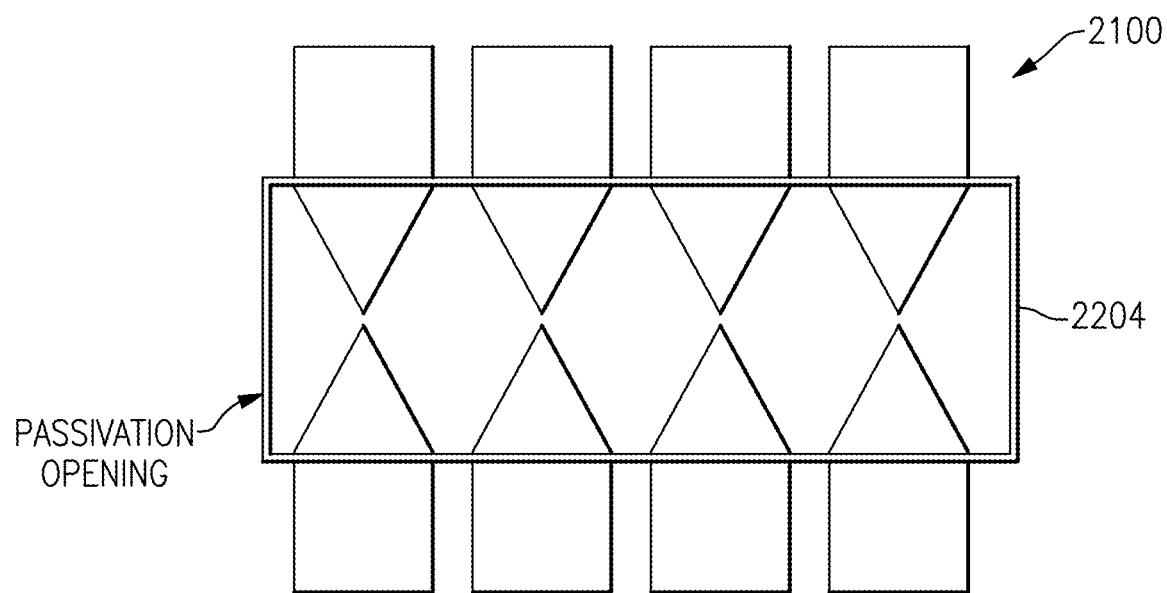
FIG. 22 is a schematic top-down view of a plurality of pairs of spaced conductive structures electrically connected in parallel and having an exposed portion that includes the gaps, according to embodiments.

FIG. 22 is a schematic illustration of a top-down view of a plurality of pairs 2200 of spaced conductive structures electrically connected in parallel having an exposed portion 2204, e.g., formed by an opening in the passivation, according to embodiments. In addition to the methods discussed supra, when a portion of the conductive structures are exposed, whether an EOS event had occurred in the semiconductor device can be determined by visually determining based on a change in appearance. The change in appearance can be detected with naked eyes in some embodiments, while in some other embodiments, the change in appearance can be detected using optical and/or electron microscopy techniques. Having the exposed portions can have other applications, e.g., monitoring corrosion or degradation of the conductive structures.

Figure 23:
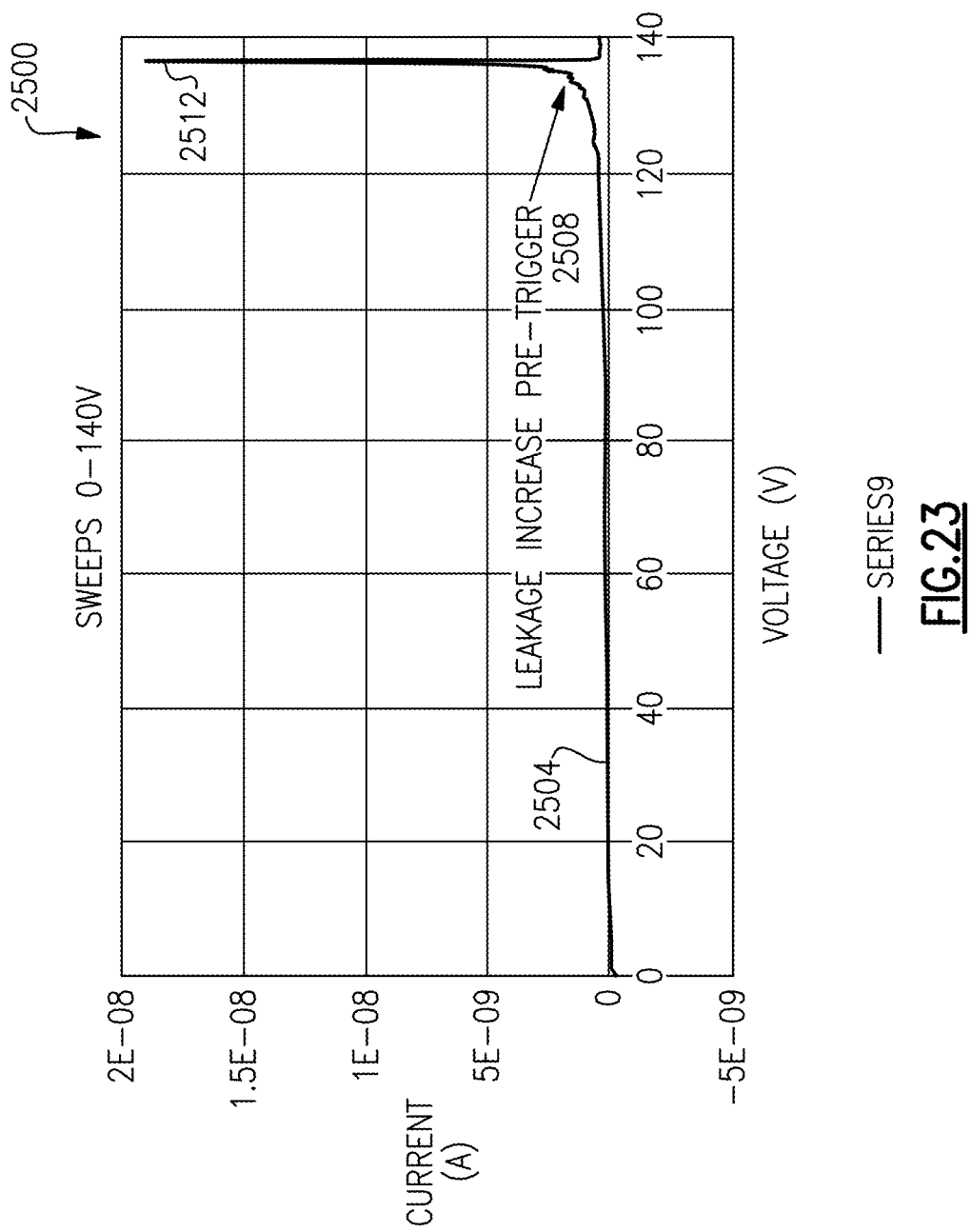
FIG. 23 illustrates a current-voltage (IV) curve of a DC sweep across a plurality of pairs of spaced conductive structures (shown in FIG. 25B), according to embodiments.

FIG. 23 illustrates a current-voltage (IV) curve 2500 of a DC sweep across a plurality of pairs of spaced conductive structures, according to embodiments. As the IV curve 2500 illustrates, as the voltage applied across the plurality of pairs of spaced conductive structures is increased, the current initially gradually increases in the baseline region 2504, increases very rapidly in the pre-trigger region 2508, and peaks in the trigger region 2512. The IV curve 2500 illustrates several advantages of the pairs of spaced conductive structures according to various embodiments described herein. According to some embodiments, various regions of the IV curve 2500 can be used to detect an EOS event not only at or above the trigger voltages of the pairs of the conductive structures, i.e., after an arcing event has occurred, but can also be used to detect an EOS event at voltages lower than the trigger voltage, i.e., before an arcing event occurs. For example, when current across a space between a pair of conductive structures increases by several factors, e.g., a decade or more within less than about 20V, 10V, or 5V, a user may infer that that an EOS event is about to occur, before an actual EOS event occurs. In addition, as illustrated, relatively low amount of current (e.g., less than 5 nA or less than 1 nA) may be sufficient for such detection.

In some embodiments, the spaced conductive structures can be configured to determine whether an EOS event had occurred by measuring a change in various other measurable or otherwise observable parameters caused by damage to the spark gap tips, e.g., a change in capacitance between the pair of spaced conductive structures, or a change in magnetic properties associated with the pair of spaced conductive structures.

Detection of EOS Events in Different Time Duration Regimes

As discussed supra, various spaced conductive structures can be used to monitor electrical overstress events based on the occurrence of an arcing event across pairs of spaced conductive structures. The inventors have found, e.g., as illustrated above with respect to FIG. 19, that the occurrence of an arcing event across the conductive structures is relatively independent of the test method, even though the different test methods apply pulses having different effective pulse widths across the conductive structures. The relative independence of the applied pulse width on the resulting arcing voltage can be advantageous, because the monitor devices having the spaced conductive structures can be designed based on test results obtained in one time duration regime, while the actual EOS event that monitor device and/or the core circuit is exposed to may be in a different time duration regime. In the following, test results illustrating this and other advantages are described.

Figure 24:
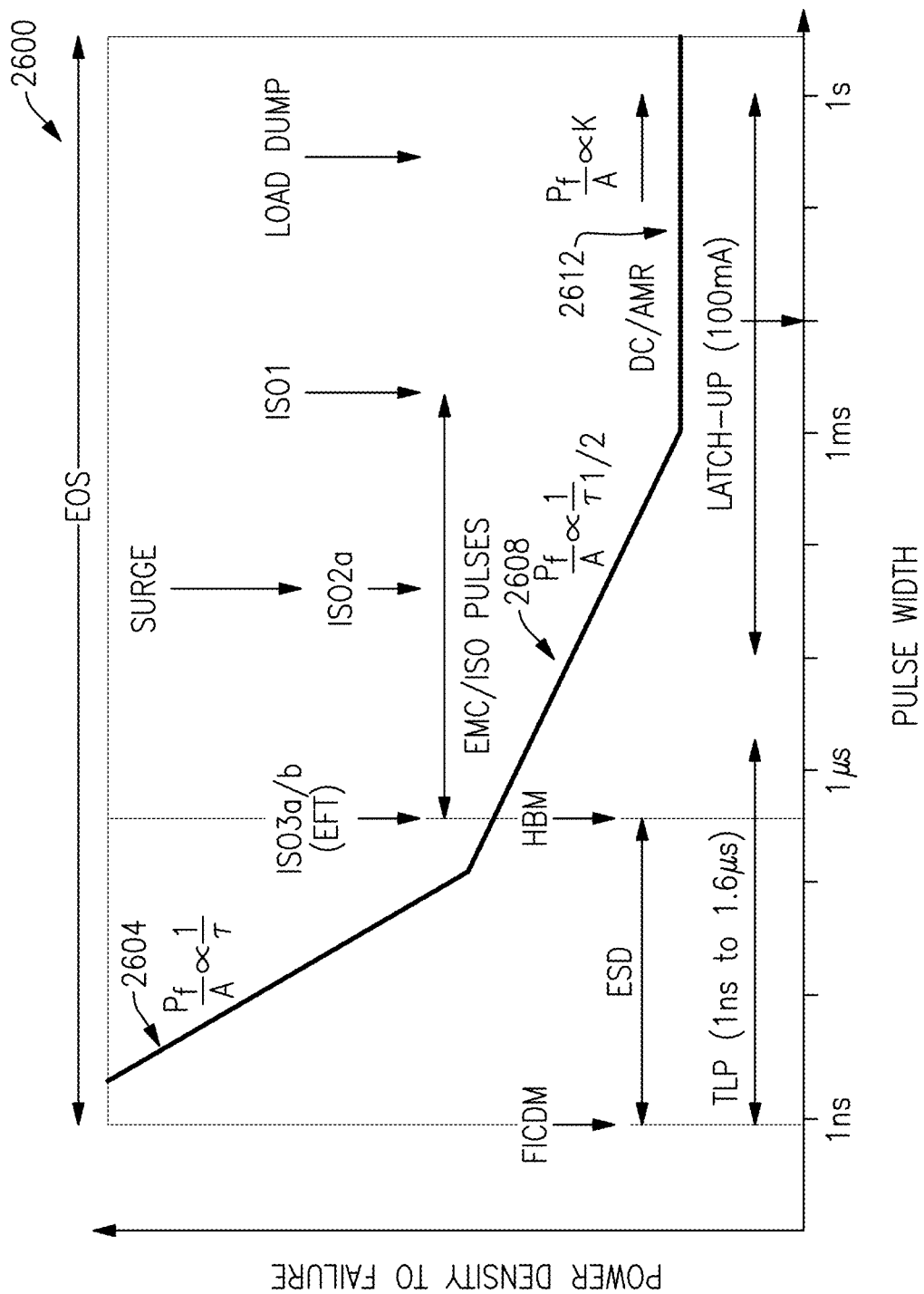
FIG. 24 is a graph (Wunsch-Bell curve) schematically illustrating the dependence of power density to failure on the applied pulse width for electronic circuits.

FIG. 24 is a graph 2600, sometimes referred to as Wunsch-Bell curve, schematically illustrating the dependence of power density-to-failure on the applied pulse width for electronic circuits. Without being bound to any theory, the graph 2600 may be considered to illustrate three regimes of the dependence, including an adiabatic regime 2604, a thermal diffusion-controlled regime 2608 and a DC/steady state regime 2612. In the adiabatic regime 2604, the power density to failure ($P_f/A$) can be proportional to $1/\tau$, where $P_f$ is the power to failure, A is the device cross-sectional area through which current flows and $\tau$ is the observed time-to-failure. In the thermal diffusion-controlled regime 2608, the $P_f/A$ can be proportional to $1/\tau^{1/2}$, and in the DC/steady state regime 2612, the $P_f/A$ can be proportional to a constant (K). The graph 2600 also illustrates time durations corresponding to various ESD model regimes, e.g., human body model (HBM), field-induced charge device model (FICDM), EMC/ISO pulses and DC/AMR. In the past, testing of EOS events in the relatively fast pulse regimes including the adiabatic regime 2604 had been relatively difficult. In the following, testing results in these relatively short time duration regimes are described, e.g., using transmission line pulse (TLP) testing methods. As described herein, TLP testing is performed using a transmission line, e.g., a charged 50 Ohm transmission line, to deliver a pulse, e.g., a square wave, having 1 ns to 1.6 µs pulse width and having 0.1 ns to 45 ns rise time.

Figure 25:
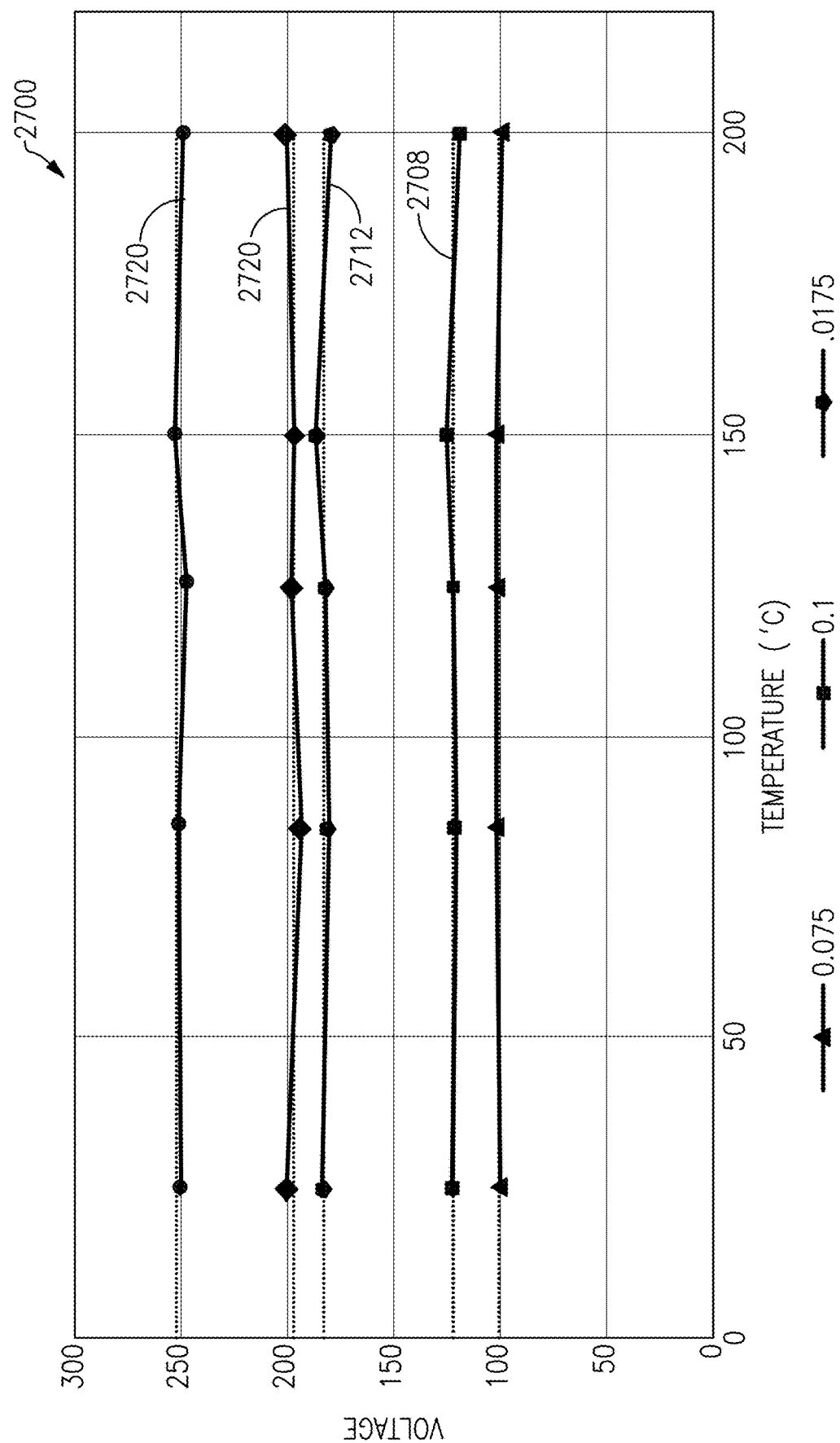
FIG. 25 is a graph illustrating temperature dependence of triggering voltages of various pairs of spaced conductive structures having different gaps, according to embodiments.

FIG. 25 is a graph 2700 illustrating temperature dependence of triggering voltages of various spaced conductive structures 2824 having different gaps, according to embodiments. The trigger voltages of the spaced conductive structures represented in the y-axis were measured under TLC testing conditions. The tested spaced conductive structures were fabricated using metal 4 conductive structures, and curves 2704, 2708, 2712, 2716 and 2720 plot trigger voltage measured for conductive structures having 0.075 µm, 0.1 µm, 0.175 mm, 0.2 µm and 0.28 µm, respectively. The inventors have found that the trigger voltage is relatively temperature independent in the tested temperature range of 25° C. to 200° C. The relative temperature independence can be advantageous for various reasons. For example, while the temperature which the core circuit and the monitor device having the spaced conductive structures can be subjected to varying temperatures, the triggering voltage of the spaced conductive structures remain relatively constant, thereby preserving the accuracy of the monitor results relatively independent of the temperature, at least within normal operational temperature ranges encompassed by 25° C. to 200° C.

FIGS. 26A-26B illustrate electrical and visual monitoring results from testing a spaced pair of conductive structures 2824. FIG. 26A illustrates a very fast TLP (VFTLP) IV curve 2800A measured on a pair of spaced conductive structures fabricated using metal 2 structures. The IV curve 2800A corresponds to the IV response of the conductive structures 2824 tested using a charged 50 Ohm transmission line. As the IV curve 2800A illustrates, as the applied VFTLP voltage is increased, the voltage across the spaced pair of conductive structures initially increases proportionally in the baseline region 2804, starts to rapidly decrease in a trigger region 2808 and snaps to a holding voltage in a hold region 2812. The VFTLP current initially slowly increases in the baseline region 2804 and increases very rapidly from the trigger region 2808 to the holding region 2812.

FIG. 26B is a graph 2800B illustrating overlaid voltage-time (V-t) curve 2816 and current-time (I-t) curve 2820 corresponding to the VFTLP IV curve described with respect to FIG. 26A. At time zero, application of a 5 ns VFTLP voltage pulse across the pair of conductive structures results in a rapid rise in voltage across therebetween. At the trigger region 2808, the voltage collapses, accompanied by a rapid rise in current flowing through the pair of spaced conductive structures.

Trigger Voltage Tuning By Varying Materials, Thicknesses and/or Gap Distances of the Spaced Conductive Structures As described above with respect to FIGS. 15-19, the trigger voltage of the pairs of spaced conductive structures can be tuned by varying the distance between the pairs of spaced conductive structures, as well as by varying the thickness of the pairs of spaced conductive structures. In addition, as described above with respect to FIGS. 9A, 9B, 10A, 10B, the inventor have found that the trigger voltage of the pairs of spaced conductive structures can provide another degree of freedom with respect to tuning the trigger voltage. Furthermore, inventors have found that forming the spaced conductive structures using different materials can yet provide another degree of freedom with respect to tuning the trigger voltage.

Figure 27:
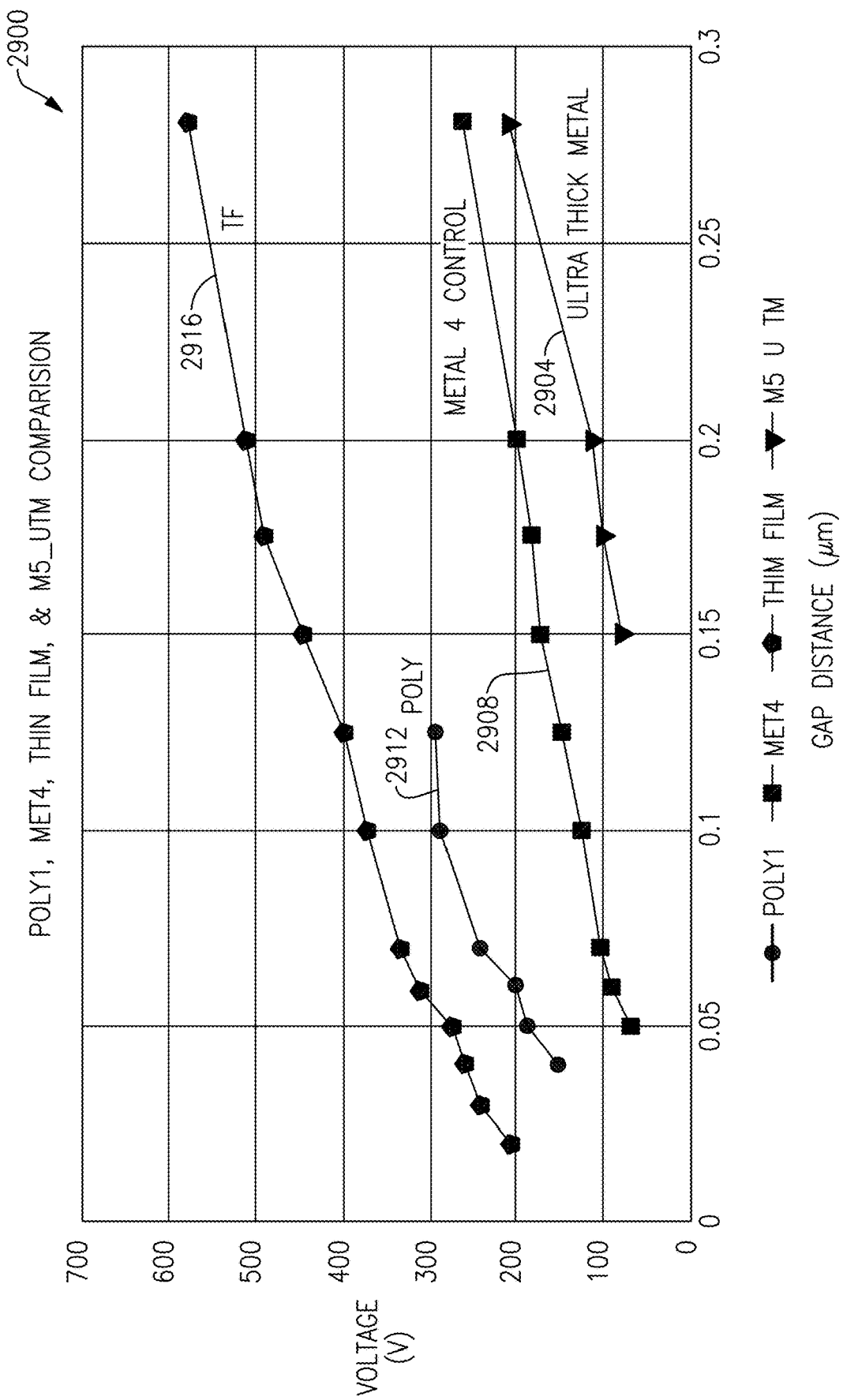
FIG. 27 is a graph illustrating the dependence of trigger voltages of pairs of spaced conductive structures formed of different materials on the gap distance under transmission line pulse (TLP) testing conditions.

FIG. 27 is a graph 2900 illustrating the dependence of trigger voltages, under TLP conditions, of spaced conductive structures formed of different materials on the gap distance. The trigger voltage versus gap distance (V-d) curves 2904, 2908, 2912 and 2916 show the dependence of the trigger voltages of pairs of spaced conductive structures formed using metal 5 structures, metal 4 structures, polycrystalline silicon and a carbon-based thin film material, respectively. The nominal gap distance and the shapes of the spaced conductive structures corresponding to the V-d curves 2904, 2908, 2912 and 2916 are the same. On the other hand, the pairs of spaced conductive structures corresponding to the V-d curves 2904, 2908 are formed of the same material but have different thicknesses, showing that higher thickness results in lower trigger voltage, as discussed supra. In addition, spaced conductive structures formed of thinner materials can be designed to have relatively smaller gap distances before suffering substantial yield loss due to shorting. The pairs of spaced conductive structures corresponding to the V-d curves 2908, 2912, 2916 are formed of different materials while having the same thickness, showing higher resistance of the material of the pairs of spaced conductive structures can lead to higher trigger voltages.

Design Considerations for the Hold Voltage of Spaced Conductive Structures

As described above with respect to FIG. 6, upon triggering a pair of spaced conductive structures, the corresponding portion of the IV curve is characterized by a "snap-back" region, followed by a collapse in voltage to a hold voltage $V_H$. In some applications, e.g., EOS monitoring of powered core circuitry, the $V_H$ of the pair of spaced conductive structures may desirably be controlled to a higher value than a predetermined value. For example, when the monitor devices are integrated with some circuitry electrically connected in parallel, e.g., power supply circuitry, the $V_H$ of the pair of the pair of spaced conductive structures may be higher than that of the power supply circuitry. This may be because, e.g., if $V_H$ is lower than the power supply voltage, upon triggering of the pair of spaced conductive structures in response to an EOS event, resulting in a collapse of the voltage across the pair of conductive structures to $V_H$, the power supply may latch-up after the EOS event ends. In the following, experimental results are described that demonstrate this effect. Accordingly, according to various embodiments, monitor devices including pairs of spaced conductive structures have hold voltages that are higher than a voltage of the power supply for the core circuit.

FIG. 28A schematically illustrates experimentally controlling effective $V_H$ in TLP testing using transmission lines that have different load values. As illustrated, because when the pair of spaced conductive structures is triggered, the IV curve has a negative slope according to the load line defined by the load values of the transmission line, using a transmission line having a higher load value, e.g., 500 Ohms, results in a collapse of the voltage across the spaced conductive structures to a lower $V_H$, compared to the $V_H$ that results when using a transmission line has a lower load value, e.g., 50 Ohms. FIG. 28B illustrates experimental verification of the effect of load values on $V_H$ schematically illustrated with respect to FIG. 28A. As illustrated, for pairs of conductive structures having nominally the same trigger voltages, compared to $V_H$ values 3208A obtained from TLP testing using relatively low load (e.g., 50 Ohm transmission lines), $V_H$ values 3208B obtained using transmission lines having higher load values (e.g., 500 Ohms, 1500 Ohms) have relatively lower $V_H$ values.

Figure 29A:
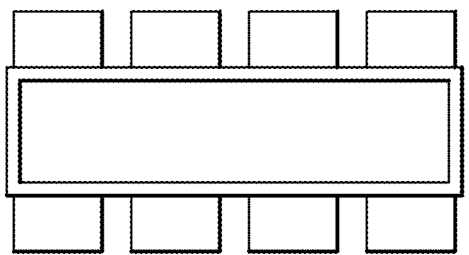
FIG. 29A is a schematic top-down view of a plurality of pairs of spaced conductive structures electrically connected in parallel with an opening formed in the passivation layer that includes the gaps and is filled with different materials, according to embodiments.
Figure 29B:
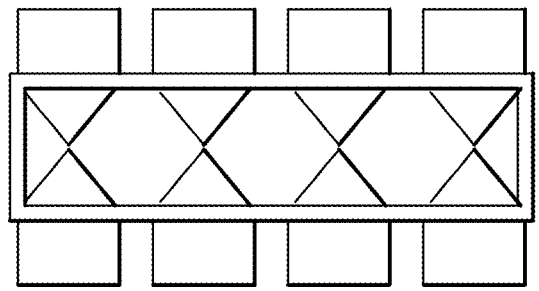
FIG. 29B is a schematic top-down view of a plurality of pairs of spaced conductive structures electrically connected in parallel with an opening formed in the passivation layer that includes the gaps and is filled with different materials, according to embodiments.
Figure 29C:
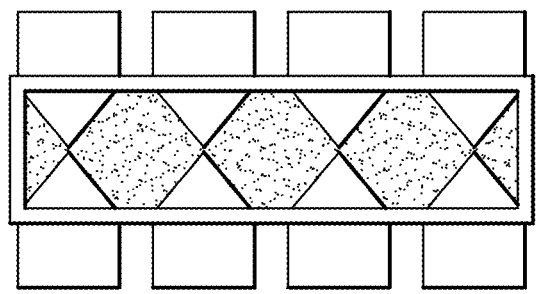
FIG. 29C is a schematic top-down view of a plurality of pairs of spaced conductive structures electrically connected in parallel with an opening formed in the passivation layer that includes the gaps and is filled with different materials, according to embodiments.

FIGS. 29A-29C are schematic top-down views of a plurality of pairs of spaced conductive structures electrically connected in parallel with an opening formed in the passivation layer that is filled with different materials, according to embodiments. The opening can be filled with semipermeable membrane/gel (FIG. 29A), (reactive) metal material (FIG. 29B) or (insulating) material in the gaps between the conductive structures.

Figure 30:
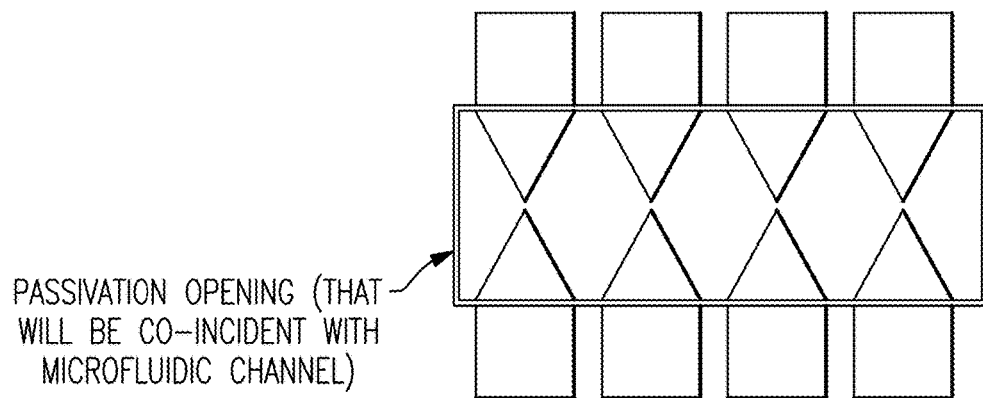
FIG. 30 is a schematic top-down view of a plurality of pairs of spaced conductive structures electrically connected in parallel having an opening formed in the passivation layer that overlaps with a microfluidic channel, according to embodiments.

FIG. 30 is a schematic top-down view of a monitor device having a plurality of pairs of spaced conductive structures electrically connected in parallel having an opening formed in the passivation layer that overlaps with a microfluidic channel, according to embodiments. The illustrated pairs of spaced conductive structures are configured such that, upon arcing, the gaps between conductive structures (e.g., metal structures) may increase, which can create a wider path or a channel for fluid to flow in a specific direction. A monitor device including the pairs of spaced conductive structures could be electrically modified to create or modify a path for fluid to flow along a specific path. In some embodiments, the conductive structures, e.g., metal structures, could be configured to react with the fluid in the channel. In some embodiments, a measurement/analysis of the fluid before and after arcing can provide an electrical signature associated with a chemical change, e.g., a change in pH or gas concentration, for applications in biomedical or chemical analysis.

Figure 31:
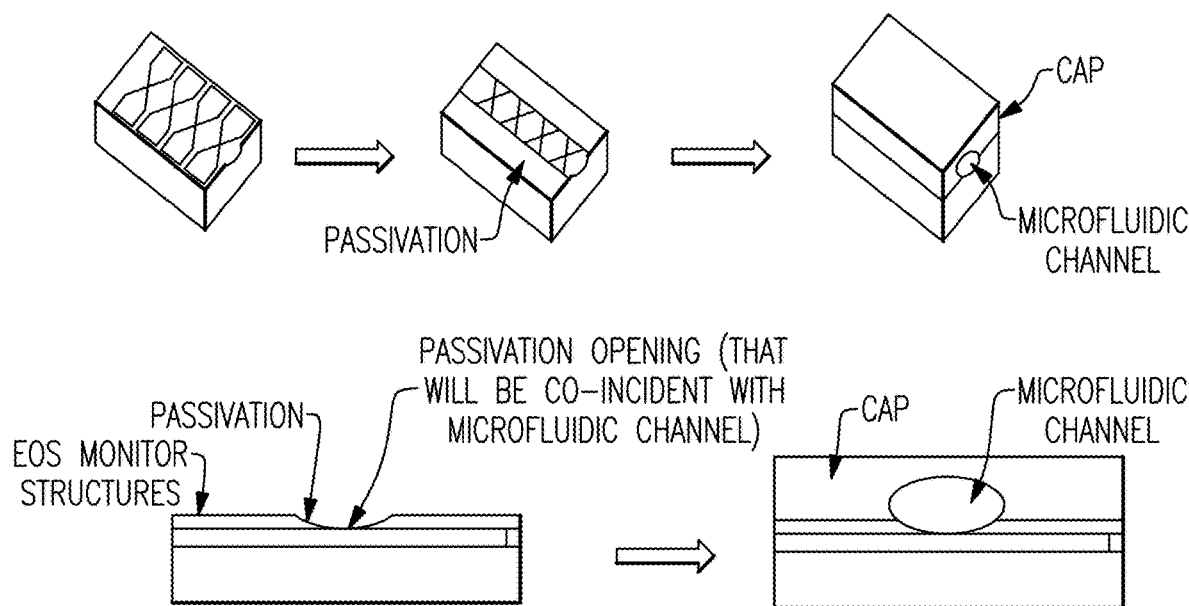
FIG. 31 is a process flow for fabricating microfluidic channels over an EOS monitor, according to embodiments.
Figure 32:
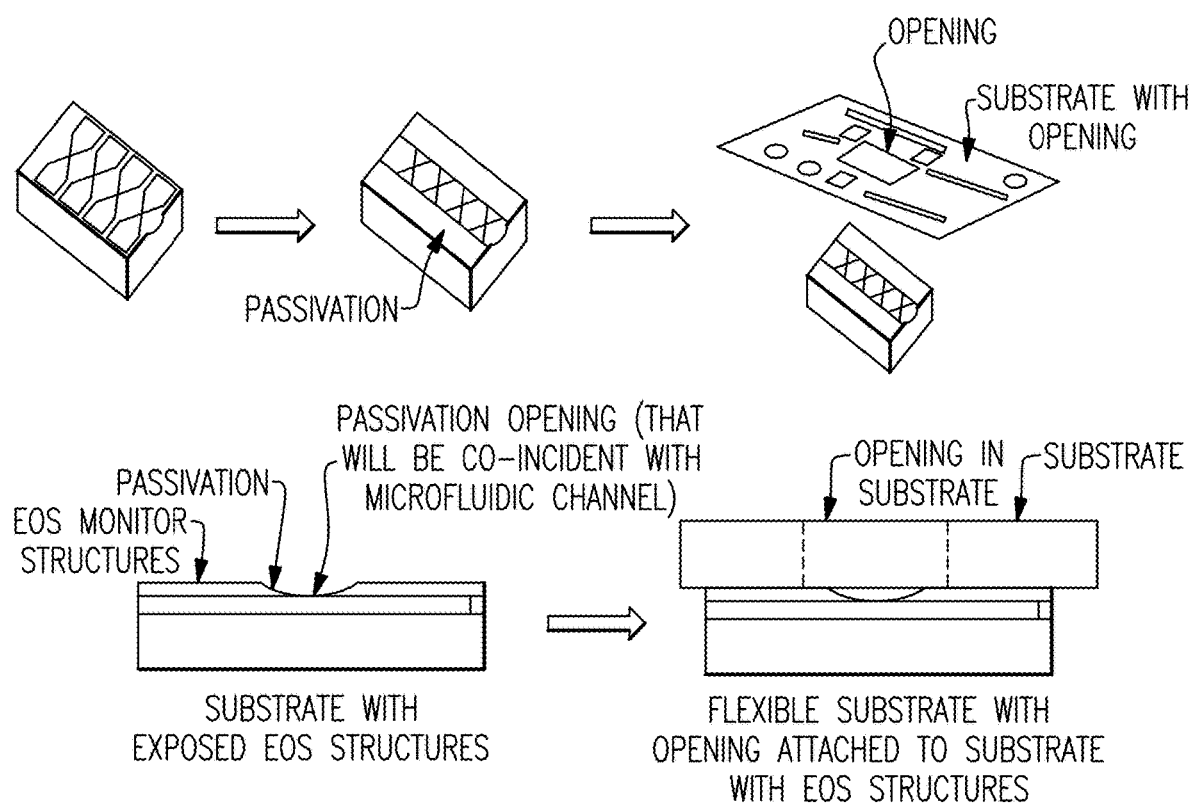
FIG. 32 is a process flow for integrating a flexible substrate with an EOS monitor, according to embodiments.

FIGS. 31 and 32 illustrate monitor devices having pairs of spaced conductive structures according to some embodiments, where a cap or a protective cover is formed over the pairs of spaced conductive structures, such that a sealed channel can be formed (for fluid to pass through). Similar to the monitor device illustrated with respect to FIG. 30, the conductive structures, e.g., metal structures, enclosed by the cap could be configured to react with the fluid in the channel. In some embodiments, a measurement/analysis of the fluid before and after arcing can provide an electrical signature associated with a chemical change, e.g., a change in pH or gas concentration, for applications in biomedical or chemical analysis. In some embodiments, the substrates can be flexible for wearable applications.

Detecting and Recording Electrical Overstress Events

Further aspects of this disclosure relate to detecting and recording electrical overstress events. An electrical overstress event can be detected and information indicative of the electrical overstress event can be stored to memory and/or be reported external to an electronic device. Detection circuitry can detect an electrical overstress event and, in some instances, an intensity of the electrical overstress event. Physical memory can store information indicative of an intensity of an overstress event and/or a number of occurrences of electrical overstress events. The detection circuity and the memory can be part of the same integrated circuit (e.g., on the same die and/or within the same package) as the electrical overstress protection circuitry. In an embodiment, the detection circuit and the memory can be implemented by a combined detection and memory circuit.

The information associated with the electrical overstress event stored in the memory can be useful for functional safety purposes. For instance, this information can serve as indication of wear or lifespan of the device, indicate that an electronic device is potentially damaged, that data provided by an electronic device is potentially corrupt, that a measurement provided by an electronic device is potentially inaccurate, the like, or any combination thereof. The information associated with an electrical overstress event can be reported to provide information about the functional safety of electrical overstress protection circuity and/or of internal circuit(s) protected by the electrical overstress protection circuitry. The electronic overstress detection and reporting circuitry can provide an early indication of adverse conditions, analogous to a canary in a coal mine. In harsh environments, the electronic overstress detection and reporting circuitry can provide indicators of a lifespan of an electronic device and/or an electronic system. Tracking the lifespan of an electronic device by recording and reporting electrical overstress events can lead to better reliability of critical circuit and/or predictability of time for replacement. This can be advantageous in a variety of applications, such as in preventing failures in vehicles that can threaten safety and/or in healthcare applications.

For instance, a custom semiconductor die operating in an electronic device can record information indicative of an occurrence of an electrical overstress (e.g., overvoltage and/or ESD) event in memory of the semiconductor die. The occurrence of the overstress event may indicate that there is a fault within the electronic device. The occurrence of the electrical overstress event may indicate that external protection circuitry, i.e., circuitry connected to the custom semiconductor die, such as separate protection circuitry on another chip or on a board, is faulty such that a semiconductor die experiences surges and/or current spikes outside of a specification for circuitry to be protected, which can be on the custom semiconductor die or outside of the custom semiconductor die. As an example, a solder joint for the external protection circuitry can degrade and thus provide less than desirable protection from an overvoltage event. The semiconductor die can provide the information indicative of the occurrence of the electrical overstress event external to the semiconductor die and/or external to an electronic device that includes the semiconductor die. This can serve as a diagnostic to inform an electronic system that electrical overstress protection circuitry is no longer functioning at a desired level.

A specialized semiconductor die can be devoted to handling electrical overstress, including detection and recording information indicative of overstress events in a memory of the semiconductor die. The specialized semiconductor die can also serve to harvest energy associated with EOS events and/or to provide EOS protection. In certain implementations, recording functions can be implemented on a different semiconductor die than EOS protection functions.

In some instances, an integrated circuit may have a limited/defined life span. This can result from, for example, being in a harsh electrical environment. The electrical overstress detection and reporting circuitry can provide information about an intensity of an electrical overstress event and/or a number of occurrences of electrical overstress events as flags to an electronic system. After a defined number of electrical overstress events have been detected, the electronic system can provide a flag that an electronic device has a reduced lifespan. Such a flag can indicate that the electronic device is due for replacement relatively soon or within a defined period of time. Tracking the lifespan of a device can lead to better reliability of critical circuits and/or a better prediction of time for replacement.

Information indicative of electrical overstress events can be provided externally to an electronic device that experiences the electrical overstress events or to separate monitoring circuitry or devices. For instance, wireless and/or inductive circuits can provide signal remote to the electronic device to provide a warning and/or a status of the heath of the electronic device or an electronic system that includes the electronic device. Such warnings can provide indicators of the life span of the system and/or general system health. This can enable planning for a new/replacement electronic device to be included in the electronic system. These principles and advantages can be applied to a variety of electronic systems, such as electronic systems in cars and/or other vehicles and/or in healthcare applications.

These and other aspects related to detecting and recording electrical overstress events are described in U.S. patent application Ser. No. 14/671,767, the entire technical disclosure of which is hereby incorporated by reference herein.

In U.S. patent application Ser. No. 14/671,767, detection of and protection against electrical overstress events are performed using various semiconductor-based ESD sensors and semiconductor-based ESD protection devices. Furthermore, thus detected electrical overstress events are recorded in a physical memory. In the following, various embodiments in which a semiconductor-based ESD sensor/ESD protection device is replaced or included in addition to an EOS monitor device/ESD protection device which includes a pair of conductive structures having a gap therebetween are described. The EOS monitor device/ESD protection device can, in addition to providing the detection and protection, provide a nonvolatile record of the ESD event which can be visually or electrically detected and estimated, as described supra.

Detecting Electrical Overstress Events

As discussed above, aspects of this disclosure relate to detecting electrical overstress events, such as ESD events. Information associated with EOS events can be recorded and/or reported. This can provide information about the functional safety of a circuit, a die, an integrated circuit system, or the like. Such information can be indicative of an intensity of an EOS event, a duration of an EOS event, and/or of a number of occurrences of EOS events detected. In some embodiments, information associated with EOS events can be indicative of a pulse width of an EOS event, as an EOS event can have an arbitrary waveform. Such information can be recorded for each EOS pulse and/or multiple records can be captured per pulse. Illustrative embodiments related to EOS event detection will now be discussed.

Figure 33:
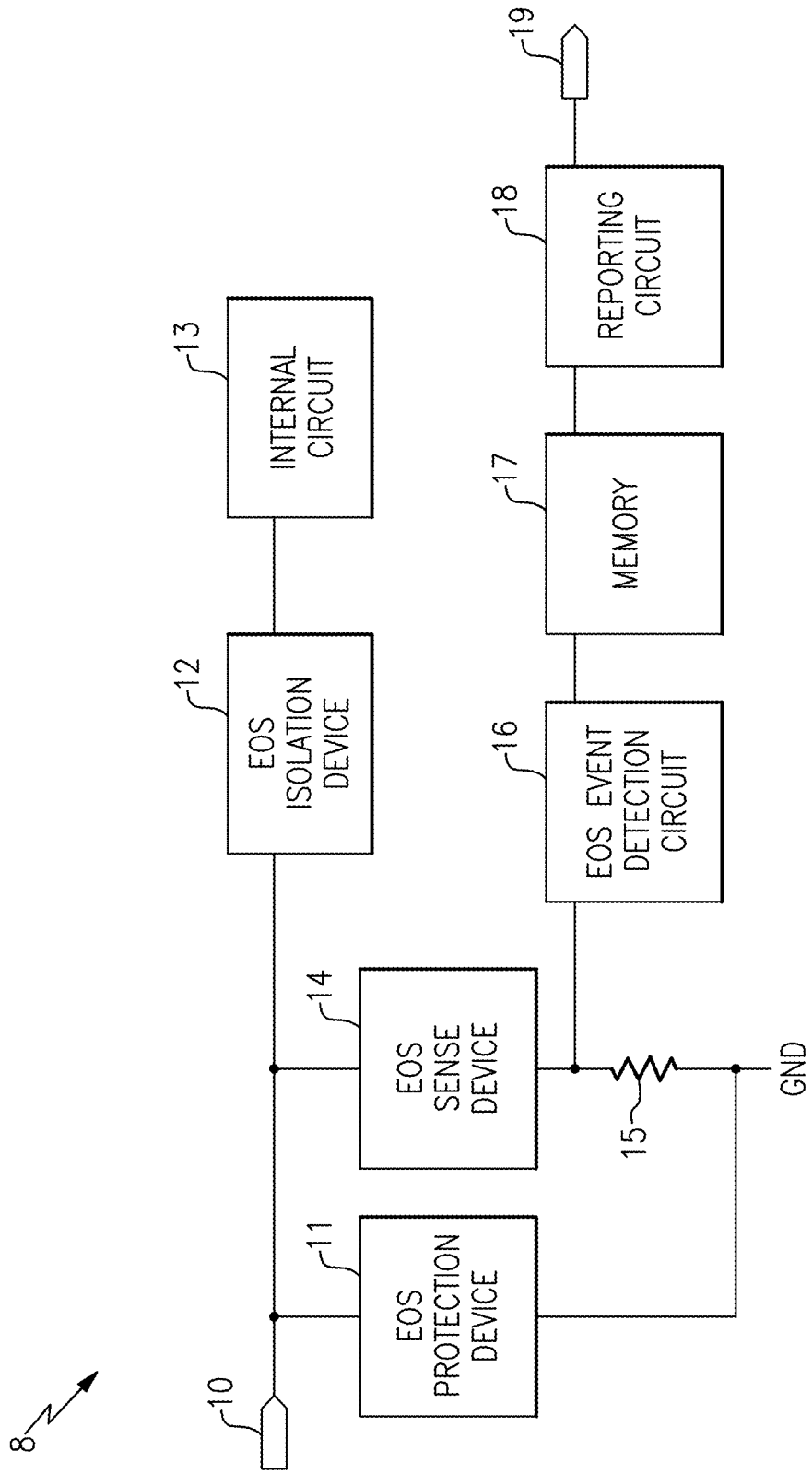
FIG. 33 is a schematic diagram of an illustrative electronic device that includes electrical overstress detection circuitry according to an embodiment.

FIG. 33 is a schematic diagram of an illustrative electronic device 8 that includes electrical overstress detection circuitry according to an embodiment. The electronic device 8 can be implemented in a variety of applications. As some examples, the electronic device 8 and/or other electronic devices discussed herein can be included in an automotive electronics system, an avionics electronics system, a healthcare monitoring electronics system, or the like. As illustrated, the electronic device 8 includes an input contact 10, an EOS protection device 11, an EOS isolation device 12, an internal circuit 13, an EOS sense device 14, a resistive element 15, a detection circuit 16, a memory 17, a reporting circuit 18, and an output contact 19. In some embodiments, one or both of the EOS protection device 11 and the EOS sense device 14 can include a pair of spaced conductive structures, as described herein. The illustrated elements of the electronic device 8 can be included within a single package. The electronic device 8 can include more elements than illustrated and/or a subset of the illustrated elements. The electronic device 10 can be a die, for example. As such, in some instances, the illustrated elements of the electronic device 8 can be embodied on a single die.

The electronic device 8 is configured to receive an input signal at the input contact 10, which can be an input pin as illustrated. The EOS protection device 11 is configured to provide protection from electrical overstress events. The illustrated EOS protection device 11 is configured to protect the circuitry electrically connected to the input contact 10 by diverting current associated with an EOS event to ground when a signal on the input contact 10 exceeds an EOS capability of the devices being protected, e.g., voltage breakdown. The EOS protection device 11 can protect the internal circuit 13 and the resistive element 15 from electrical overstress events. The EOS protection device 11 can also protect any other circuitry electrically connected to the input contact 10. The EOS isolation device 12 is disposed between the internal circuit 13 and the pin in FIG. 33. The EOS isolation device 12 can be, for example, a resistor. In FIG. 33, the EOS protection device 11 is disposed between the input contact 10 and ground. The EOS protection device 11 can be disposed between the input contact 10 and any other suitable low voltage reference. The EOS protection device 11 can be an ESD protection device configured to provide ESD protection, for example.

The EOS sense device 14 is an EOS protection device. For instance, the EOS sense device 14 can be a high impedance scaled down version of the EOS protection device 11. The EOS sense device 14 can be arranged to trigger at a signal level at which an EOS event is considered to occur. A relatively small percentage of the EOS event current can be provided through the resistive element 15 for purposes of detecting a magnitude of the EOS event. Accordingly, the signal provided to the detection circuit 16 by way of the EOS sense device 14 can be a scaled down version of a signal associated with an EOS event. In some embodiments, the EOS sense device 14 can be or include an EOS monitor device including a pair of conductive structures having a gap therebetween, as describe supra according to some embodiments (e.g., FIGS. 7A, 7B).

The resistive element 15 can be electrically coupled between the EOS sense device 14 and ground. This can provide a voltage drop such that a signal provided to the detection circuitry can be at a lower voltage than a voltage associated with the electrical overstress event, for example. The resistive element 14 can have a relatively low resistance (for example, about 1 Ohm in certain applications) and consequently the detection circuit 16 can receive a voltage signal that is at a lower voltage level (for example, a few volts) than a voltage associated with the electrical overstress event. The voltage drop provided by the resistive element 15 can prevent the detection circuit 16 from being damaged by the electrical overstress event. In some embodiments, the resistive element 15 can be or include a fuse, as describe supra according to some embodiments (e.g., FIGS. 7A, 7B).

As illustrated, the detection circuit 16 is electrically coupled to the EOS sense device 14 and configured to detect an occurrence of an electrical overstress event. For example, the detection circuit 16 can include a comparator configured to compare a voltage associated with an electrical overstress event with a reference voltage. Such a comparator can generate an indication that an electrical overstress event has occurred. The detection circuit 16 can detect an intensity, such as a voltage level and/or a current level, associated with the electrical overstress event using one or more comparators and/or an analog-to-digital converter according to certain embodiments.

In certain embodiments, the detection circuit 16 can include circuitry, such as a counter circuit, to determine a duration of an EOS event. The duration of an EOS pulse can be indicative of an amount of energy associated with the EOS event. By detecting a duration of an EOS pulse, the detection circuit 16 can differentiate between different types of EOS events, such as long DC pulses versus short transient pulses. The different types of EOS events can have varying impacts on the functional safety of an electronic system exposed to such EOS events. Accordingly, detecting the duration of an EOS event can provide additional information about the functional safety of an electronic system in certain applications.

The detection circuit 16 can provide information indicative of an electrical overstress event to the memory 17. The memory 17 can include any suitable physical circuitry to store such information, such as volatile memory or non-volatile memory. In certain embodiments, the memory 17 can include fuse elements. The memory 17 can store information indicative of the EOS event. For example, the memory 17 can store information indicative of an intensity of one or more EOS events, information indicative of a number of EOS events detected by the detection circuit 16, information indicative of a type of EOS event, information indicative of a duration of an EOS event, the like, or any combination thereof.

The reporting circuit 18 can provide information indicative of one or more electrical over-stress events to external circuitry, such as circuitry external to the electronic device 1. As illustrated, the reporting circuit 18 can receive such information from the memory 17. In some other embodiments, the reporting circuit 18 can receive such information from the detection circuit 16 without the information being stored to memory of the electronic device 10 and report the information. The reporting circuit 18 can provide the information indicative of one or more electrical overstress events to the output contact 19, which can be a pin as illustrated. According to certain embodiments, the reporting circuit 18 can wirelessly transmit such information and/or inductively transmit such information. The reporting circuit 18 can include an antenna transmission circuit and/or a communication bus transmitter in certain embodiments.

Electrostatic discharge protection devices are examples of electrical overstress protection devices, such as the EOS protection devices shown in FIG. 33 and/or other figures. FIGS. 34A to 34D illustrate example electrostatic discharge protection devices that can be implemented in one or more embodiments. Any of the electrostatic discharge protection devices illustrated in FIGS. 34A to 34D can be implemented in connection with any suitable embodiment related to electrical overstress event detection, harvesting energy associated with an electrical overstress event, configuring an electrical overstress protection device and/or a storage element responsive to an indication that an electrical overstress event is likely to occur, or any combination thereof. In some embodiments, each of the EOS protection devices illustrated in FIGS. 34A to 34D can be an EOS protection device which is provided in addition to and connected to an EOS monitor device/EOS protection device which includes a pair of conductive structures having a gap therebetween, as describe supra according to some embodiments (e.g., ESD 12 of FIG. 33).

Figure 34A:
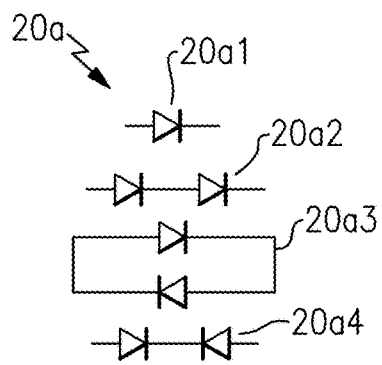
FIG. 34A illustrates an example electrical overstress protection device that can be implemented in one or more embodiments.

FIG. 34A illustrates diode-based ESD protection devices 20a. FIG. 34A illustrates a unidirectional blocking junction diode 20a1, series-forward blocking junction diodes 20a2 for proportional increase of forward-biased conduction and reverse blocking voltage, antiparallel low voltage drop-conduction and decoupling diodes 20a3, and a high back-to-back diode based bidirectional blocking device 20a4.

Figure 34B:
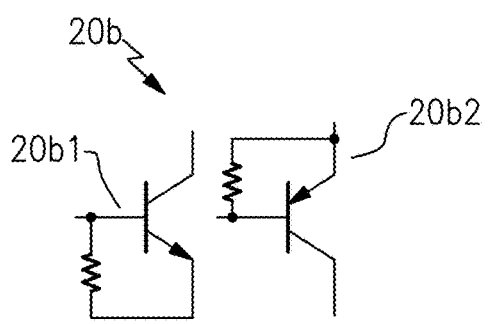
FIG. 34B illustrates an example electrical overstress protection device that can be implemented in one or more embodiments.

FIG. 34B illustrates bipolar transistor-based ESD protection devices 20b including an NPN ESD device 20b1 and a PNP ESD device 20b2. From collector to emitter (NPN) and emitter to collector (PNP), the bipolar transistors function as relatively high blocking voltage elements until reaching a breakdown voltage, at which point the device triggers and provides a low conduction path and high holding voltage between its terminals. In the opposite voltage polarity, a forward-biased junction is obtained.

Figure 34C:
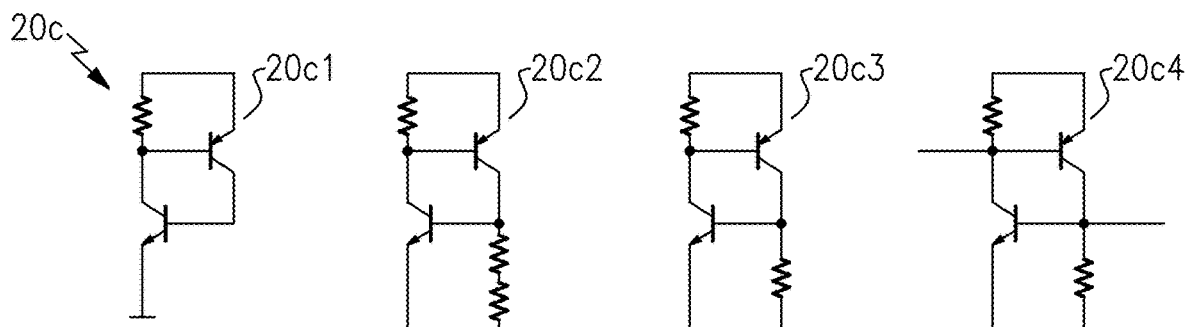
FIG. 34C illustrates an example electrical overstress protection device that can be implemented in one or more embodiments.

FIG. 34C illustrates coupled unidirectional NPN and PNP thyristor-like ESD protection devices 20c. The ESD protection devices shown in FIG. 34C can be referred to as semiconductor-controlled rectifiers. In some instances, semiconductor-controlled rectifiers are silicon controlled rectifiers (SCRs). The NPN and PNP thyristor-like ESD devices include configurations with: floating NPN base 20c1, leading to a lower trigger voltage; an NPN in collector-emitter breakdown voltage mode with base-emitter resistance 20c2, leading to an intermediate trigger voltage; a traditional configuration with fixed base resistance 20c3 for highest thyristor trigger voltage; and thyristor bipolar base external latch trigger and latch release control 20c4.

Figure 34D:
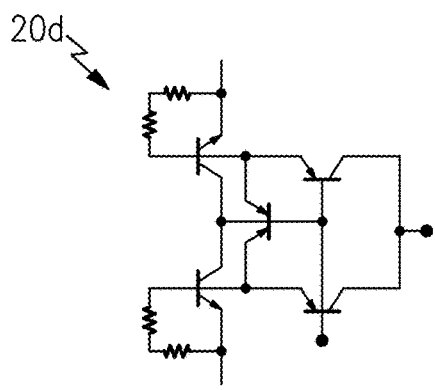
FIG. 34D illustrates an example electrical overstress protection device that can be implemented in one or more embodiments.

FIG. 34D illustrates a coupled NPN-PNP-NPN bi-directional high blocking thyristor like ESD protection device 20d. The bidirectional breakdown voltage in this device can be closely defined by the base-emitter junction of the PNP device illustrated in the center of this device.

Figure 35:
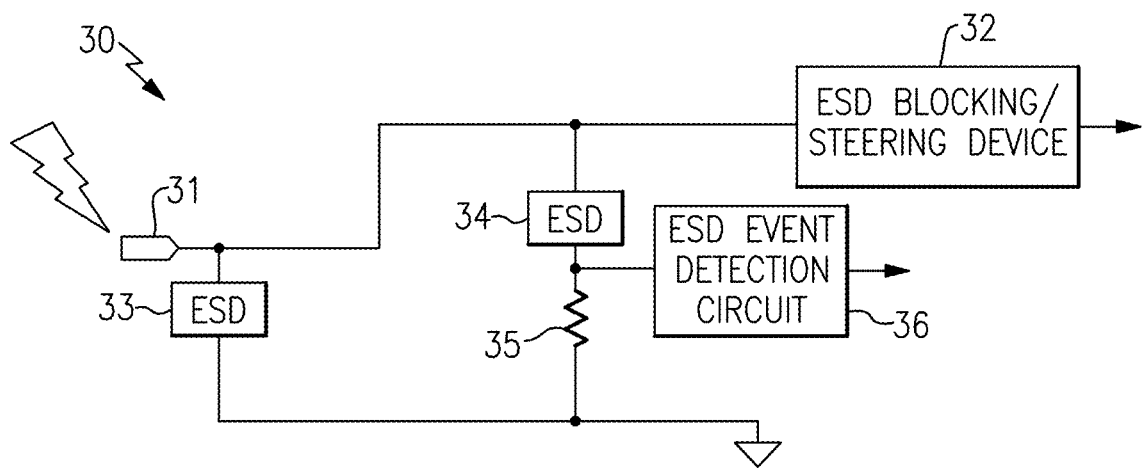
FIG. 35 is a schematic diagram of a portion of an illustrative electronic device configured to detect an electrical overstress event at a pin of the electronic device according to an embodiment.

EOS events can be detected at various nodes in an electronic device in accordance with the principles and advantages discussed herein. The EOS event detection discussed herein can be sensed at a pin of an electronic device in certain embodiments. FIG. 35 is a schematic diagram of a portion of an illustrative electronic device 30 configured to detect an electrostatic discharge event at a pin 31 of the electronic device 30 according to an embodiment. As shown in FIG. 35, an ESD event can occur at the pin 31, which can be any suitable input/output (I/O) pin, and the ESD event can be sensed at the pin 31. An ESD sense device 34 can be disposed between the pin 31 and ESD event detection circuit 36, which is an example of the detection circuit 16 of FIG. 33. The ESD event detection circuit 36 can provide information indicative of an occurrence of an ESD event to a memory and/or reporting circuit (not illustrated) similar to in FIG. 33. In FIG. 35, resistor 35 is disposed between the ESD sense device 34 and ground. As illustrated, the resistor is also disposed between an input to the ESD event detection circuit 36 and ground. An ESD protection device 33 can protect the ESD sense device 34 and the resistor 35. The ESD protection device 33 can also protect any other circuitry electrically connected to the pin 31. The ESD protection device 33 is in parallel with the series combination of the ESD sense device 34 and the resistor 35 in FIG. 35. An ESD blocking/steering device 32 can be disposed between the pin 31 and an internal circuit (not illustrated).

Figure 36:
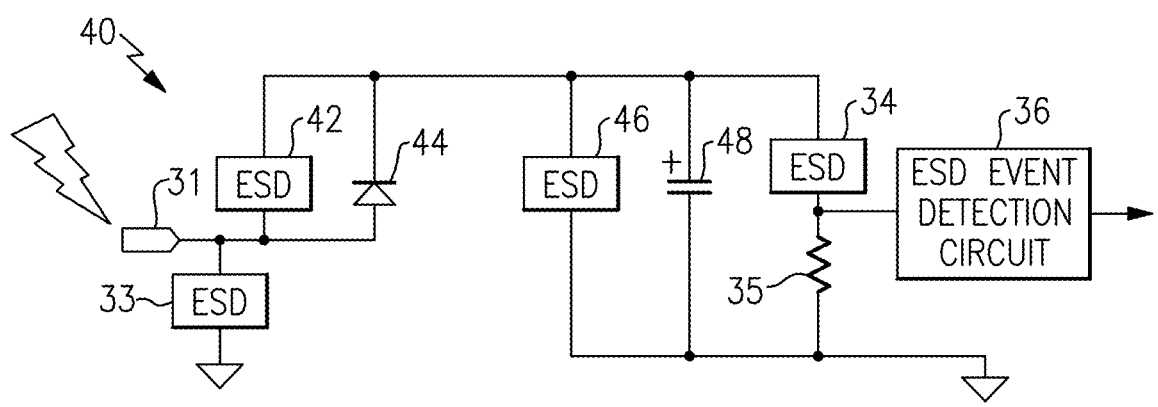
FIG. 36 is a schematic diagram of a portion of an illustrative electronic device configured to detect electrical overstress events across a storage element according to an embodiment.

EOS events can alternatively or additionally be sensed across certain circuit elements. Accordingly, information indicative of the functional safety of certain circuit elements can be recorded and/or reported. FIG. 36 is a schematic diagram of a portion of an illustrative electronic device 40 configured to detect an electrostatic discharge event across a storage element according to an embodiment. In FIG. 36, energy associated with an ESD event can be stored as charge across a capacitor 48. More details regarding such energy harvesting will be provided later. The ESD event detection circuit 36 of FIG. 36 can detect an ESD event across the capacitor 48. The ESD event detection circuit 36 of FIG. 35 can include a counter to track the number of ESD events detected across the capacitor 48. The ESD event detection circuit 36 of FIG. 36 can detect an intensity of an ESD event, for example, by detecting a voltage across resistor 35 associated with the ESD event. In FIG. 36, the first ESD protection device 34 and the resistor 35 function similar to in FIG. 35. The first ESD protection device 34 can be a high impedance ESD protection device, which can be triggered by a level of an ESD event that is desired to monitor. As such, the first ESD protection device 34 need not match the other illustrated ESD protection devices 33, 42, and/or 46 and/or the diode 44. The high impedance of the first ESD protection device 34 can limit current through the resistor 35 and may conduct a relatively small percentage of current associated with an ESD event.

In FIGS. 35 and 36, the ESD sense device 34 can be or include an EOS monitor device including a pair of conductive structures having a gap therebetween, as describe supra according to some embodiments (e.g., FIGS. 7A, 7B). In addition, the resistor 55 can be or include a fuse, as describe supra according to some embodiments (e.g., FIGS. 7A, 7B).

Various detection circuits 36 can be implemented to detect an EOS event. The detection circuit 36 can include any suitable circuit configured to detect an EOS. Four illustrative detection circuits 36a, 36b, 36c, and 36d will be described with reference to FIGS. 37, 38, 39 and 40, respectively. These detection circuits are example detection circuits that can be implemented in connection with any of the principles and advantages discussed herein. Moreover, features of the any of the example detection circuits can be implemented in combination with any of the other example detection circuits.

Figure 49:
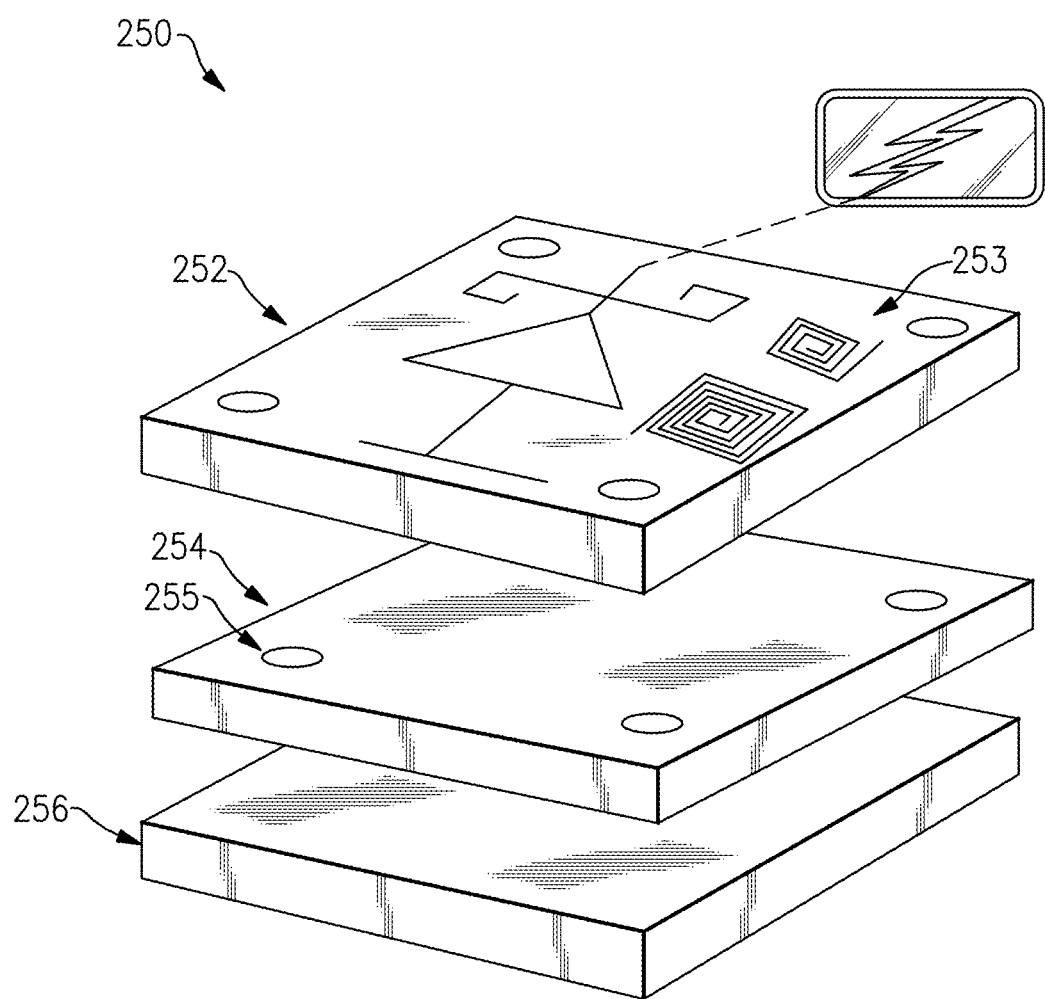
FIG. 49 illustrates an example of a vertically integrated system with scaled up structures capable of harnessing an electrical overstress event for storing charge according to an embodiment.

FIG. 49 is a schematic diagram that includes a detection circuit 36a and an ESD protection device 34 according to an embodiment. The detection circuit 36a includes a comparator. As illustrated, the resistor 35 is disposed between the ESD protection device 34 and ground. A voltage generated across the resistor 35 can be compared to a reference voltage VREF. The resistance of the resistor 35 and the reference voltage can be selected such that ESD events above a threshold level trigger the comparator to indicate that an ESD event has occurred. The resistance of the resistor 35 can be selected such that the voltage across the resistor 35 provided to the comparator is at a voltage level that is unlikely to damage the comparator. The comparator can be implemented by any suitable circuitry configured to detect when the voltage across the resistor 35 exceeds a threshold that indicates that an ESD event has occurred.

Figure 38:
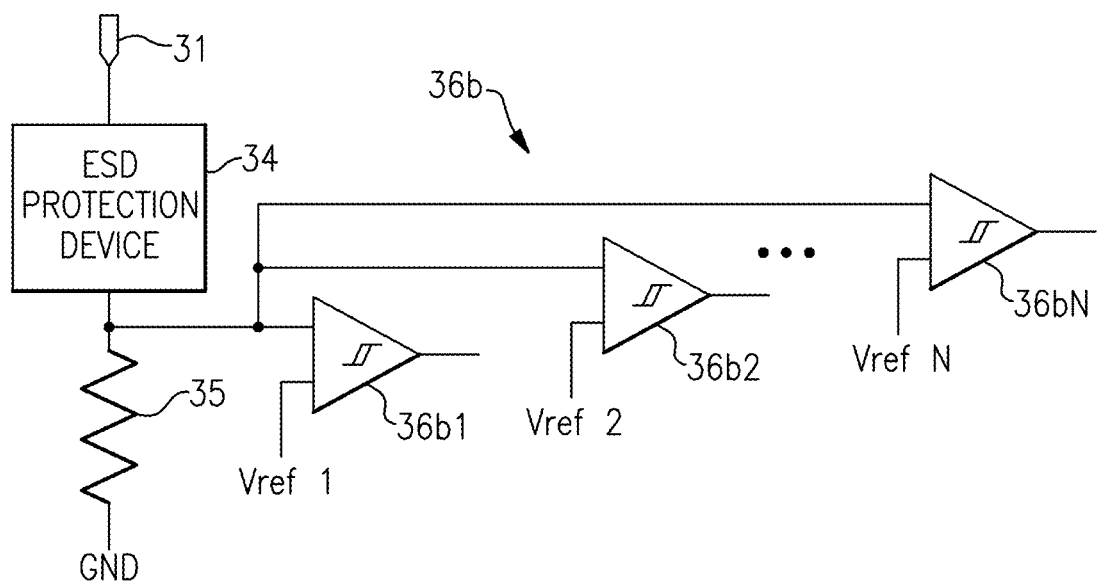
FIG. 38 is a schematic diagram that includes a detection circuit and an electrical overstress protection device according to another embodiment.

FIG. 38 is a schematic diagram that includes a detection circuit 36b and an ESD protection device 34 according to another embodiment. The detection circuit 36b includes a plurality of comparators 36b1, 36b2, and 36bN that are each configured to compare the voltage across the resistor 35 to a different reference voltage (VREF1, VREF2, and VREFN, respectively). Any suitable number of comparators can be implemented. Using the plurality of comparators 36b1, 36b2, and 36bN, an intensity or level of an ESD event can be detected. The level of the ESD event can correspond to the magnitude of the highest reference voltage provided to a comparator of the plurality of comparators that detects an occurrence of an ESD event. As such, the detection circuit 36b can detect an occurrence of an ESD event and an intensity of the ESD event.

Figure 39:
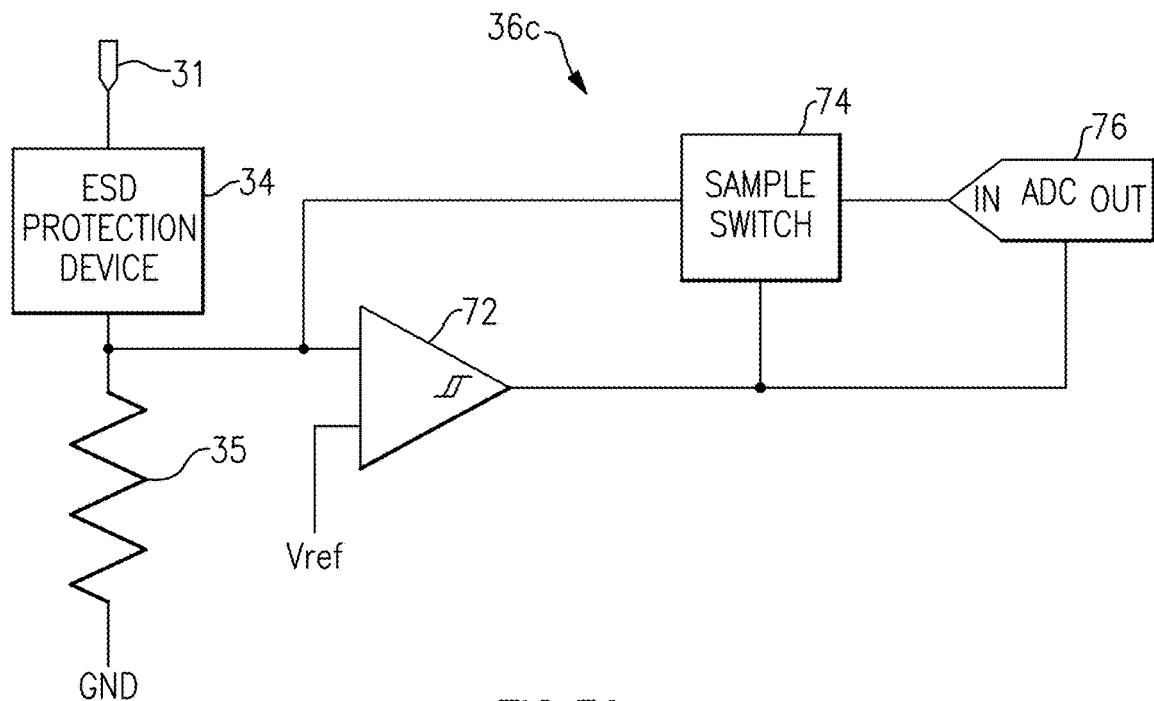
FIG. 39 is a schematic diagram that includes a detection circuit and an electrical overstress protection device according to another embodiment.

FIG. 39 is a schematic diagram that includes a detection circuit 36c and an ESD protection device 34 according to another embodiment. As illustrated, the detection circuit 36c includes a comparator 72, a sample switch 74, and an analog-to-digital converter (ADC) 76. The ADC 76 can be used to determine a level of an ESD event. Like the detector circuit 36a of FIG. 37, the comparator 72 can detect an occurrence of an ESD event. Responsive to detecting an occurrence of an ESD event above a level determined by the resistance of resistor 35 and the voltage level of the reference voltage VREF, the output of the comparator 72 is toggled. This can cause the sample switch 74 to sample the voltage across the resistor 35. The sampled voltage can be converted to a digital voltage level by the ADC 76. The output of the ADC 76 can be indicative of a level of the ESD event. As such, the detection circuit 36c can provide information associated with a detected ESD event, which can indicate an occurrence of the ESD event and a level associated with the ESD event.

Figure 40:
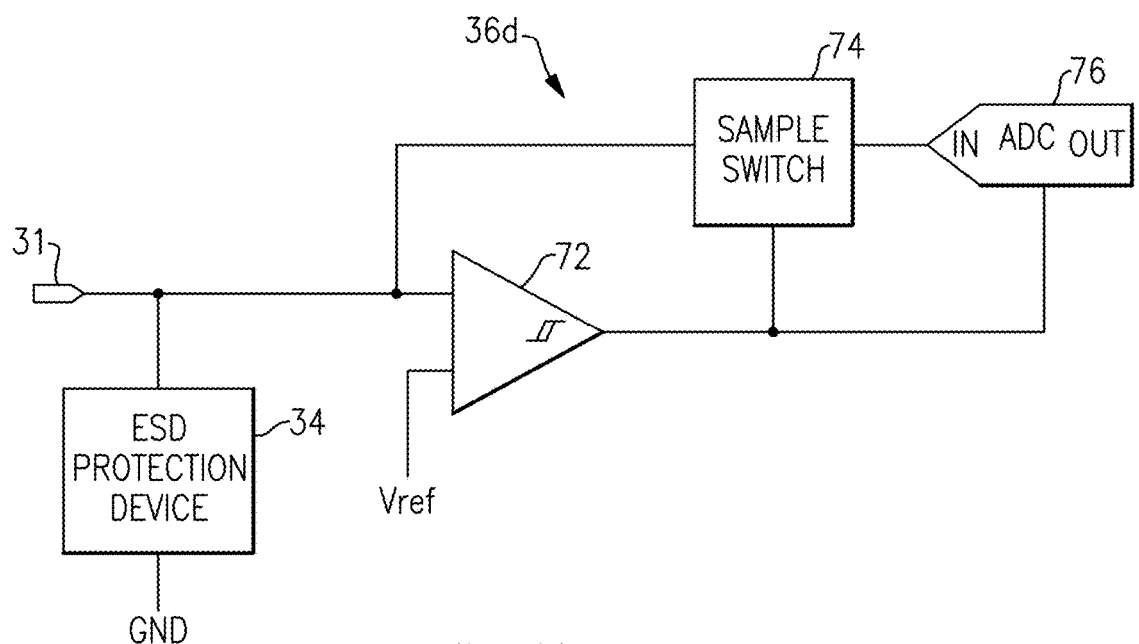
FIG. 40 is a schematic diagram that includes a detection circuit and an electrical overstress protection device according to another embodiment.

FIG. 40 is a schematic diagram that includes a detection circuit 36d and an ESD protection device 34 according to another embodiment. The detection circuit 36d is similar to the detection circuit 36c except a voltage across the ESD protection device 34 is used to trigger the comparator 72 and to detect a level of the ESD event. When the ESD protection device 34 is triggered, it can go into snapback mode and hold at a holding voltage with a resistance. The holding voltage can be used to detect an occurrence of an ESD event and the level of the ESD event. The ESD protection device 34 can be characterized and then characterization data can be used to determine the level of the ESD event.

In FIGS. 37, 38, 39 and 40, the ESD protection device 34 can be or include an EOS monitor or protection device including a pair of conductive structures having a gap therebetween, as describe supra according to some embodiments (e.g., FIG. 5A, FIG. 7A). In addition, the resistor 35 can be or include a fuse, as describe supra according to some embodiments (e.g., FIG. 7A).

Various memories can store information indicative of an electrical overstress event detected by the detection circuits discussed herein. Such memories can include non-volatile memories and/or volatile memories.

Figure 41:
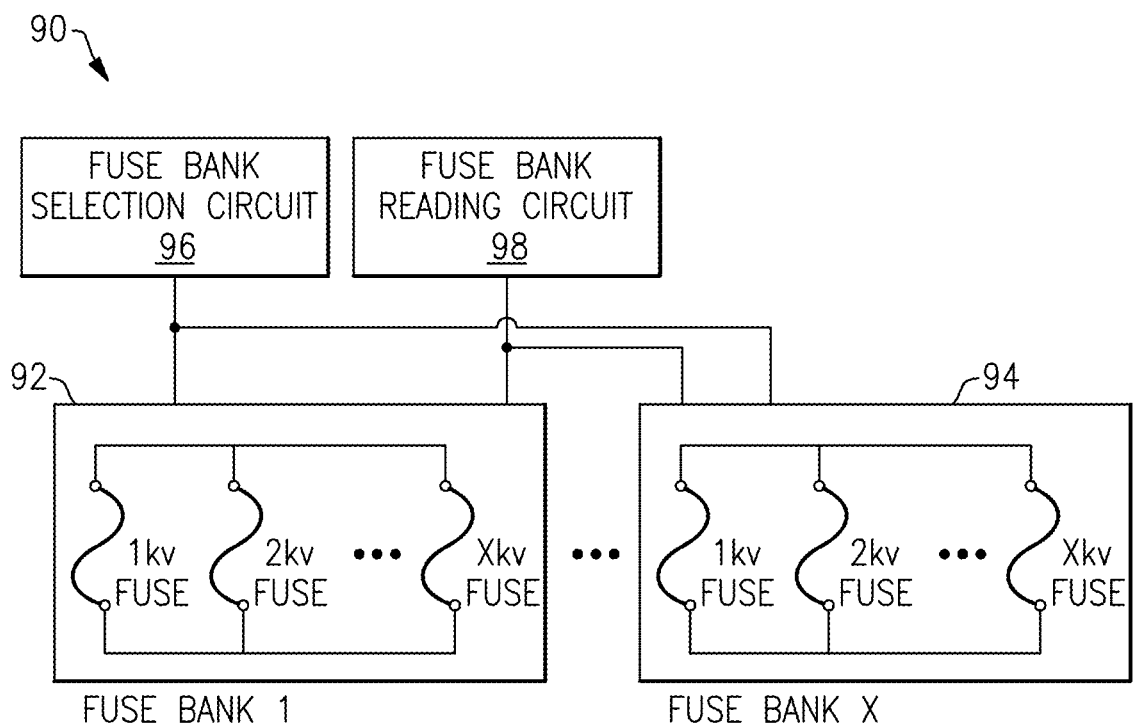
FIG. 41 is a schematic diagram of an illustrative circuit that is configured to detect and store information associated with electrical overstress events according to an embodiment.

In certain embodiments, detecting an EOS can be implemented by memory elements configured to store data under certain conditions. FIG. 41 is a schematic diagram of illustrative detection and memory circuit 90 that is configured to detect and store information associated with an ESD event according to an embodiment. The detection and memory circuit 90 can implement the functionality of the detection circuit 16 and the memory 17 of FIG. 33.

The detection and memory circuit 90 includes fuses. Fuses are one type of nonvolatile memory that can store data and/or alter the functionality of a device post manufacture. The detection and memory circuit 90 includes fuse banks 92 and 94, a fuse bank selection circuit 96, and a fuse bank reading circuit 98. The fuses of one or more of the fuse banks can be configured to blow at predetermined ESD event levels. Different fuses of a selected fuse bank can blow at different ESD event levels. The fuse bank reading circuit 98 can read from one or more of the fuse banks 92 and 94 to determine whether an ESD event has occurred and a level associated with the ESD event. For instance, if any of the fuses are blown, the occurrence of an ESD event can be detected. The level associated with the ESD event can be detected based on which fuse(s) are blown. The detection and memory circuit 90 can operate even when an electronic device is not powered. The fuses can be one-time programmable such that once a fuse in a fuse bank is blown, the fuse bank selection circuit 96 can select a different fuse bank to detect an ESD event. The detection and memory circuit 90 can detect ESD events of both a positive and a negative polarity. While FIG. 41 is described with reference to fuses for illustrative purposes, the principles and advantages discussed with this figure can be applied to other fuse elements, such as anti-fuses, and/or to other memory elements that can be selectively activated by different voltages.

Figure 42:
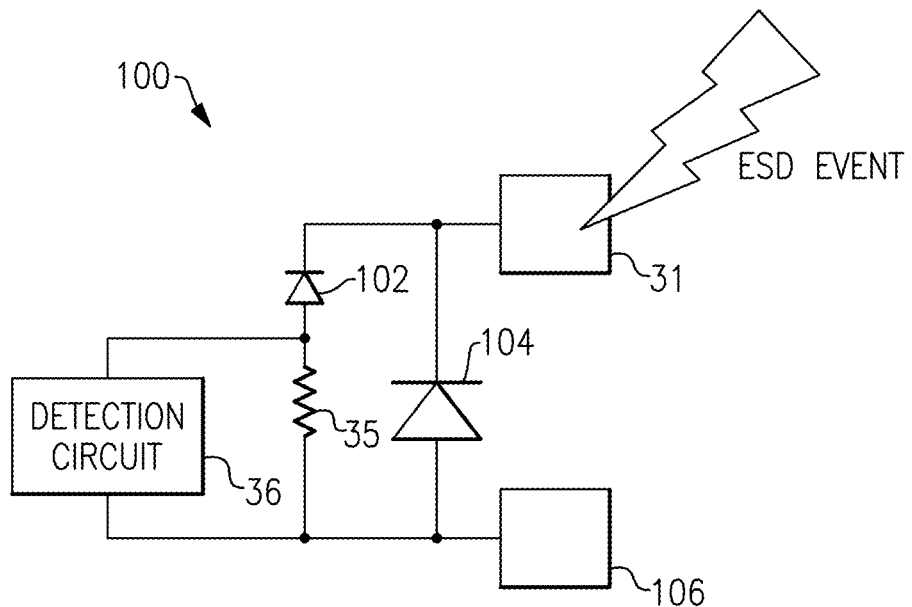
FIG. 42 is a schematic diagram of a portion of an electronic device with an electrical overstress event detection circuit according to an embodiment.

EOS event detection can detect non catastrophic EOS events that age a device without completely damaging the device. Such functionality can monitor a circuit with slightly lower breakdown than other circuits and provide aging information about the circuit. FIG. 42 is a schematic diagram of a portion of an electronic device 100 with an ESD event detection circuit 36 according to an embodiment. The electronic device includes a first ESD protection device 102 and second ESD protection device 104.

The first ESD protection device 102 can be a diode having a relatively low breakdown voltage and a relatively small physical area and the second ESD protection device 104 can be a diode having a relatively high breakdown voltage and a relatively large physical area. These ESD protection devices are illustrated as diodes, but other suitable ESD protection devices can alternatively be implemented. The first ESD protection device 102 can trigger at a lower voltage than the second ESD protection device 104. In an illustrative example, the first protection device 102 can trigger at about 6.5 Volts and the second ESD protection device 104 can trigger at about 7 Volts. The second ESD protection device 104 can handle more current than the first ESD protection device 102. A resistor 35 can be in series with the first ESD protection device 102, for example, to prevent thermal runaway and/or to provide a voltage for the detection circuit 36. In FIG. 36, the ESD protection device 102 can be replaced with or include an EOS monitor or protection device including a pair of conductive structures having a gap therebetween, as describe supra according to various embodiments (e.g., FIG. 5A, FIG. 7A). In addition, the resistor 35 can be or include a fuse, as describe supra according to various embodiments (e.g., FIG. 7A).

With the first ESD protection device 102, ESD events below the threshold for triggering the second ESD protection device 104 can be detected and associated data can be used to determine the age/state of "health" of a part. The ESD protection offered by the first ESD protection device 102 may not be sufficient to protect an internal circuit, but the ESD protection offered by the first ESD protection device 102 can provide a way to monitor what is happening in the second ESD protection device 104 without including a resistance, which should diminish the effectiveness of the second ESD protection device 104, in series with the second ESD protection device 104.

The detection circuit 36 can detect an ESD event using the voltage across the resistor 35. The detection circuit 36 can blow a fuse and/or load another memory each time an ESD event is detected. After a certain number of ESD events (e.g., 10 events) are detected, an alarm signal can be provided. For instance, the alarm signal can be toggled when all fuses can be blown and/or memory cells can overflow. The alarm signal can provide an alert to warn that a device has been aged by ESD events.

EOS detection circuitry can provide functional safety information at the die level and/or at a system level. At the die level, recording and monitoring EOS events can provide an indication of the functional safety of the die. Such information can be reported external to the die. An alarm signal can be provided external to the die to provide a warning about the functional safety of the die and/or to suggest that action be taken, such as replacement of the die. At the system level, detecting EOS events can provide information about functional safety at a system level. Such information can be used for predictive maintenance, for example.

Functional safety circuitry configured to detect EOS events can be incorporated within a die and/or at a system level. For some expensive and/or custom integrated circuit systems where monitoring reliability and/or quality is desirable, having the capability of sensing EOS events (e.g., current surges and/or voltage surges applied from external to the system) and being able to record and to provide information associated with the detected EOS events, e.g., externally, can be advantageous. Such information can be provided external to the integrated circuit system and/or can set an alarm within the integrated circuit system to indicate that there is a functional safety issue. Functional safety circuitry can be implemented in a variety of contexts including stacked die and/or prefabricated layers/components within a 3D vertically integrated system. According to various embodiments, functional safety circuitry configured for detecting EOS events can be implemented as: a standalone device having the safety circuitry integrated therein; as a portion of an integrated circuit die configured to provide functional safety at a single die level; as part of a component/chip/prefabricated structure that includes the functional safety circuitry such that the functional safety of a system in package (SIP)/module can be monitored and communicated (e.g., wirelessly); or as part of a module/SIP/vertically integrated system that contains the functional safety circuitry such that the "health"/lifespan/effectiveness of an external protection device (e.g., external diode) is monitored and external communications/alarms are activated under some circumstances.

Figure 43:
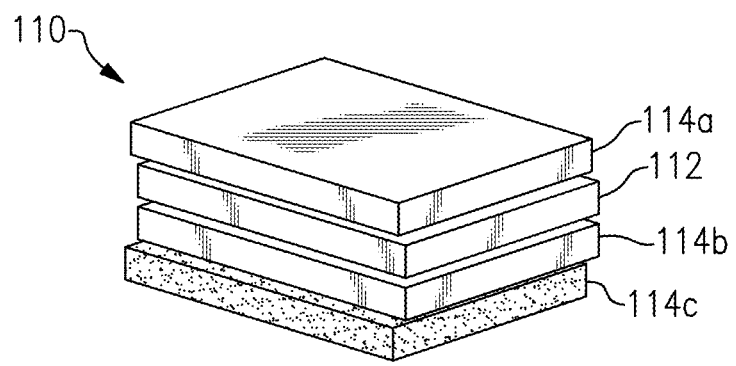
FIG. 43 is a diagram of stacked dies including a die that includes functional safety circuitry according to an embodiment.

FIG. 43 is a diagram of stacked die 110 including a die 112 that includes functional safety circuitry according to an embodiment. The stacked die 110 can include the die 112 stacked with one or more other dies 114a, 114b, 114c. The functional safety circuitry can implement any combination of features discussed herein associated with detecting an EOS event, storing information associated with the EOS event, reporting the EOS event, providing EOS and/or ESD protection, the like, or any combination thereof. For instance, the functional safety circuitry of the die 112 can detect and record an overvoltage event or another EOS event. In some instances, the functional safety circuitry can record an intensity, a duration, a frequency, or any combination thereof of the EOS event. The functional safety circuitry can transmit the recorded information externally to a device outside the stacked die 110, e.g., wirelessly by way of an antenna in an embodiment.

Figure 44:
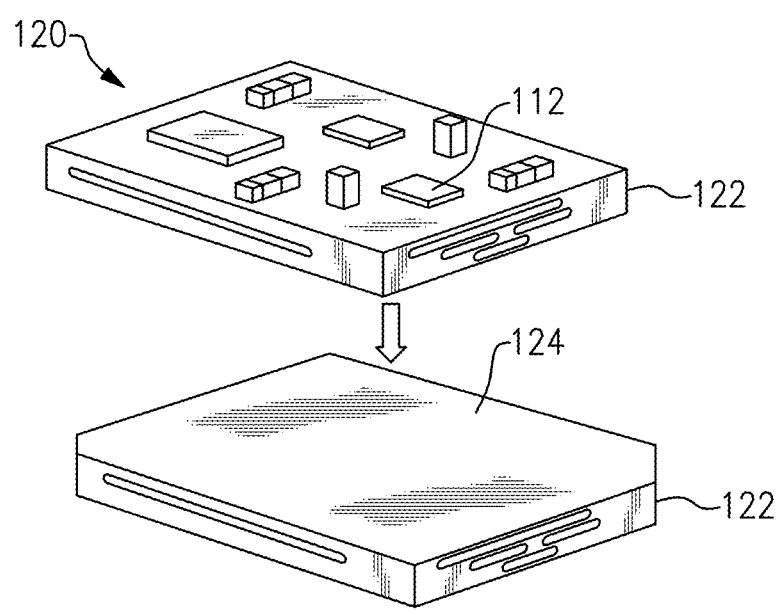
FIG. 44 is a diagram of a system in a package that includes functional safety circuitry according to an embodiment.

FIG. 44 is a diagram of a system in a package (SIP) 120 that includes functional safety circuitry according to an embodiment. A die 112 that includes functional safety circuitry can be disposed on a circuit board 122 with other components. The die 112 and the other components can be encased within a single package. The system in a package 120 can include an encapsulant and/or a mold compound 124 that encapsulates the die 112 and other components. In this embodiment, the functional safety circuitry can provide indicators as to the effective health of the system. The indicators can be communicated externally from the system by the die 112 and/or the other components, for example, wirelessly or by being provided to an output contact of the system in a package 120.

Figure 45:
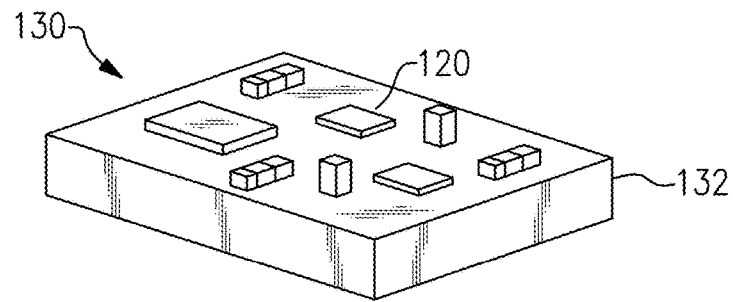
FIG. 45 is a diagram of a system that includes functional safety circuitry according to an embodiment.

FIG. 45 is a diagram of an integrated circuit system 130 that includes functional safety circuitry according to an embodiment. The integrated circuit system 130 can be arranged to provide functionality targeted to a variety of applications. For instance, the integrated circuit system 130 can be an automotive electronics system configured for automotive applications (e.g., power steering). As another example, the integrated circuit system 130 can be a vehicular electronics system, such as an avionics electronics system configured for aircraft applications. In another example, the integrated circuit system 130 can be a healthcare electronics systems configured for healthcare monitoring (e.g., monitoring a heart rate and/or monitoring another physiological parameter) and/or for other healthcare applications. The illustrated integrated circuit system 130 includes the system in a package 120 of FIG. 44 and other components on a system board 132. The functional safety circuitry of the system in a package 120 can provide information indicative of potential failures with protection devices of the integrated circuit system 130 that are external to the system in a package 120. For example, a faulty diode of the integrated circuit system 130 might fail to prevent certain undesired static currents and/or current surges. The functional safety circuitry of the system in a package 120 can monitor and record such EOS events. The functional safety circuitry can provide an external warning of such an issue. The functional safety circuitry can provide an indication of a life span of the integrated circuit system 130.

Figure 46:
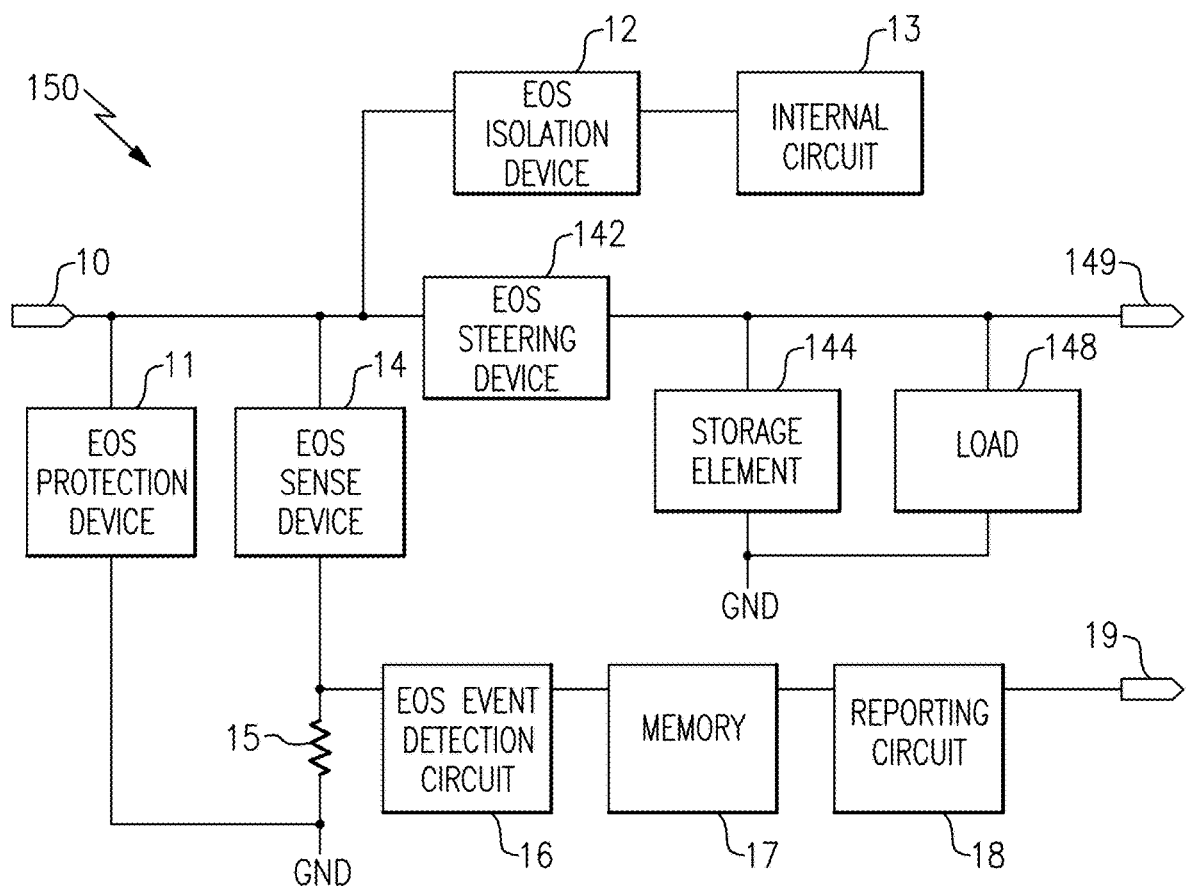
FIG. 46 is a schematic diagram of an illustrative electronic device that is configured to store charge associated with an electrical overstress event and to detect an occurrence of the electrical overstress event according to an embodiment.

FIG. 46 is a schematic diagram of an illustrative electronic device 150 that is configured to store charge associated with an electrical overstress event and to detect an occurrence of the electrical overstress event according to an embodiment. The electronic device 150 illustrates an example of how overstress monitoring circuitry can be combined with detection circuitry configured to detect an EOS event. Another example in the context of ESD events is shown in FIG. 36. In FIG. 46, the ESD sense device 14 can be or include an EOS monitor device including a pair of conductive structures having a gap therebetween, as describe supra according to some embodiments (e.g., FIG. 7A). In addition, the resistor 15 can be or include a fuse, as describe supra according to some embodiments (e.g., FIG. 7A).

Certain physical layouts of ESD protection devices can be implemented for high performance. The physical layouts discussed below can be implemented in connection with any of the EOS protection devices discussed herein. Example physical layouts are illustrated in FIGS. 47A to 47C.

Figure 47A:
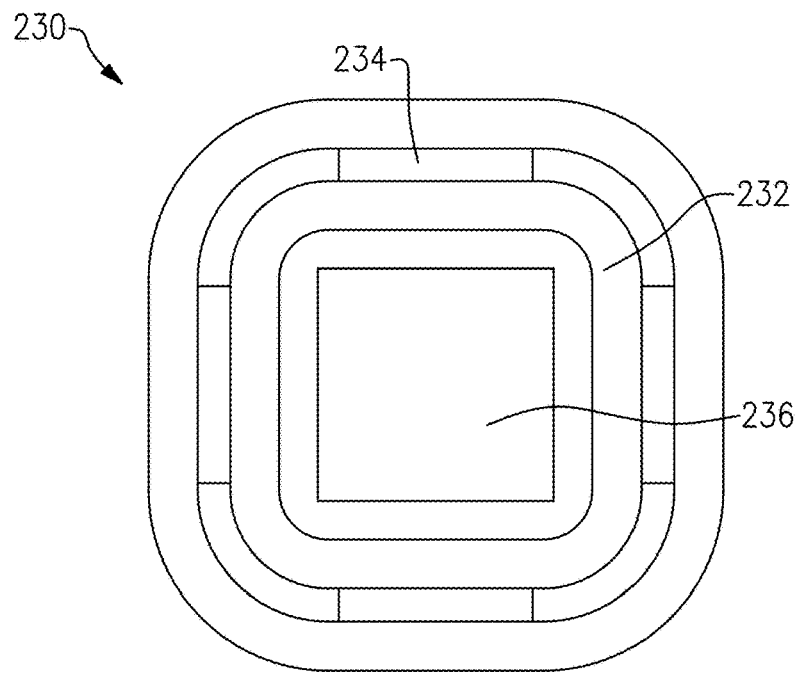
FIG. 47A is a plan view of an example layout of an electrical overstress protection device according to an embodiment.
Figure 47B:
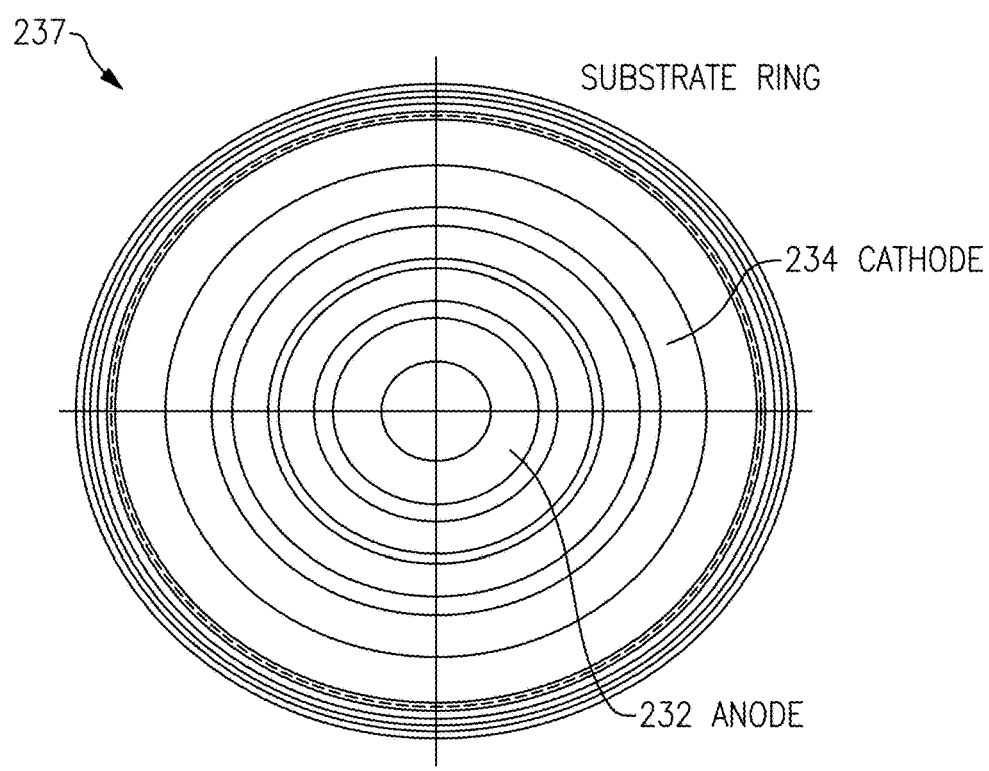
FIG. 47B is a plan view of another example layout of an electrical overstress protection device according to an embodiment.
Figure 47C:
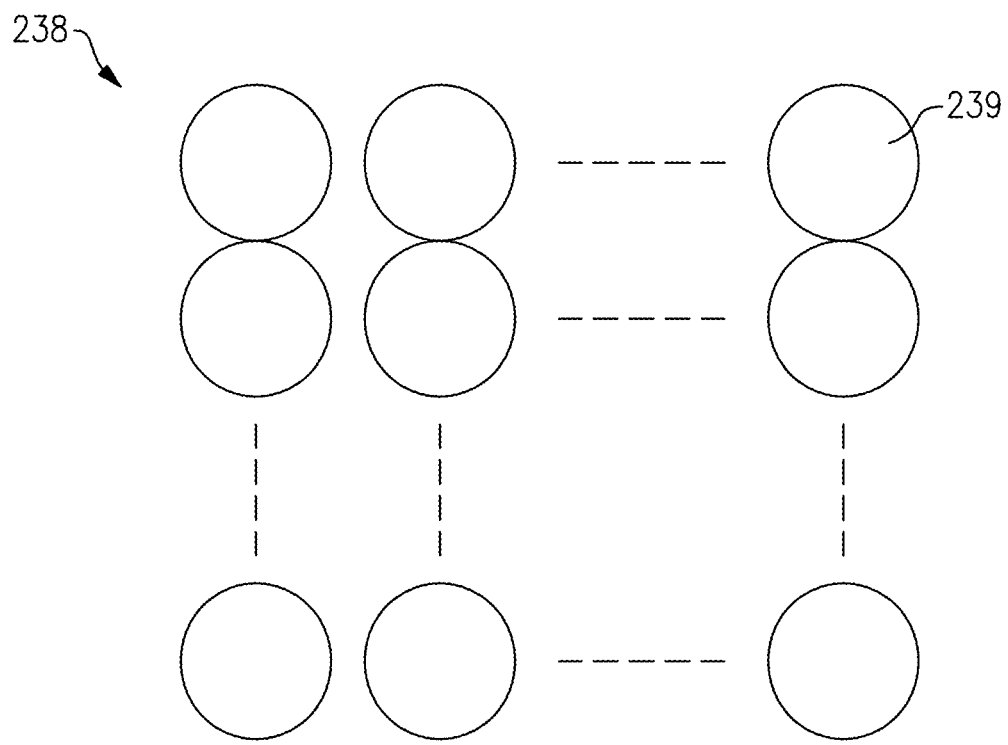
FIG. 47C is a plan view of another example layout of an electrical overstress protection device according to an embodiment.

FIG. 47A provides an example of a physical layout of an ESD protection device 230. In FIG. 47A, the ESD protection device is an annular structure in plan view. This can enable relatively high current handling capability. Anode 232 and cathode 234 of the ESD protection device 230 can be provided around a bond pad 236. The weakest point of an ESD protection device can be at the end of a finger, even with increased spacings, resistances and/or curvature, as this is the location of that typically has the highest electric field. An annular ESD silicon controlled rectifier (SCR) can be used for system level ESD protection to mimic a circular device enclosing a bond pad. Such an SCR can include any combination of features described in U.S. Pat. No. 6,236,087, the entire technical disclosure of which is hereby incorporated by reference herein.

An annularly shaped ESD protection device in plan view can have a relatively large perimeter area and hence a relatively large cross sectional area through which the current can flow. As one example, the perimeter can be about 400 µm and the diode junction can be about 3 µm deep, thus the cross section area can be about 1200 µm2. Additionally, with the annular structure, metal can come out from a bond pad on four sides. This can combine to substantially minimize the resistance to an ESD zap and hence the voltage experienced by sensitive circuitry internal in the chip can be substantially minimized. Another approach that may provide an even lower resistance path to an ESD zap is a pure vertical diode where the conduction is vertically down through the silicon. In such a diode, for a 100 µm by 100 µm pad, the cross section area is 10,000 µm2 and the metal resistance can also be relatively small as there can be a thick low resistance metal paddle on one side and a low resistance bond wire in close proximity on the other side.

In some instances, an ideal ESD device can be circular, as substantially the same electric field can be present along the entire a junction in such a structure. Circular ESD device layouts may not be area efficient and/or an inner anode can be smaller in junction area than an outer cathode. Circular ESD device layouts can conduct larger currents than some other common ESD layouts that consume approximately the same area. Circular ESD device layouts can conduct relatively large currents, such as currents associated with EOS events. Accordingly, such ESD device layouts can be desirable in certain applications in which an ESD device is used to harvest energy associated with an EOS event.

FIG. 47B provides an example of a physical layout of an ESD device 237. The physical layout of the ESD device 237 is a relatively large circular shape in plan view. This can reduce the difference between junction area between the anode 232 and the cathode 234.

FIG. 47C provides an example of a physical layout of an ESD device 238. The ESD device 238 is implemented by a relatively dense array of smaller circular ESD devices 239. The smaller circular ESD devices 239 can be butted against each other laterally and/or vertically. An array of smaller circular ESD devices 239 can be implemented in wearable computing devices such as smart watches, for example.

Figure 48:
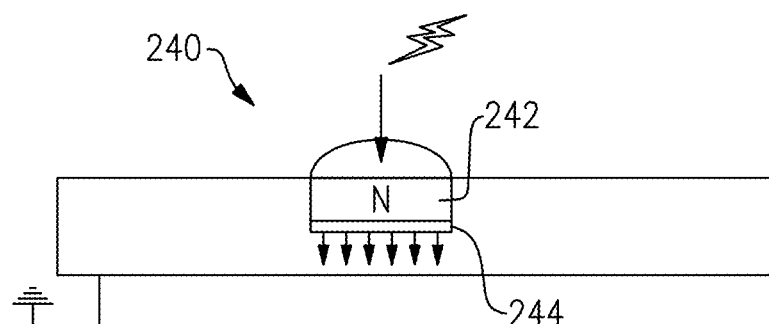
FIG. 48 illustrates another electrical overstress protection device where the current surge is conducted vertically through to the layer below according to an embodiment.

FIG. 48 illustrates another ESD protection device 240 where the current surge is conducted vertically through to the layer below. In the ESD protection device 240, current can be dissipated to ground through surface 244 below N region 242. Considering the N region 242 as a half cylinder, the ESD protection device 240 can be capable of carrying a larger current compared to an annular ESD protection structure, as the ESD protection device 240 has a larger area 244 than a corresponding annularly shaped ESD protection device. These principles can be applied when optimizing the current carrying capabilities of the structures harnessing the ESD zaps/current surges.

Figure 37:
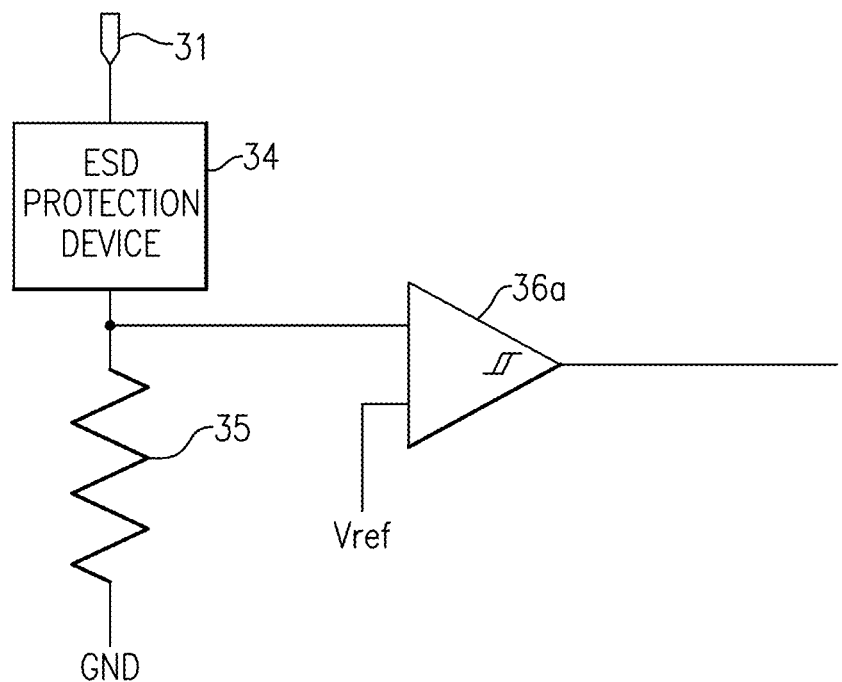
FIG. 37 is a schematic diagram that includes a detection circuit and an electrical overstress protection device according to an embodiment.

In some embodiments, scaled up structures capable of harnessing an EOS event for storing charge associated with the EOS event can be provided within a vertically integrated system. FIG. 37 provides an example of a vertically integrated system 250 with such functionality. The vertically integrated system 250 can include segregated and/or scaled up EOS protection devices so that it can handle larger surges and/or to link with a storage layer. The vertically integrated system 250 includes an ESD protection layer 252, an insulating layer 254, and a storage layer 256. The ESD protection layer 252 can include ESD protection devices. In some embodiments, the ESD protection layer 252 can include a detection circuit to detect an ESD event. The ESD protection layer 252 can include coils 253 or other structures that enable signals to be sent wirelessly external to the vertically integrated system 250. Alternatively or additionally, one or more other layers of the vertically integrated system 250 can include coils 253 or other structures that enable signals to wirelessly be sent external to the vertically integrated system 250. The coils or other structures can send information indicative of an ESD event and/or a warning that an external system safety protection is faulty. The insulating layer 254 can serve to insulate the ESD protection layer 252 from the storage layer 256. One or more vias 255 and/or other electrical paths can allow charge to flow from the ESD layer to the storage layer 256. The storage layer 256 can include one any of the storage elements discussed herein, such as one or more capacitors and/or other storage elements configured to store charge associated with an ESD event. Charge stored in the storage layer 256 can be provided to other circuits.

Figure 50:
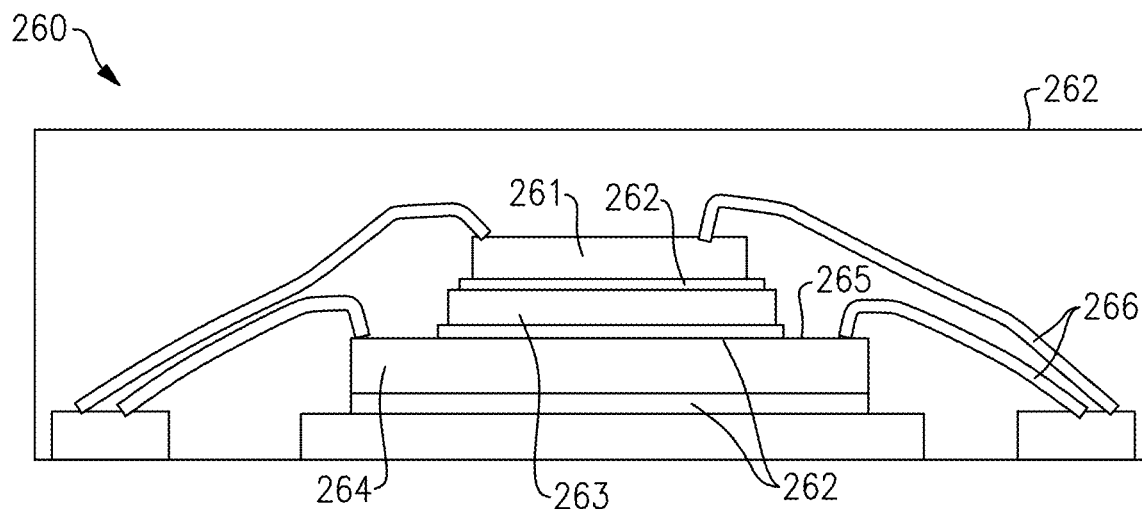
FIG. 50 is a schematic diagram of a vertically integrated system that includes electrical overstress protection and overstress monitoring circuitry according to an embodiment.

FIG. 50 is a schematic diagram of a vertically integrated system 260 that includes ESD protection and overstress monitoring circuitry according to an embodiment. The vertically integrated system 260 includes an ESD protection chip 261, a storage chip 263, and an application specific integrated circuit (ASIC) 264 having an active side 265. Wire bonds 266 can provide electrical connections to the ESD protection chip 261 and/or the ASIC 264. A mold compound 267 can encase the other illustrated elements within a single package. The ESD protection chip 261 can include ESD protection devices configured to provide energy associated with ESD events to storage elements of the storage chip 263. As illustrated, the ESD protection chip 261 and the storage chip 263 are arranged in a vertical stack with the ASIC 264. Insulating layers 262, such as dielectric or other die attach layers, are illustrated between the different chips in FIG. 38.

By having ESD protection devices on a separate chip from the ASIC 264, the ESD protection devices can be configured to handle ESD events having a greater magnitude than if the ESD protections devices were to be included on the ASIC 264. The ESD protection chip 261 is electrically connected to the storage chip 263. The storage chip 263 can be electrically connected to the ASIC 264. The electrical connections between chips in FIG. 38 can include wire bonds, through silicon vias, etc. The storage layer 263 can power the operation of the ASIC 264 using energy harvested from an ESD event. The integrated circuit system 260 can provide a system within a package where externally generated EOS events can be used to power the ASIC 264. Even if a relatively small amount of power is harvested from EOS events, the cumulative reduction in total system power can be significant in time if the total system included a relatively large number (e.g., hundreds or thousands) of vertically integrated systems.

Figure 51:
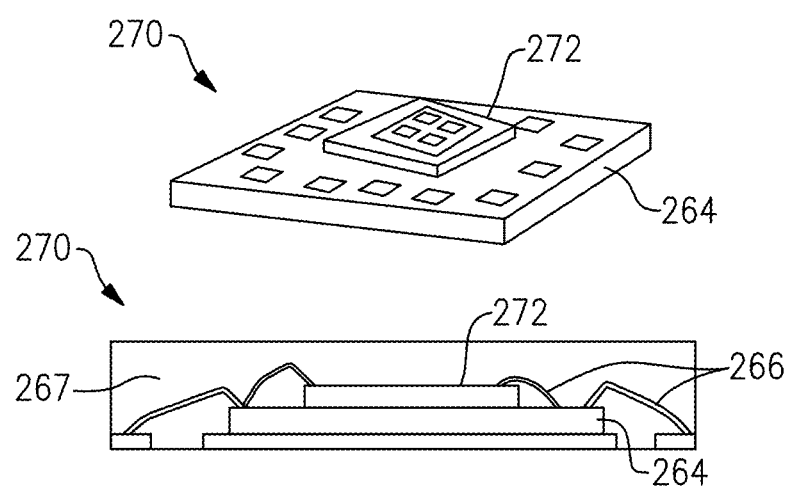
FIG. 51 is a schematic diagram of a vertically integrated system that includes electrical overstress protection and overstress monitoring circuitry on a single chip according to an embodiment.

FIG. 51 is a schematic diagram of a vertically integrated system 270 that includes ESD protection and overstress monitoring circuitry on a single chip according to an embodiment. A combined ESD protection and storage chip 272 includes circuitry capable of harnessing energy from ESD events and storage elements configured to store charge associated with the ESD events. Combined ESD protection and storage chip 272 can be stacked with an ASIC 264. Combining the ESD protection devices and storage elements in a single die can reduce height of the vertically integrated system relative to two separate die stacked in a pyramid configuration. Combining the ESD protection devices and storage elements in a single die can reduce the length and/or resistance of a path from a surge conduction point and storage elements relative to two separately stacked die. The ASIC 264 can receive charge from storage elements of the combined ESD protection and storage chip 272. Having the overstress monitoring circuitry on a different chip than the ASIC can allow EOS protection devices, such as ESD protection devices, to be scaled up to store charge from larger EOS events, such as larger ESD events.

Figure 52:
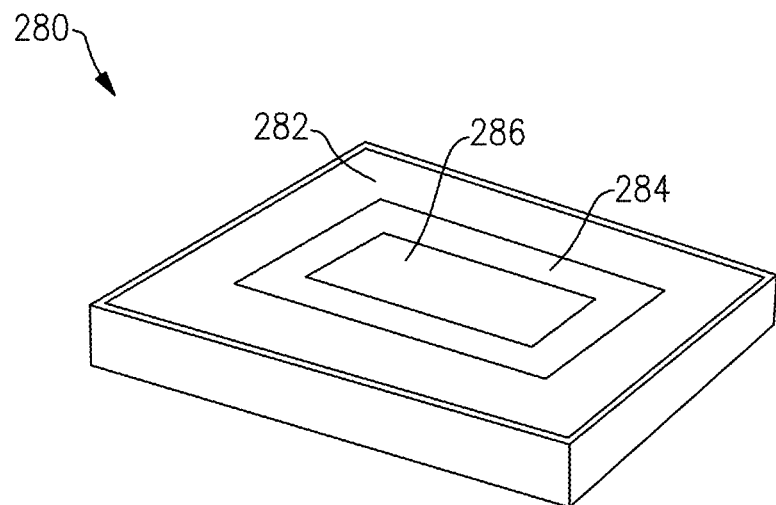
FIG. 52 illustrates a die with electrical overstress protection devices, storage elements, and processing circuitry according to an embodiment.

FIG. 52 illustrates a die 280 with EOS protection devices 282, storage elements 284, and processing circuitry 286 according to an embodiment. At a micro level, the EOS protection devices 282 can be segregated from the storage elements 284 and the processing circuitry 286 within the same die 280. In the illustrated embodiment, the die 280 is compartmentalized to deliver a system within a chip where the storage elements 284 are electrically connected to the processing circuitry 286 as a power source. As illustrated, the die 280 is partitioned into concentric type sections. The different sections of die 280 can be combined on a single semiconductor substrate, such as a silicon substrate. Trench isolation type fab processes where selective portions can be isolated from the substrate can be used to manufacture the different sections of the die 280.

Figure 53:
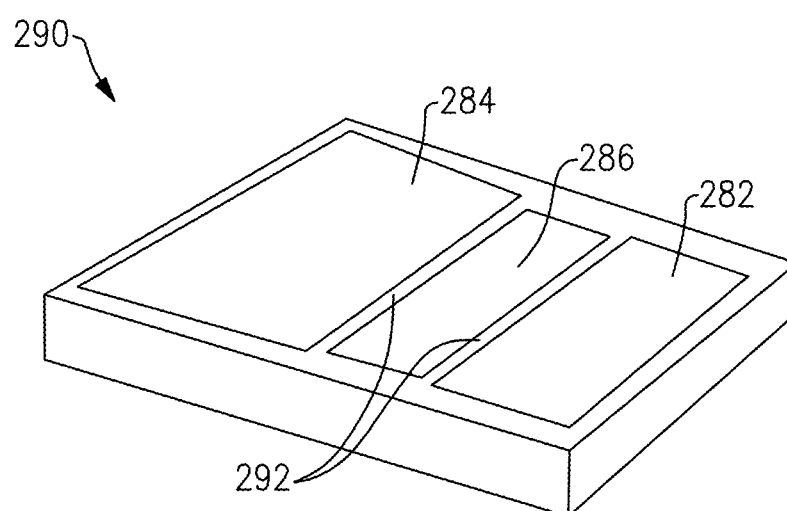
FIG. 53 illustrates a die with electrical overstress protection devices, storage elements, and processing circuitry according to another embodiment.

FIG. 53 illustrates a die 290 with EOS protection devices 282, storage elements 284, and processing circuitry 286 according to an embodiment. The die 290 includes a compartmentalized arrangement where the different sections of circuitry 282, 284, 286 are separated by an isolation barrier 292 and configured in a side by side arrangement. The isolation barrier 292 can include trench isolation. The trenches can includes insulating material, such as dielectric material. In an embodiment, an isolation layer can be included around some or all of the EOS protection devices of a compartmentalized die. Alternatively or additionally, an insulating layer, such as a dielectric layer, can cover the EOS protection devices 282 and/or the storage elements 284.

Figure 54A:
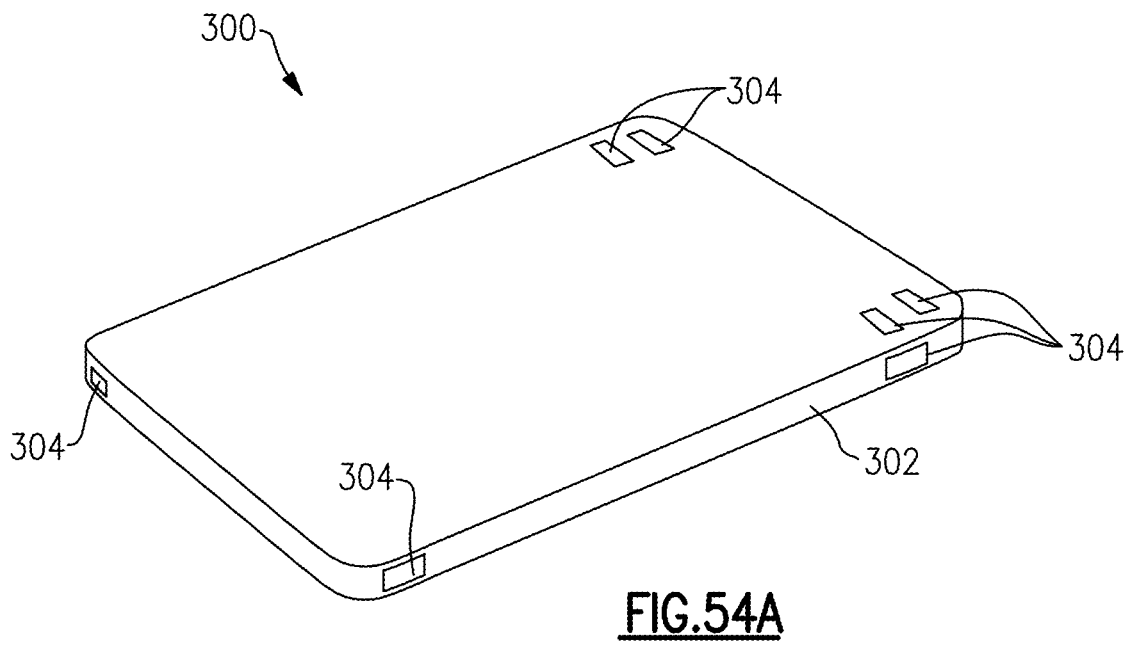
FIG. 54A illustrates an embodiment of a mobile device that includes an external casing having conduits embedded within the external casing according to an embodiment.
Figure 54B:
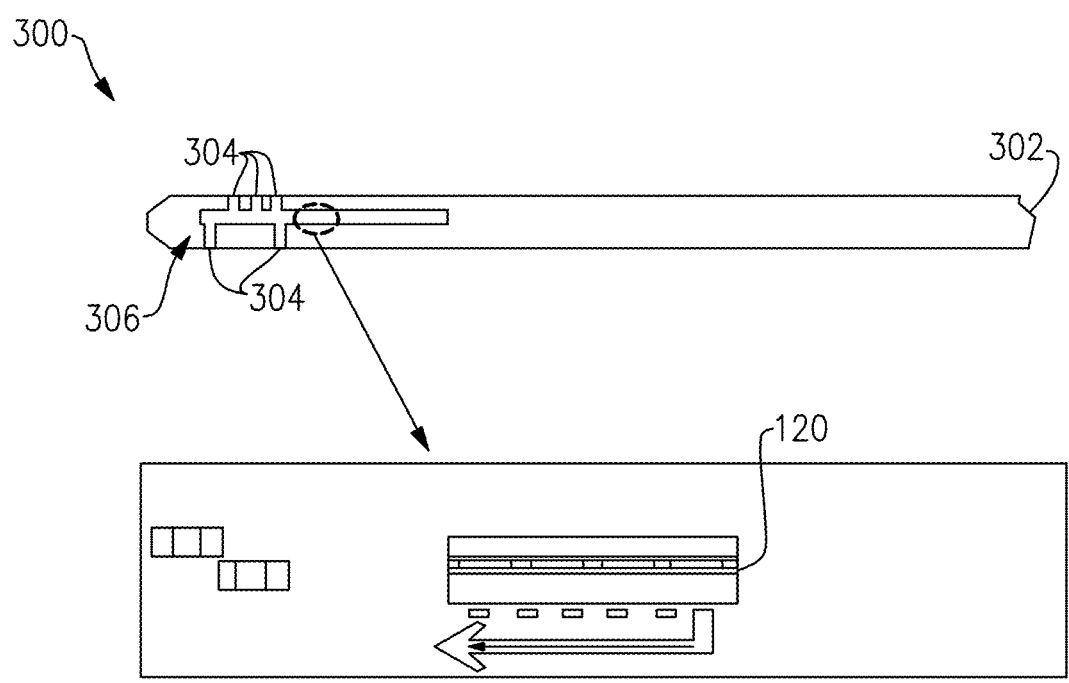
FIG. 54B illustrates an embodiment of a mobile device that includes an external casing having conduits embedded within the external casing according to an embodiment.

Overstress monitoring circuity can be implemented in mobile and/or wearable devices. FIGS. 54A and 54B illustrate an embodiment of a mobile and/or wearable device 300 that includes an external casing 302 having conduits 304 embedded within the external casing 302. Mobile devices, such as mobile phones and/or other handheld devices, can include conduits 304 that are arranged for harvesting external sources of charge, such as static charge. As shown in FIG. 54B, electrical connections 306 can route charge from conduits 304 to overstress monitoring circuitry. The overstress monitoring circuity can be embodied in a system in a package 120 as illustrated. The external casing 302 can be configured to enhance and/or optimize the delivery of charge to the overstress monitoring circuitry included within the external casing 302 of the mobile device. The mobile and/or wearable device 300 can also be incorporated within a system that is configured to enhance, e.g., to maximize, the EOS charge. For example, materials could be selected based on the triboelectric series such that the ESD generated is optimized/maximized. The wearable device could also be attached or connected to materials such that friction/movement/interaction while the device is being worn would enhance, e.g., maximize, the ESD charge generated. In some embodiments, the pair of conductive structures described above can serve as electrodes of storage capacitors for storing the energy collected from ESD charge generated in the wearable device 300. That is, similar to moving mechanical parts constructed from different materials that generate charge, similar principle can be applied to the wearable device 300.

For example, a mobile or wearable device can be incorporated with a wrist strap formed of different materials/fabrics such that movement (by the user) causes friction and/or movement between layers to generate charge. The material/garment can be constructed from different materials/composites/layers such that as the garment (or wearable device) is worn, it generates charge (which can subsequently be harvested through the conductive vias that route to the storage elements). For example, a material could be constructed with constituent parts/fibers/layers that are configured to rub together in response to flexing/movement of the wearer. A wrist strap (connected to a module similar to that shown in FIG. 54C which has conductive vias that can contact skin) could also be constructed with constituent parts/fibers/movable parts that rub together in response to movement by the wearer.

People generate charge through standard movement activities. Ground straps are used widely throughout the electronic industry to protect sensitive devices/systems from ESD generated by handling. The generation of an ESD charge can be enhanced for harvesting by constructing a garment/wrist strap/structure (and also be connected to other devices/components/circuits as shown in this filing) that can be placed next to skin. In certain applications (e.g., exercise/endurance activities), vigorous movements can generate sufficient amount of charge (combined with suitably constructed materials with the relevant circuitry and storage embedded therein to conduct/harvest/distribute the charge) to carry out certain relatively low power and/or intermittent functions. In other applications, (e.g., healthcare) the wearable device 300 can be configured to harvest sufficient energy to power some monitoring activities.

Figure 54C:
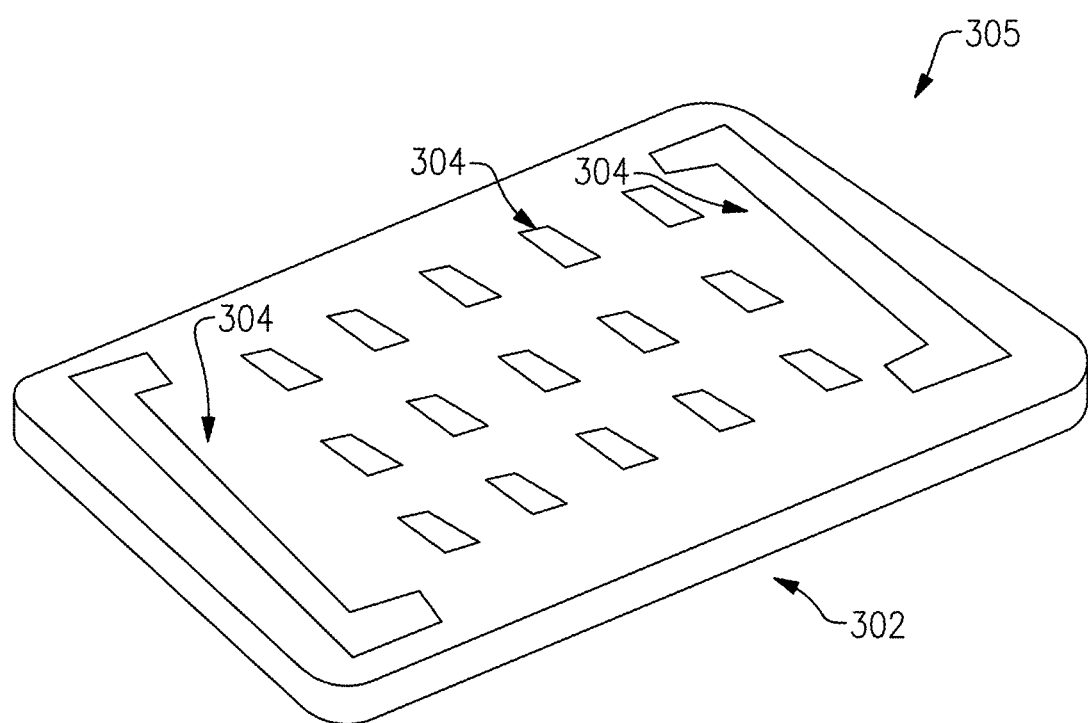
FIG. 54C illustrates an embodiment of a wearable device that includes an external casing having conduits embedded within the external casing according to an embodiment.

Any combination of features of the mobile device 300 can be applied to any suitable wearable device, such as a smart watch and/or a wearable healthcare monitoring device. For instance, any of the principles and advantages of the embodiments of FIGS. 54A and/or 54B can be applied to a wearable device. FIG. 54C illustrates a wearable device 305 with an external casing 302 and conduits 304. The wearable device 305 can be configured to be in contact with skin. The conduits 304 on the external casing 302 can be arranged to enhance and/or optimize the harvesting of charge from EOS events from external sources. The shape and/or arrangement of materials of the conduits 304 can enhance and/or optimize the harvesting of charge. For example, materials could be selected based on the triboelectric series such that any ESD generated is optimized/maximized. The wearable device could also be attached or connected to materials such that any friction/movement/interaction while the device is being worn would maximize the ESD charge generated. This could be achieved by combining different materials that would interact/rub together while being worn. For example the strap of a smart watch/medical device could be constructed from materials that (based on the triboelectric series) would generate maximum ESD charge while being worn. Also, the storage elements (to harvest charge)/conduits (from storage elements to site of ESD event)/and the systems to distribute the charge could be embedded within garments/fabrics specifically constructed to generate/harvest ESD.

CONCLUSION

In the embodiments described above, apparatus, systems, and methods for sensing electrical overstress events are described in connection with particular embodiments. It will be understood, however, that the principles and advantages of the embodiments can be used for any other systems, apparatus, or methods with a need for sensing and/or protecting against electrical overstress events.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog to digital converts, amplifiers, rectifiers, programmable filters, attenuators, variable frequency circuits, etc. Examples of the electronic devices can also include memory chips, memory modules, circuits of optical networks or other communication networks, and disk driver circuits. Consumer electronic products can include, but are not limited to, wireless devices, a mobile phone (for example, a smart phone), cellular base stations, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a wrist watch, a smart watch, a clock, a wearable health monitoring device, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A device configured to monitor electrical overstress (EOS) events, the device comprising:
a spark gap structure comprising first and second electrodes configured to electrically arc in response to an EOS event, wherein the spark gap structure further comprises a probe structure in sufficient proximity to the spark gap structure such that arcing between the first and second electrodes causes a detectable physical change of the probe structure that is indicative of the EOS event.

2. The device of claim 1, wherein the physical change comprises an increase in a separation distance between the probe structure from the first electrode.

3. The device of claim 2, wherein as-fabricated, the probe structure is in physical contact with the first electrode, and wherein upon arcing between the first and second electrodes, the probe structure is configured to physically separate from the first electrode.

4. The device of claim 3, wherein the device comprises a detection circuit electrically connected to the spark gap structure for detecting the physical change of the probe structure.

5. The device of claim 3, wherein the spark gap structure is configured for visual detection of a physical separation of the probe structure from the first electrode.

6. The device of claim 2, wherein the spark gap structure further comprises a second probe structure in sufficient proximity to the spark gap structure such that arcing between the first and second electrodes causes a physical change of the second probe structure that is indicative of the EOS event.

7. The device of claim 6, wherein the physical change of the second probe structure comprises an increase in a separation distance of the second probe structure from the second electrode.

8. The device of claim 1, wherein the probe structure comprises a metal and is configured such that arcing between the first and second electrodes causes the probe structure to melt.

9. The device of claim 1, wherein the first and second electrodes comprise a metal having a sufficiently low melting temperature such that arcing between the first and second electrodes causes a portion of the probe structure to melt.

10. The device of claim 1, wherein one or both of the first and second electrodes comprise a sharpened tip.

11. The device of claim 1, further comprising a core circuit, wherein the spark gap structure is electrically connected to the core circuit and configured to shunt current from the core circuit resulting from the EOS event, such that the spark gap structure serves as an EOS protection device.

12. The device of claim 1, wherein the first and second electrodes comprise tungsten or aluminum.

13. A device configured to monitor electrical overstress (EOS) events, the device comprising:
a spark gap structure comprising first and second electrodes separated by a gap that is filled with an inter-electrode material through which the first and second electrodes are configured to electrically arc in response to an EOS event, wherein arcing between the first and second electrodes causes a detectable physical change of one or both of the inter-electrode material and the first and second electrodes that is indicative of the EOS event.

14. The device of claim 13, wherein the device further comprises a detection circuit for measuring the physical change by measuring a change in one or more of voltage, current, capacitance and a magnetic property associated with the first and second electrodes that is caused by the EOS event.

15. The device of claim 14, wherein the inter-electrode material comprises an electrically insulating solid dielectric material.

16. The device of claim 14, wherein the inter-electrode material comprises a fluid.

17. The device of claim 13, further comprising a passivation layer formed over the spark gap structure, wherein the passivation layer has an opening formed therethrough to expose the inter-electrode material filling the gap.

18. A device configured to monitor electrical overstress (EOS) events, the device comprising:
a spark gap structure comprising first and second electrodes that are configured to electrically arc in response to an EOS event; and a passivation layer formed over the spark gap structure, wherein the passivation layer has an opening formed therethrough to expose a gap between the first and second electrodes, wherein arcing between the first and second electrodes causes a detectable physical change of the spark gap structure that is indicative of the EOS event.

19. The device of claim 18, wherein the physical change comprises an increase in an inter-electrode distance between the first and second electrodes.

20. The device of claim 18, wherein the device is configured such that the gap is filled with an inter-electrode material prior to arcing.

21. The device of claim 20, wherein the physical change comprises a change of the inter-electrode material that is detectable by characterizing the inter-electrode material before and after arcing.

22. The device of claim 18, wherein the device further comprises a detection circuit for measuring the physical change by measuring a change in one or more of voltage, current, capacitance and a magnetic property associated with the first and second electrodes.

23. The device of claim 18, wherein the device is configured such that the physical change is visually detectable through the opening by naked eye or by using a microscope.

24. The device of claim 18, wherein the spark-gap structure is formed at a metallization level on a semiconductor substrate, and wherein the passivation layer having the opening is formed on the metallization level.

* * * * *